US012484423B2

(12) United States Patent
Hamachi et al.

(10) Patent No.: US 12,484,423 B2
(45) Date of Patent: Nov. 25, 2025

(54) LIGHT EMITTING ELEMENT AND DISPLAY DEVICE WITH RELATIONSHIP BETWEEN REFRACTIVE INDICES OF LENS AND COVERING LAYER

(71) Applicant: Sony Semiconductor Solutions Corporation, Kanagawa (JP)

(72) Inventors: Chugen Hamachi, Tokyo (JP); Yosuke Motoyama, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 439 days.

(21) Appl. No.: 18/012,385

(22) PCT Filed: Jul. 28, 2021

(86) PCT No.: PCT/JP2021/027938
§ 371 (c)(1),
(2) Date: Dec. 22, 2022

(87) PCT Pub. No.: WO2022/030332
PCT Pub. Date: Feb. 10, 2022

(65) Prior Publication Data
US 2023/0276682 A1 Aug. 31, 2023

(30) Foreign Application Priority Data
Aug. 5, 2020 (JP) .................. 2020-133056

(51) Int. Cl.
*H10K 59/80* (2023.01)
*H10K 59/12* (2023.01)

(52) U.S. Cl.
CPC ....... *H10K 59/879* (2023.02); *H10K 59/1201* (2023.02); *H10K 59/8792* (2023.02)

(58) Field of Classification Search
None
See application file for complete search history.

(56) References Cited

U.S. PATENT DOCUMENTS

2019/0251318 A1* 8/2019 Jung .................. G06V 40/1306
2020/0363721 A1* 11/2020 Aritoshi ............. G06F 3/04164
(Continued)

FOREIGN PATENT DOCUMENTS

JP 2009259805 A 11/2009
JP 2012504782 A 2/2012
(Continued)

OTHER PUBLICATIONS

International Search Report (PCT/ISA/210), International Application No. PCT/JP2021/027938, dated Aug. 31, 2021.

*Primary Examiner* — Nduka E Ojeh
(74) *Attorney, Agent, or Firm* — Michael Best & Friedrich LLP

(57) ABSTRACT

Light emitting elements and display devices with increased light extraction efficiency and front luminance are disclosed. In one example, a light emitting element includes a light emitting unit, an intermediate layer covering the light emitting unit, an optical path control unit disposed on a part of the intermediate layer and having positive optical power, and a covering layer covering an outer region of the intermediate layer surrounding a part of the intermediate layer on which the optical path control unit is formed.

13 Claims, 32 Drawing Sheets

(56) References Cited

U.S. PATENT DOCUMENTS

| | | | |
|---|---|---|---|
| 2021/0202917 A1* | 7/2021 | Lee | H10K 59/122 |
| 2022/0029128 A1* | 1/2022 | Gu | H10K 71/00 |

FOREIGN PATENT DOCUMENTS

| | | |
|---|---|---|
| JP | 2013058447 A | 3/2013 |
| JP | 2014002880 A | 1/2014 |
| JP | 2017152409 A | 8/2017 |
| WO | 2018135189 A1 | 7/2018 |
| WO | 2018139171 A1 | 8/2018 |

* cited by examiner

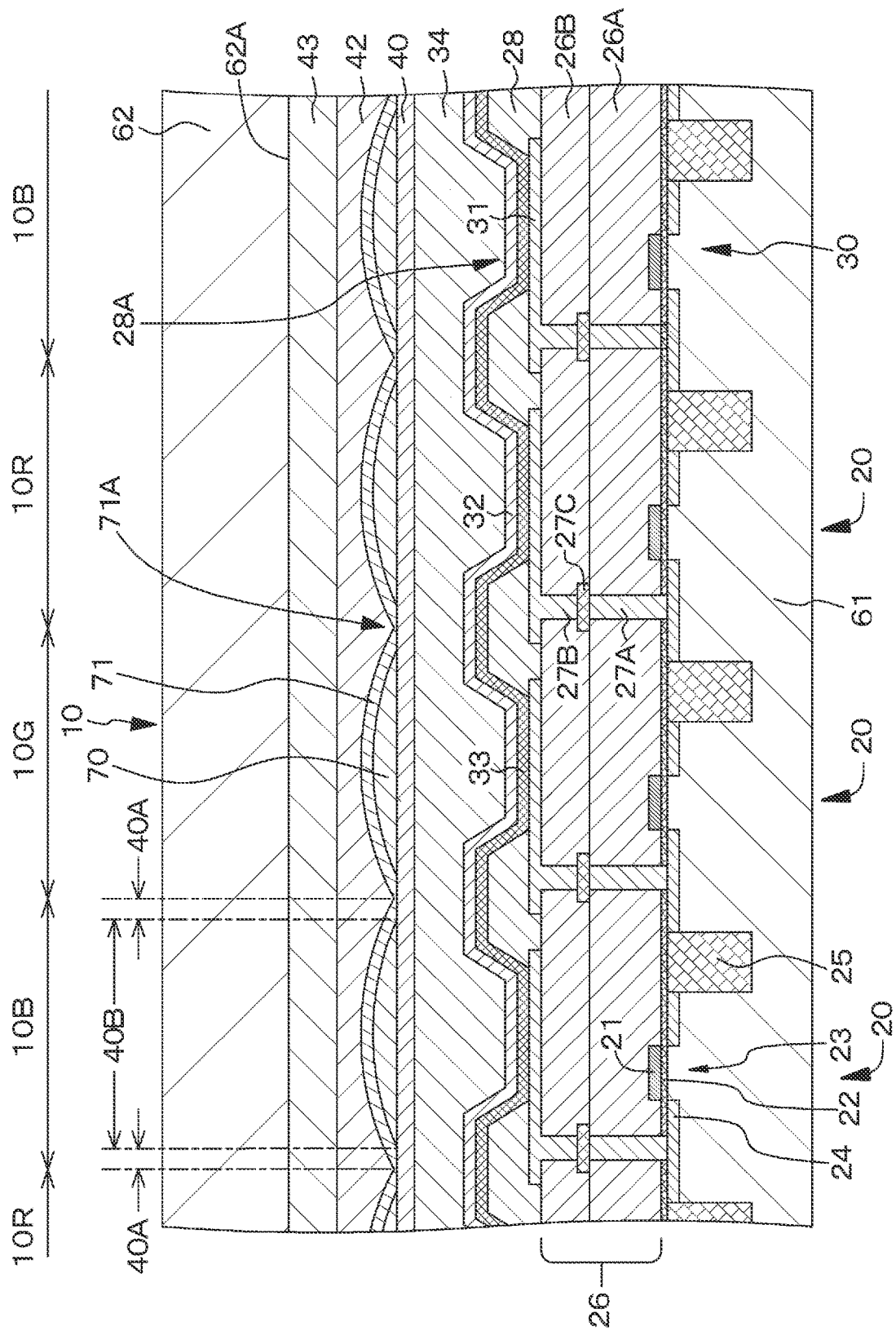

LIGHT EMITTING ELEMENT AND DISPLAY DEVICE WITH RELATIONSHIP BETWEEN REFRACTIVE INDICES OF LENS AND COVERING LAYER

FIELD

The present disclosure relates to a light emitting element and a display device including a plurality of the light emitting elements.

BACKGROUND

In recent years, a display device (organic electroluminescence (EL) display device) using an organic EL element as a light emitting element has been developed. This organic EL display device includes, for example, a plurality of light emitting elements in each of which an organic layer including at least a light emitting layer and a second electrode (an upper electrode, for example, a cathode electrode) are formed on a first electrode (a lower electrode, for example, an anode electrode) formed separately for each pixel. For example, each of a red light emitting element, a green light emitting element, and a blue light emitting element is disposed as a sub-pixel, one pixel is constituted by these sub-pixels, and light from a light emitting layer is emitted to the outside via the second electrode (upper electrode).

In such a display device, a lens member is disposed on a light exit side of each light emitting element in order to improve light extraction efficiency and increase front luminance. For example, JP 2013-058447 A discloses an organic EL light emitting device in which a color conversion member, a low refractive index layer, and a microlens are disposed in this order on a light extraction side of an organic EL element, and a refractive index of the low refractive index layer is smaller than refractive indexes of the color conversion member and the microlens.

In addition, in an organic EL device including an optical member such as a color filter or a lens on an organic EL element, a technique for preventing peeling or pattern collapse of the optical member due to a step of exposing a terminal portion disposed in a peripheral region of a display region is known from JP 2014 002880 A. In the organic EL element disclosed in this patent publication, a lens is formed on a base layer, and a protective layer is formed on the lens and the base layer.

CITATION LIST

Patent Literature

Patent Literature 1: JP 2013-058447 A
Patent Literature 2: JP 2014-002880 A

SUMMARY

Technical Problem

In order to increase optical power of a lens member, a difference in refractive index between a lens surface of the lens member and a member in contact with the lens surface is important. However, JP 2013 058447 A does not mention any member in contact with a lens surface. In an organic EL element disclosed in JP 2014 002280 A, since a value of refractive index of a material constituting a protective layer is higher than a value of refractive index of a material constituting a base layer, there is a problem that light incident from the base layer side is totally reflected at an interface between the base layer and the protective layer and returned to the base layer side, and light extraction efficiency cannot be increased.

Therefore, an object of the present disclosure is to provide a light emitting element having a configuration and a structure capable of increasing light extraction efficiency and front luminance, and a display device including the light emitting element.

Solution to Problem

A light emitting element according to first aspect of the present disclosure in order to solve the above problem includes:
a light emitting unit;
an intermediate layer covering the light emitting unit;
an optical path control unit disposed on a part of the intermediate layer and having positive optical power; and
a covering layer covering an outer region of the intermediate layer surrounding a part of the intermediate layer on which the optical path control unit is formed and the optical path control unit, wherein
when a refractive index of a material constituting a part of the intermediate layer in contact with the optical path control unit is represented by $n_0$, a refractive index of a material constituting the optical path control unit is represented by $n_1$, and a refractive index of a material constituting the covering layer is represented by $n_2$, $$n_0 \geq n_1 > n_2$$

is satisfied.

A light emitting element according to second aspect of the present disclosure in order to solve the above problem includes:
a light emitting unit;
a sealing resin layer covering the light emitting unit;
an optical path control unit disposed on a part of the sealing resin layer and having positive optical power;
a flattening film formed on an outer region of the sealing resin layer surrounding a part of the sealing resin layer on which the optical path control unit is formed and the optical path control unit; and
a covering layer formed so as to extend from a space between the outer region of the sealing resin layer and the flattening film to a space between the optical path control unit and the flattening film, wherein
when a refractive index of a material constituting the flattening film is represented by $n_0$, a refractive index of a material constituting the optical path control unit is represented by $n_1$, and a refractive index of a material constituting the covering layer is represented by $n_2$, $$n_0 \geq n_1 > n_2$$

is satisfied.

A display device according to first aspect of the present disclosure in order to solve the above problem includes:
a first substrate and a second substrate; and
a plurality of light emitting elements disposed on the first substrate, wherein
each of the light emitting elements includes:
a light emitting unit;
an intermediate layer covering the light emitting unit;
an optical path control unit disposed on a part of the intermediate layer and having positive optical power; and a covering layer covering an outer region of the intermediate layer surrounding a part of the intermediate layer on which the optical path control unit is formed and the optical path control unit, and when a refractive index of a material constituting a part of the intermediate layer in contact with the optical path control unit is represented by $n_0$, a refractive index of a material constituting the optical path control unit is represented by $n_1$, and a refractive index of a material constituting the covering layer is represented by $n_2$, $$n_0 \geq n_1 > n_2$$

is satisfied.

A display device according to second aspect of the present disclosure in order to solve the above problem includes:
a first substrate and a second substrate; and
a plurality of light emitting elements disposed on the first substrate, wherein
each of the light emitting elements includes:
a light emitting unit;
a sealing resin layer covering the light emitting unit;
an optical path control unit disposed on a part of the sealing resin layer and having positive optical power;
a flattening film formed on an outer region of the sealing resin layer surrounding a part of the sealing resin layer on which the optical path control unit is formed and the optical path control unit; and
a covering layer formed so as to extend from a space between the outer region of the sealing resin layer and the flattening film to a space between the optical path control unit and the flattening film, and
when a refractive index of a material constituting the flattening film is represented by $n_0$, a refractive index of a material constituting the optical path control unit is represented by $n_1$, and a refractive index of a material constituting the covering layer is represented by $n_2$, $$n_0 \geq n_1 > n_2$$

is satisfied.

BRIEF DESCRIPTION OF DRAWINGS

FIG. 28 is a schematic partial cross-sectional view of Modification-6 of the light emitting element and the display device of Example 1.

DESCRIPTION OF EMBODIMENTS

Figure 1:
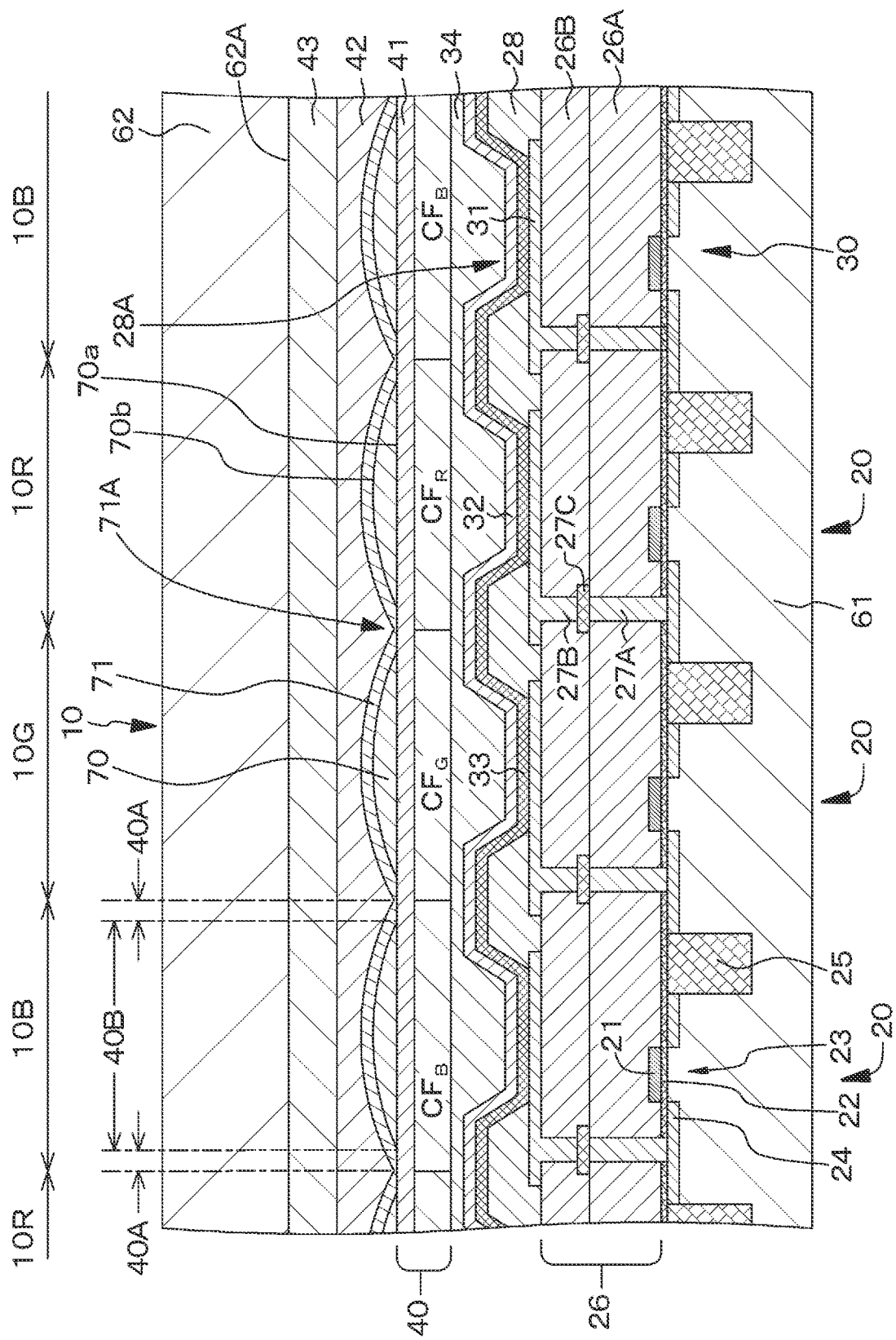
FIG. 1 is a schematic partial cross-sectional view of a light emitting element and a display device of Example 1.

Hereinafter, the present disclosure will be described on the basis of Examples with reference to the drawings, but the present disclosure is not limited to Examples, and various numerical values and materials in Examples are examples. Note that description will be given in the following order.
1. General description of light emitting elements according to first and second aspects of present disclosure and display devices according to first and second aspects of present disclosure
2. Example 1 (general description of light emitting element according to first aspect of present disclosure and display device according to first aspect of present disclosure)
3. Example 2 (general description of light emitting element according to first aspect of present disclosure and display device according to first aspect of present disclosure)
4. Example 3 (modification of Example 1)
5. Example 4 (modification of Examples 1 to 3)
6. Example 5 (modification of Examples 1 to 4)
7. Example 6 (modification of Examples 1 to 5)
8. Others General Description of Light Emitting Elements According to First and Second Aspects of Present Disclosure and Display Devices According to First and Second Aspects of Present Disclosure Hereinafter, a light emitting element according to a first aspect of the present disclosure or a light emitting element constituting a display device according to the first aspect of the present disclosure may be collectively referred to as "light emitting element or the like according to the first aspect of the present disclosure". Hereinafter, a light emitting element according to a second aspect of the present disclosure or a light emitting element constituting a display device according to the second aspect of the present disclosure may be collectively referred to as "light emitting element or the like according to the second aspect of the present disclosure". Hereinafter, the light emitting element or the like according to the first aspect of the present disclosure and the light emitting element or the like according to the second aspect of the present disclosure may be collectively referred to as "light emitting element or the like of the present disclosure". In addition, hereinafter, a display device according to the first aspect of the present disclosure and a display device according to the second aspect of the present disclosure may be collectively referred to as "display device or the like of the present disclosure".

In the light emitting element or the like of the present disclosure, as described above, $n_0 \geq n_1 > n_2$ is satisfied, and specifically, $n_0 - n_1 \geq 0$ preferably, $n_0 - n_1 > 0.15$ is desirably satisfied. Specifically, $n_1 - n_2 > 0.10$ preferably, $n_1 - n_2 > 0.15$ is desirably satisfied. Note that, in the description of the light emitting element or the like of the present disclosure, in principle, a direction going away from a light emitting unit is expressed as "upward", and a direction approaching the light emitting unit is expressed as "downward".

In the light emitting element or the like according to the first aspect of the present disclosure including the above-described preferable form, a form can be adopted in which a layer thickness $T_2$ of an end part of a covering layer located on an outer region of an intermediate layer is more than 0 μm and 1.0 μm or less. In the light emitting element or the like according to the second aspect of the present disclosure including the above-described preferable form, a form can be adopted in which a layer thickness $T_2$ of an end part of a covering layer located on an outer region of a sealing resin layer is more than 0 μm and 0.5 μm or less. Here, the "layer thickness $T_2$" of the end part of the covering layer refers to a distance from a bottom portion to a top portion of the covering layer along a virtual straight line parallel to an optical axis of an optical path control unit. When the layer thickness varies depending on the position of the end part of the covering layer, a minimum layer thickness is defined as the layer thickness of the end part of the covering layer. In the display device or the like of the present disclosure, there is a gap between an optical path control unit and an optical path control unit constituting adjacent light emitting elements. It is only required to set the thinnest portion of a covering layer located between an optical path control unit and an optical path control unit constituting adjacent light emitting elements as the end part of the covering layer. The covering layer can have a single-layer structure or a multilayer structure.

Furthermore, in the light emitting element or the like according to the first aspect of the present disclosure including the above-described preferable form, a form can be adopted in which the optical path control unit is constituted by a lens member having a convex light exit surface. A light incident surface of the lens member is, for example, flat. In this case, a wavelength selection unit can be formed inside an intermediate layer, and furthermore,
the covering layer can be covered with a resin layer, and
when an average refractive index of a material constituting the resin layer is represented by $n_3$, $n_2 > n_3$ can be satisfied. Alternatively, in such a form,
the covering layer can be covered with a resin layer,
when an average refractive index of a material constituting the resin layer is represented by $n_3$, $n_2 > n_3$ can be satisfied, and
a wavelength selection unit can be formed inside the resin layer or on the resin layer.
Here, $n_2 - n_3 > 0.1$ is desirably satisfied. Examples of a material constituting the resin layer include a thermosetting adhesive such as an acrylic adhesive, an epoxy-based adhesive, a urethane-based adhesive, a silicone-based adhesive, or a cyanoacrylate-based adhesive, and an ultraviolet-curable adhesive. Examples of a method for forming the resin layer include a vacuum injection method and a liquid crystal dropping method.

In the light emitting element or the like according to the first aspect of the present disclosure, when the covering layer is constituted by a plurality of layers, it is preferable to decrease a value of refractive index of a material constituting the covering layer from a light incident side toward a light exit side.

In the light emitting element or the like according to the second aspect of the present disclosure including the above-described preferable form, a form can be adopted in which the optical path control unit is constituted by a lens member having a convex light incident surface. A light exit surface of the lens member is, for example, flat. In this case, a wavelength selection unit can be formed inside a sealing resin layer. Alternatively, the wavelength selection unit can be formed between a flattening film and the optical path control unit, or the wavelength selection unit can be formed between the flattening film and a second substrate. Alternatively, a protective layer can be formed between a sealing resin layer and a light emitting unit, and furthermore, the wavelength selection unit can be formed inside the protective layer or on the protective layer. Furthermore, in these forms and configurations, when an average refractive index of a material constituting the sealing resin layer is represented by $n_3$, $$n_2 > n_3$$

can be satisfied.
Here, $$n_2 - n_3 > 0.1$$

is desirably satisfied. Examples of a material constituting the sealing resin layer include a thermosetting adhesive such as an acrylic adhesive, an epoxy-based adhesive, a urethane-based adhesive, a silicone-based adhesive, or a cyanoacrylate-based adhesive, and an ultraviolet-curable adhesive. Examples of a method for forming the sealing resin layer include a vacuum injection method and a liquid crystal dropping method.

In the light emitting element or the like according to the second aspect of the present disclosure, when the covering layer is constituted by a plurality of layers, it is preferable to increase a value of refractive index of a material constituting the covering layer from a light incident side toward a light exit side.

In the light emitting element or the like of the present disclosure including the above-described various preferable forms and configurations, when the optical path control unit is constituted by a convex lens member (on-chip micro-convex lens), examples of materials constituting the optical path control unit and the covering layer include the following materials, but are not limited thereto.
[Optical Path Control Unit]
  Acrylic transparent resin (refractive index: 1.54)
  Epoxy-based transparent resin (refractive index: 1.55)
  $TiO_2$-dispersed acrylic transparent resin (refractive index: 1.72)
  SiN (refractive index: 1.74)
[Covering Layer]
  Hollow silica-containing fluorine-based low refractive index transparent resin (refractive index: 1.25)
  Fluorine-based low refractive index transparent resin (refractive index: 1.38)
  Acrylic transparent resin (refractive index: 1.54)
  Epoxy-based transparent resin (refractive index: 1.55)
  $Al_2O_3$-dispersed acrylic transparent resin (refractive index: 1.64)
More specifically, examples of a combination of [material constituting optical path control unit and material constituting covering layer] include, but are not limited to,
[acrylic transparent resin and hollow silica-containing fluorine-based low refractive index transparent resin],
[acrylic transparent resin and fluorine-based low refractive index transparent resin],
[epoxy-based transparent resin and hollow silica-containing fluorine-based low refractive index transparent resin],
[epoxy-based transparent resin and fluorine-based low refractive index transparent resin],
[$TiO_2$-dispersed acrylic transparent resin and fluorine-based low refractive index transparent resin],
[$TiO_2$-dispersed acrylic transparent resin and acrylic transparent resin],
[SiN inorganic film and fluorine-based low refractive index transparent resin], and
[SiN inorganic film and acrylic transparent resin].

Examples of materials constituting the intermediate layer and the flattening film include an acrylic resin, an epoxy-based resin, and various inorganic materials (for example, $SiO_2$, SiN, SiON, SiC, amorphous silicon ($\alpha$-Si), $Al_2O_3$, and $TiO_2$). The intermediate layer and the flattening film can each have a single-layer structure or a multilayer structure. In the latter case, in the light emitting element or the like according to the first aspect of the present disclosure, it is preferable to sequentially decrease a value of refractive index of a material constituting the intermediate layer from a light incident direction toward a light exit direction. In the light emitting element or the like according to the second aspect of the present disclosure, it is preferable to sequentially increase a value of refractive index of a material constituting the flattening film from the light incident direction toward the light exit direction. The intermediate layer and the flattening film can be formed on the basis of a known method such as various CVD methods, various coating methods, various PVD methods including a sputtering method and a vacuum vapor deposition method, and various printing methods such as a screen printing method. Each of the intermediate layer and the flattening film may be shared by a plurality of light emitting elements, or may be individually formed in each of the light emitting elements.

In the light emitting element or the like of the present disclosure including the above-described various preferable forms and configurations, a form can be adopted in which the light emitting unit includes an organic electroluminescence layer. That is, a form can be adopted in which the light emitting element or the like of the present disclosure including the above-described various preferable forms and configurations is constituted by an organic electroluminescence element (organic EL element), and a form can be adopted in which the display device or the like of the present disclosure is constituted by an organic electroluminescence display device (organic EL display device).

Here, in other words, the display device or the like of the present disclosure includes:
  a first substrate and a second substrate; and
  a plurality of light emitting elements located between the first substrate and the second substrate and arranged two-dimensionally, in which
  each of the light emitting elements is constituted by the light emitting element or the like of the present disclosure including the above-described preferable forms, and
  light from a light emitting unit is emitted to the outside via the second substrate. That is, the display device or the like of the present disclosure can be a top emission type display device that emits light from the second substrate.

In the display device or the like of the present disclosure, examples of an arrangement of pixels (or sub-pixels) include a delta arrangement, a stripe arrangement, a diagonal arrangement, a rectangle arrangement, a pentile arrangement, and a square arrangement. An arrangement of the wavelength selection units also only needs to be a delta arrangement, a stripe arrangement, a diagonal arrangement, a rectangle arrangement, a pentile arrangement, or a square arrangement in accordance with the arrangement of the pixels (or sub-pixels).

In the light emitting element or the like of the present disclosure including the above-described various preferable forms and configurations, a form can be adopted in which the optical path control unit is formed in a hemispherical shape or a shape formed of a part of a sphere, or a form can be adopted in which the optical path control unit is formed in a shape suitable to function as a lens in a broad sense. Specifically, as described above, the optical path control unit can be constituted by a convex lens member, specifically, a plano-convex lens. Alternatively, the lens member can be a spherical lens or an aspherical lens. The optical path control unit can be a refractive lens or a diffractive lens.

Alternatively, a rectangular parallelepiped having a square or rectangular bottom surface is assumed, and a three-dimensional-shaped lens member in which four side surfaces and one top surface of the rectangular parallelepiped each have a convex shape, a part of a ridge where the side surfaces intersect with each other is rounded, a part of a ridge where the top surface intersects with the side surfaces is also rounded, and the lens member is rounded as a whole can also be adopted. Alternatively, a rectangular parallelepiped (including a cube approximating a rectangular parallelepiped) having a square or rectangular bottom surface is assumed, and a lens member in which four side surfaces and one top surface of the rectangular parallelepiped are planar can be adopted. In this case, in some cases, a three-dimensional-shaped lens member in which a part of a ridge where the side surfaces intersect with each other is rounded can be adopted, and in some cases, a three-dimensional-shaped lens member in which a part of a ridge where the top surface intersects with the side surfaces is also rounded can also be adopted. Alternatively, a form can be adopted in which the lens member is constituted by a lens member having a rectangular or isosceles trapezoidal cross-sectional shape when being cut along a virtual plane (perpendicular virtual plane) including a thickness direction. In other words, a form can be adopted in which the lens member is constituted by a lens member whose cross-sectional shape is constant or changes in a thickness direction thereof.

Alternatively, in the light emitting element or the like according to the first aspect of the present disclosure, a form can be adopted in which the optical path control unit is constituted by a light exit direction control member having a rectangular or isosceles trapezoidal cross-sectional shape when being cut along a virtual plane (perpendicular virtual plane) including a thickness direction thereof. In other words, a form can be adopted in which the optical path control unit is constituted by a light exit direction control member whose cross-sectional shape is constant or changes in a thickness direction thereof. The light exit direction control member will be described in detail in Example 3.

In the light emitting element or the like of the present disclosure including the above-described various preferable forms and configurations, when the thickness of the optical path control unit along an optical axis (a distance between two facing lens surfaces of the optical path control unit along the optical axis) is referred to as "height of optical path control unit" for convenience, a form can be adopted in which a height $H_0$ of the optical path control unit and a minimum distance (gap) $2L_0$ between optical path control units constituting adjacent light emitting elements satisfy $$0 < 2L_0/H_0 \leq 0.5.$$

When the size of a light emitting element (the length of one side of a pixel or a sub-pixel) is 1.00, the minimum distance (gap) $2L_0$ is preferably 0.1 or less, and a distance between optical axes of adjacent optical path control units is preferably 1 μm or more and 10 μm or less.

In addition, in the light emitting element or the like according to the first aspect of the present disclosure, examples of a relationship between the layer thickness $T_2$ of the end part of the covering layer located on the outer region of the sealing resin layer and the minimum distance (gap) $2L_0$ include, but are not limited to, $$0 \leq T_2/L_0 \leq 2.5.$$

The size of the planar shape of the optical path control unit may be changed depending on a light emitting element. For example, when one pixel is constituted by three sub-pixels, the size of the planar shape of the optical path control unit may be the same value in three sub-pixels constituting one pixel, may be the same value in two sub-pixels except for one sub-pixel, or may be different values among three sub-pixels. In addition, the refractive index of a material constituting the optical path control unit may be changed depending on a light emitting element. For example, when one pixel is constituted by three sub-pixels, the refractive index of a material constituting the optical path control unit may be the same value in three sub-pixels constituting one pixel, may be the same value in two sub-pixels except for one sub-pixel, or may be different values among three sub-pixels.

When one pixel is constituted by a plurality of sub-pixels, one lens member may be disposed corresponding to one sub-pixel, or a plurality of lens members may be disposed corresponding to one sub-pixel.

The lens member can be obtained by melt-flowing or etching back a transparent resin material constituting the lens member, can be obtained by a combination of a photolithography technique using a gray tone mask or a halftone mask on the basis of an organic material or an inorganic material and an etching method, or can be obtained by a method for forming a transparent resin material into a lens shape on the basis of a nanoimprint method. Examples of the material constituting the lens member (microlens) include a high refractive resin material and a high refractive inorganic film (for a convex lens) as described above.

Examples of a method for forming the covering layer include a spin coating method, a spray coating method, a curtain coating method, various roll coating methods, and a dip coating method. When the covering layer is formed on the basis of a coating method, it is preferable to select a material having low viscosity and good wettability. Alternatively, a conformal covering layer can be obtained by adopting various CVD methods [for example, a CVD method (conformal CVD method) in which film formation is performed by a high density plasma chemical vapor deposition method (HDP-CVD method) or a surface reaction] or an atomic layer deposition method (ALD method) as a method for forming the covering layer. Alternatively, the covering layer can be obtained by melt-flowing or etching back a transparent resin material constituting the covering layer, or can be obtained by a combination of a photolithography technique using a gray tone mask or a halftone mask on the basis of an organic material or an inorganic material and an etching method.

As described above, a form can be adopted in which light emitted from the light emitting unit passes through the wavelength selection unit and the optical path control unit in this order, or a form can be adopted in which light that has been emitted from the light emitting unit passes through the optical path control unit and the wavelength selection unit in this order. When an orthographic projection image is an orthographic projection image on the first substrate, a form can be adopted in which an orthographic projection image of the optical path control unit coincides with an orthographic projection image of the wavelength selection unit, a form can be adopted in which the orthographic projection image of the optical path control unit is included in the orthographic projection image of the wavelength selection unit, or a form can be adopted in which the orthographic projection image of the wavelength selection unit is included in the orthographic projection image of the optical path control unit. By adopting a form in which the orthographic projection image of the optical path control unit is included in the orthographic projection image of the wavelength selection unit, it is possible to reliably suppress occurrence of color mixing between adjacent light emitting elements.

Alternatively, the planar shape of the wavelength selection unit may be the same as, similar to, approximate to, or different from the planar shape of the optical path control unit. In addition, the planar shape of the wavelength selection unit may be the same as, similar to, approximate to, or different from the planar shape of a light emitting region, but the wavelength selection unit is preferably larger than the light emitting region. The size of the wavelength selection unit (for example, a color filter layer) may be appropriately changed depending on light emitted from the light emitting element. In addition, the size of the wavelength selection unit (for example, a color filter layer) may be appropriately changed depending on a distance (offset amount) $d_0$ (described later) between a normal line passing through the center of the light emitting region and a normal line passing through the center of the wavelength selection unit.

The wavelength selection unit can be constituted by, for example, a color filter layer. The color filter layer is made of a resin to which a colorant including a desired pigment or dye is added, and by selecting a pigment or dye, the color filter layer is adjusted such that light transmittance in a target wavelength region such as red, green, or blue is high and light transmittance in another wavelength region is low. Alternatively, the wavelength selection unit can also be constituted by a wavelength selection element to which a photonic crystal or a plasmon is applied (a color filter layer having a conductor lattice structure in which a lattice-shaped hole structure is formed in a conductor thin film, for example, see JP 2008-A), a thin film made of an inorganic material such as amorphous silicon, or a quantum dot. Hereinafter, the color filter layer may be described as a representative of the wavelength selection unit, but the wavelength selection unit is not limited to the color filter layer.

Furthermore, as described above, in the display device or the like of the present disclosure including the above-described preferable forms and configurations, a form can be adopted in which a light absorption layer (black matrix layer) is formed between a wavelength selection unit and a wavelength selection unit or above a space between the wavelength selection unit and the wavelength selection unit, and it is thereby possible to reliably suppress occurrence of color mixing between adjacent light emitting elements. The light absorption layer (black matrix layer) is constituted by, for example, a black resin film (specifically, for example, a black polyimide-based resin) mixed with a black colorant and having an optical density of 1 or more, or constituted by a thin film filter using interference of a thin film. The thin film filter is formed by, for example, laminating two or more thin films made of metal, metal nitride, or metal oxide and attenuates light using interference of the thin films. Specific examples of the thin film filter include a thin film filter in which Cr and chromium (III) oxide ($Cr_2O_3$) are alternately laminated. The size of the light absorption layer (black matrix layer) may be appropriately changed depending on light emitted from the light emitting element.

Hereinafter, focusing on the light emitting unit, a form in which the light emitting unit constituting the light emitting element includes an organic electroluminescence layer, that is, a form in which the display device or the like of the present disclosure is constituted by an organic electroluminescence display device (organic EL display device) will be described.

An organic EL display device includes:
a first substrate and a second substrate; and
a plurality of light emitting elements located between the first substrate and the second substrate and arranged two-dimensionally, in which
each of the light emitting elements disposed on a base formed on the first substrate includes a light emitting unit,
the light emitting unit includes at least:
a first electrode;
a second electrode; and
an organic layer (including a light emitting layer constituted by an organic electroluminescence layer) sandwiched between the first electrode and the second electrode, and
light from the organic layer is emitted to the outside via the second substrate.

The first electrode is disposed for each of the light emitting elements. The organic layer is disposed for each of the light emitting elements, or disposed so as to be shared by the light emitting elements. The second electrode may be an electrode shared by the plurality of light emitting elements. That is, the second electrode may be a so-called solid electrode. The first substrate is disposed below or under the base, and the second substrate is disposed above the second electrode. The light emitting element is formed on the first substrate side, and the light emitting unit is disposed on the base.

The first electrode can be in contact with a part of the organic layer, or the organic layer can be in contact with a part of the first electrode. Specifically, the size of the first electrode can be smaller than that of the organic layer. Alternatively, the size of the first electrode can be the same as that of the organic layer, but an insulating layer can be formed in a part of a space between the first electrode and the organic layer. Alternatively, the size of the first electrode can be larger than that of the organic layer. The size of the light emitting region is the size of a region where the first electrode and the organic layer are in contact with each other. The size of the light emitting region may be changed depending on the color of light emitted from the light emitting element.

A form can be adopted in which the organic layer emits white light, and in this case, a form can be adopted in which the organic layer is constituted by at least two light emitting layers that emit different colors. Specifically, a form can be adopted in which the organic layer has a laminated structure in which three layers of a red light emitting layer that emits red light (wavelength: 620 nm to 750 nm), a green light emitting layer that emits green light (wavelength: 495 nm to 570 nm), and a blue light emitting layer that emits blue light (wavelength: 450 nm to 495 nm) are laminated, and emits white light as a whole. Alternatively, the organic layer can have a structure in which two layers of a blue light emitting layer that emits blue light and a yellow light emitting layer that emits yellow light are laminated, and emits white light as a whole. Alternatively, the organic layer can have a structure in which two layers of a blue light emitting layer that emits blue light and an orange light emitting layer that emits orange light are laminated, and emits white light as a whole. The organic layer may be shared by the plurality of light emitting elements, or may be individually formed in each of the light emitting elements. Such an organic layer (light emitting unit) that emits white light and a red color filter layer (or an intermediate layer that functions as a red color filter layer) are combined to constitute a red light emitting element, an organic layer (light emitting unit) that emits white light and a green color filter layer (or an intermediate layer that functions as a green color filter layer) are combined to constitute a green light emitting element, and an organic layer (light emitting unit) that emits white light and a blue color filter layer (or an intermediate layer that functions as a blue color filter layer) are combined to constitute a blue light emitting element. A combination of sub-pixels such as a red light emitting element, a green light emitting element, and a blue light emitting element constitutes a light emitting element unit (one pixel). In some cases, a red light emitting element, a green light emitting element, a blue light emitting element, and a light emitting element that emits white (or fourth color) light (or a light emitting element that emits complementary color light) may constitute a light emitting element unit (one pixel). In a form constituted by at least two light emitting layers that emit different colors, actually, the light emitting layers that emit different colors are mixed with each other and are not clearly separated into the layers in some cases.

As described above, the intermediate layer having a function as the color filter layer only needs to be made of a known color resist material. In a light emitting element that emits white light, a transparent filter layer only needs to be disposed. When the intermediate layer also functions as a color filter layer as described above, the organic layer and the intermediate layer (color filter layer) are close to each other. Therefore, color mixing can be effectively prevented even if an angle of light emitted from the light emitting element is widened, and viewing angle characteristics are improved.

Alternatively, a form can be adopted in which the organic layer is constituted by one light emitting layer. In this case, the light emitting element can be constituted by, for example, a red light emitting element having an organic layer including a red light emitting layer, a green light emitting element having an organic layer including a green light emitting layer, or a blue light emitting element having an organic layer including a blue light emitting layer. In a case of a color display device, one pixel is constituted by these three types of light emitting elements (sub-pixels). Note that, in principle, formation of the color filter layer is unnecessary, but the color filter layer may be formed in order to improve color purity. Alternatively, the light emitting element can be constituted by a laminated structure of a red light emitting element having an organic layer including a red light emitting layer, a green light emitting element having an organic layer including a green light emitting layer, and a blue light emitting element having an organic layer including a blue light emitting layer (laminated structure of light emitting elements).

When the light emitting element unit (one pixel) is constituted by a plurality of light emitting elements (sub-pixels), the size of the light emitting region of the light emitting element may be changed depending on the light emitting element. Specifically, a form can be adopted in which the size of the light emitting region of the blue light emitting element is larger than the size of the light emitting region of the red light emitting element and the size of the light emitting region of the green light emitting element. As a result, the amount of light emission of the blue light emitting element can be made larger than the amount of light emission of the red light emitting element and the amount of light emission of the green light emitting element. Alternatively, the amount of light emission of the blue light emitting element, the amount of light emission of the red light emitting element, and the amount of light emission of the green light emitting element can be made appropriate, and image quality can be improved. Alternatively, when a light emitting element unit (one pixel) constituted by a white light emitting element that emits white light in addition to the red light emitting element, the green light emitting element, and the blue light emitting element is assumed, the size of the light emitting region of the green light emitting element or the white light emitting element is preferably larger than the size of the light emitting region of the red light emitting element or the blue light emitting element from a viewpoint of luminance. In addition, the size of the light emitting region of the blue light emitting element is preferably larger than the size of the light emitting region of the red light emitting element, the green light emitting element, or the white light emitting element from a viewpoint of a lifetime of the light emitting element. Note that the present disclosure is not limited to these.

The organic layer includes a light emitting layer containing an organic light emitting material. Specifically, the organic layer can be constituted by, for example, a laminated structure of a hole transport layer, a light emitting layer, and an electron transport layer, a laminated structure of a hole transport layer and a light emitting layer serving also as an electron transport layer, or a laminated structure of a hole injection layer, a hole transport layer, a light emitting layer, an electron transport layer, and an electron injection layer. Examples a method for forming the organic layer include: a physical vapor deposition method (PVD method) such as a vacuum vapor deposition method; a printing method such as a screen printing method or an inkjet printing method; a laser transfer method in which a laminated structure of a laser absorption layer and an organic layer formed on a transfer substrate is irradiated with a laser to separate the organic layer on the laser absorption layer and transfer the organic layer, and various coating methods. When the organic layer is formed on the basis of a vacuum vapor deposition method, for example, a so-called metal mask is used, and a material that has passed through an opening formed in the metal mask is deposited to obtain the organic layer.

Specifically, the first electrode, the organic layer (including the light emitting layer), and the second electrode constituting the light emitting unit are sequentially formed on a base. That is, the light emitting element is formed on the first substrate side. The base is formed on or above the first substrate.

Examples of a material constituting the base include an insulating material such as $SiO_2$, SiN, or SiON. The base can be formed on the basis of a forming method suitable for a material constituting the base, specifically, for example, a known method such as various CVD methods, various coating methods, various PVD methods including a sputtering method and a vacuum vapor deposition method, various printing methods such as a screen printing method, a plating method, an electrodeposition method, an immersion method, or a sol-gel method.

A drive circuit (light emitting element driving unit) is disposed under or below the base, but is not limited thereto. The drive circuit is constituted by, for example, a transistor (specifically, for example, a MOSFET) formed on a silicon semiconductor substrate constituting the first substrate, or a thin film transistor (TFT) disposed on various substrates constituting the first substrate. A form can be adopted in which the transistor and the TFT constituting the drive circuit are connected to the first electrode via a contact hole (contact plug) formed in the base or the like. The drive circuit can have a known circuit configuration. For example, the second electrode is connected to the drive circuit via a contact hole (contact plug) formed in the base or the like at an outer peripheral portion (specifically, an outer peripheral portion of a pixel array unit) of the display device.

The first substrate or the second substrate can be constituted by a silicon semiconductor substrate, a high strain point glass substrate, a soda glass ($Na_2O \cdot CaO \cdot SiO_2$) substrate, a borosilicate glass ($Na_2O \cdot B_2O \cdot SiO_2$) substrate, a forsterite ($2MgO \cdot SiO_2$) substrate, a lead glass ($Na_2O \cdot PbO \cdot SiO_2$) substrate, various glass substrates having an insulating material layer formed on a surface thereof, a quartz substrate, a quartz substrate having an insulating material layer formed on a surface thereof, an organic polymer (having a form of a flexible polymer material made of a polymer material, such as a plastic film, a plastic sheet, or a plastic substrate) such as polymethyl methacrylate (PMMA), polyvinyl alcohol (PVA), polyvinylphenol (PVP), polyethersulfone (PES), polyimide, polycarbonate, polyethylene terephthalate (PET), or polyethylene naphthalate (PEN). The materials constituting the first substrate and the second substrate may be the same or different. Note that since the display device is a top emission type display device, the second substrate is required to be transparent to light from the light emitting element.

When the first electrode functions as an anode electrode, examples of the material constituting the first electrode include a metal having a high work function, such as platinum (Pt), gold (Au), silver (Ag), chromium (Cr), tungsten (W), nickel (Ni), copper (Cu), iron (Fe), cobalt (Co), or tantalum (Ta), and an alloy having a high work function (for example, an Ag—Pd—Cu alloy containing silver as a main component and containing 0.3% by mass to 1% by mass of palladium (Pd) and 0.3% by mass to 1% by mass of copper (Cu), an Al—Nd alloy, an Al—Cu alloy, or an Al—Cu—Ni alloy). Furthermore, when a conductive material having a small work function value and a high light reflectance is used, such as aluminum (Al) or an alloy containing aluminum, the first electrode can be used as an anode electrode by improving hole injection characteristics by forming an appropriate hole injection layer, for example. The thickness of the first electrode may be 0.1 μm to 1 μm, for example. Alternatively, when a light reflecting layer constituting a resonator structure to be described later is formed, the first electrode is required to be transparent to light from the light emitting element. Therefore, examples of a material constituting the first electrode include various transparent conductive materials such as a transparent conductive material containing, as a base layer, indium oxide, indium-tin oxide (ITO, including Sn-doped $In_2O_3$, crystalline ITO, and amorphous ITO), indium-zinc oxide (IZO), indium-gallium oxide (IGO), indium-doped gallium-zinc oxide (IGZO, In—GaZnO$_4$), IFO (F-doped $In_2O_3$), ITiO (Ti-doped $In_2O_3$), InSn, InSnZnO, tin oxide ($SnO_2$), ATO (Sb-doped $SnO_2$), FTO (F-doped $SnO_2$), zinc oxide (ZnO), aluminum oxide-doped zinc oxide (AZO), gallium-doped zinc oxide (GZO), B-doped ZnO, AlMgZnO (aluminum oxide and magnesium oxide-doped zinc oxide), antimony oxide, titanium oxide, NiO, spinel type oxide, oxide having a $YbFe_2O_4$ structure, gallium oxide, titanium oxide, niobium oxide, nickel oxide, or the like. Alternatively, a structure can be adopted in which a transparent conductive material having excellent hole injection characteristics, such as an oxide of indium and tin (ITO) or an oxide of indium and zinc (IZO), is laminated on a dielectric multilayer film or a reflective film having high light reflectivity, such as aluminum (Al) or an alloy thereof (for example, an Al—Cu—Ni alloy). Meanwhile, when the first electrode functions as a cathode electrode, the first electrode is desirably made of a conductive material having a small work function value and a high light reflectance. However, the first electrode can also be used as a cathode electrode by improving electron injection characteristics by forming an appropriate electron injection layer in a conductive material having a high light reflectance used as an anode electrode, for example.

When the second electrode functions as a cathode electrode, a material constituting the second electrode (semi-light transmissive material or light transmissive material) is desirably a conductive material having a small work function value so as to transmit emission light and to efficiently inject electrons into the organic layer (light emitting layer). Examples thereof include a metal or an alloy having a small work function, such as aluminum (Al), silver (Ag), magnesium (Mg), calcium (Ca), sodium (Na), strontium (Sr), an alkali metal or an alkaline earth metal and silver (Ag) [for example, an alloy of magnesium (Mg) and silver (Ag) (Mg—Ag alloy)], an alloy of magnesium-calcium (Mg—Ca alloy), or an alloy of aluminum (Al) and lithium (Li) (Al—Li alloy). Among these, a Mg—Ag alloy is preferable, and a volume ratio between magnesium and silver may be Mg:Ag=5:1 to 30:1, for example. Alternatively, as a volume ratio between magnesium and calcium may be Mg:Ca=2:1 to 10:1, for example. The thickness of the second electrode may be 4 nm to 50 nm, preferably 4 nm to 20 nm, and more preferably 6 nm to 12 nm, for example. Alternatively, at least one material selected from the group consisting of Ag—Nd—Cu, Ag—Cu, Au, and Al—Cu can be mentioned. Alternatively, the second electrode can have a laminated structure of the above-described material layer and a so-called transparent electrode (for example, having a thickness of $3 \times 10^{-8}$ m to $1 \times 10^{-6}$ m) made of, for example, ITO or IZO from the organic layer side. A bus electrode (auxiliary electrode) made of a low-resistance material such as aluminum, an aluminum alloy, silver, a silver alloy, copper, a copper alloy, gold, or a gold alloy may be disposed for the second electrode to reduce resistance of the second electrode as a whole. The second electrode desirably has an average light transmittance of 50% to 90%, preferably 60% to 90%. Meanwhile, when the second electrode functions as an anode electrode, the second electrode is desirably made of a conductive material that transmits emitted light and has a large work function value.

Examples of a method for forming the first electrode and the second electrode include: a vapor deposition method including an electron beam vapor deposition method, a hot filament vapor deposition method, and a vacuum vapor deposition method, a sputtering method, a chemical vapor deposition method (CVD method), an MOCVD method, and a combination of an ion plating method and an etching method; various printing methods such as a screen printing method, an inkjet printing method, and a metal mask printing method; a plating method (an electroplating method or an electroless plating method); a lift-off method; a laser ablation method; and a sol-gel method. According to various printing methods and a plating method, it is possible to directly form the first electrode and the second electrode each having a desired shape (pattern). Note that, when the second electrode is formed after the organic layer is formed, it is particularly preferable to form the second electrode on the basis of a film forming method in which energy of film-forming particles is small, such as a vacuum vapor deposition method, or a film forming method such as an MOCVD method from a viewpoint of preventing the organic layer from being damaged. When the organic layer is damaged, a non-light emitting pixel (or a non-light emitting sub-pixel) called a "blinking point" due to generation of a leakage current may occur.

The organic EL display device preferably has a resonator structure in order to further improve light extraction efficiency. The resonator structure will be described in detail later.

A light shielding unit may be disposed between the light emitting element and the light emitting element. Specific examples of a light shielding material constituting the light shielding unit include a material capable of shielding light, such as titanium (Ti), chromium (Cr), tungsten (W), tantalum (Ta), aluminum (Al), or $MoSi_2$. The light shielding unit can be formed by a vapor deposition method including an electron beam vapor deposition method, a hot filament vapor deposition method, and a vacuum vapor deposition method, a sputtering method, a CVD method, an ion plating method, or the like.

As described above, the intermediate layer and the protective layer are formed between the second electrode and the second substrate. In some cases, a form can be adopted in which the intermediate layer and the protective layer function as color filter layers. The intermediate layer and the protective layer only need to be made of a known color resist material. In a light emitting element that emits white light, a transparent filter layer only needs to be disposed. When the intermediate layer and the protective layer also function as color filter layers as described above, the organic layer is close to the intermediate layer and the protective layer. Therefore, color mixing can be effectively prevented even if an angle of light emitted from the light emitting element is widened, and viewing angle characteristics are improved.

In the display device, an insulating layer, an interlayer insulating layer, and an interlayer insulating material layer are formed, and examples of an insulating material constituting these layers include: a $SiO_X$-based material (material constituting a silicon-based oxide film) such as $SiO_2$, non-doped silicate glass (NSG), boron phosphorus silicate glass (BPSG), PSG, BSG, AsSG, SbSG, PbSG, spin-on glass (SOG), low temperature oxide (LTO, low temperature CVD-$SiO_2$), low-melting-point glass, or glass paste; a SiN-based material including a SiON-based material; SiOC; SiOF; and SiCN. Alternatively, examples of the insulating material include an inorganic insulating material such as titanium oxide ($TiO_2$), tantalum oxide ($Ta_2O_5$), aluminum oxide ($Al_2O_3$), magnesium oxide (MgO), chromium oxide ($CrO_x$), zirconium oxide ($ZrO_2$), niobium oxide ($Nb_2O_5$), tin oxide ($SnO_2$), or vanadium oxide ($VO_x$). Alternatively, examples of the insulating material include various resins such as a polyimide-based resin, an epoxy-based resin, and an acryl-based resin, and a low dielectric constant insulating material such as SiOCH, organic SOG, or a fluorine-based resin (for example, a material having a dielectric constant k ($=\varepsilon/\varepsilon_0$) of, for example, 3.5 or less, and specific examples thereof include fluorocarbon, a cycloperfluorocarbon polymer, benzocyclobutene, a cyclic fluorine-based resin, polytetrafluoroethylene, amorphous tetrafluoroethylene, polyaryl ether, fluorinated aryl ether, fluorinated polyimide, amorphous carbon, parylene (polyparaxylylene), and fluorinated fullerene), and also include Silk (which is a trademark of The Dow Chemical Co. and a coating type low dielectric constant interlayer insulating film material) and Flare (which is a trademark of Honeywell Electronic Materials Co. and a polyallyl ether (PAE)-based material).

These can be used singly or in appropriate combination. In some cases, the base may be made of the materials described above. The insulating layer, the interlayer insulating layer, the interlayer insulating material layer, and the base can be formed on the basis of a known method such as various CVD methods, various coating methods, various PVD methods including a sputtering method and a vacuum vapor deposition method, various printing methods such as a screen printing method, a plating method, an electrodeposition method, an immersion method, or a sol-gel method.

In the organic EL display device, the thickness of the hole transport layer (hole supply layer) and the thickness of the electron transport layer (electron supply layer) are desirably substantially equal to each other. Alternatively, the electron transport layer (electron supply layer) may be thicker than the hole transport layer (hole supply layer), and this makes it possible to supply electrons necessary for high efficiency at a low drive voltage and sufficient to the light emitting layer. That is, by forming the hole transport layer between the first electrode corresponding to the anode electrode and the light emitting layer and forming the hole transport layer with a film thickness thinner than that of the electron transport layer, supply of holes can be increased. As a result, it is possible to obtain a carrier balance in which there is no excess or deficiency of holes and electrons and a carrier supply amount is sufficiently large. Therefore, high light emission efficiency can be obtained. In addition, since there is no excess or deficiency of holes and electrons, the carrier balance is hardly lost, drive deterioration is suppressed, and a light emission lifetime can be extended.

On an outermost surface (specifically, for example, an outer surface of the second substrate) of the display device from which light is emitted, an ultraviolet absorption layer, a contamination preventing layer, a hard coat layer, and an antistatic layer may be formed, or a protective member (for example, cover glass) may be disposed.

The display device or the like of the present disclosure can be used as, for example, a monitor device constituting a personal computer, or can be used as a monitor device incorporated in a television receiver, a mobile phone, a personal digital assistant (PDA), or a game device, or a display device incorporated in a projector. Alternatively, the display device or the like of the present disclosure can be applied to an electronic viewfinder (EVF), a head mounted display (HMD), an eyewear, AR glasses, and EVR, and can be applied to a display device for virtual reality (VR), mixed reality (MR), or augmented reality (AR). Alternatively, the display device or the like of the present disclosure can constitute an image display device in an electronic paper such as an electronic book or an electronic newspaper, a bulletin board such as a signboard, a poster, or a blackboard, a rewritable paper as a substitute for printer paper, a display unit of a home appliance, a card display unit of a loyalty card or the like, an electronic advertisement, or an electronic POP. By using the display device or the like of the present disclosure as a light emitting device, various lighting devices including a backlight device for a liquid crystal display device and a planar light source device can be constituted.

Example 1

Example 1 relates to a light emitting element according to the first aspect of the present disclosure and a display device according to the first aspect of the present disclosure. FIG. 1 illustrates a schematic partial cross-sectional view of the display device and the light emitting element of Example 1. In Example 1 or Examples 2 to 6 described later, a light emitting element is constituted by an organic electroluminescence element (organic EL element), and a light emitting layer includes an organic electroluminescence layer. The display device is constituted by an organic electroluminescence display device (organic EL display device), and is an active matrix display device.

A light emitting element 10 of Example 1 includes:
a light emitting unit 30;
an intermediate layer 40 covering the light emitting unit 30;
an optical path control unit 70 disposed on a part of the intermediate layer 40 and having positive optical power; and
a covering layer 71 covering an outer region 40A of the intermediate layer 40 surrounding a part 40B of the intermediate layer 40 on which the optical path control unit 70 is formed and the optical path control unit 70, in which
when a refractive index of a material constituting a part 41 (which is a layer constituting a top layer of the intermediate layer 40 and referred to as a "flattening layer 41" for convenience) of the intermediate layer 40 in contact with the optical path control unit 70 is represented by $n_0$, a refractive index of a material constituting the optical path control unit 70 is represented by $n_1$, and a refractive index of a material constituting the covering layer 71 is represented by $n_2$, $n_0 \geq n_1 > n_2$ is satisfied.
The display device of Example 1 includes:
a first substrate 61 and a second substrate 62; and
a plurality of light emitting elements 10R, 10G, and 10B disposed on the first substrate 61, in which
each of the light emitting elements 10R, 10G, and 10B is constituted by the light emitting element 10 of Example 1. Light from the light emitting unit 30 is emitted to the outside via the second substrate 62. That is, the display device of Example 1 is a top emission type display device that emits light from the second substrate 62.
Alternatively, the display device of Example 1 (organic EL display device) includes:
the first substrate 61 and the second substrate 62; and
the plurality of light emitting elements 10R, 10G, and 10B located between the first substrate 61 and the second substrate 62 and arranged two-dimensionally, in which
each of the light emitting elements 10R, 10G, and 10B disposed on a base formed on the first substrate 61 includes the light emitting unit 30, the light emitting unit 30 includes at least:
a first electrode 31;
a second electrode 32; and
an organic layer (including a light emitting layer constituted by an organic electroluminescence layer) 33 sandwiched between the first electrode 31 and the second electrode 32, and
light from the organic layer 33 is emitted to the outside via the second substrate 62.

Here, in Example 1, a material constituting the flattening layer 41 of the intermediate layer 40 is made of an acrylic resin having a refractive index $n_0=1.56$, a material constituting the optical path control unit 70 is made of an acrylic transparent resin having a refractive index $n_1=1.56$, and a material constituting the covering layer 71 is made of a fluorine-based low refractive index transparent resin having a refractive index $n_1=1.38$.

The layer thickness $T_2$ of an end part 71A of the covering layer 71 located on the outer region 40A of the intermediate layer 40 is more than 0 μm and 1.0 μm or less. The thickness of the part of the covering layer 71 on the optical path control unit 70 is constant. Note that "thickness $T_2$' of the covering layer 71" means a distance from a bottom portion to a top portion of the covering layer 71 along a normal line at an interface between the covering layer 71 and the optical path control unit 70.

Figure 2:
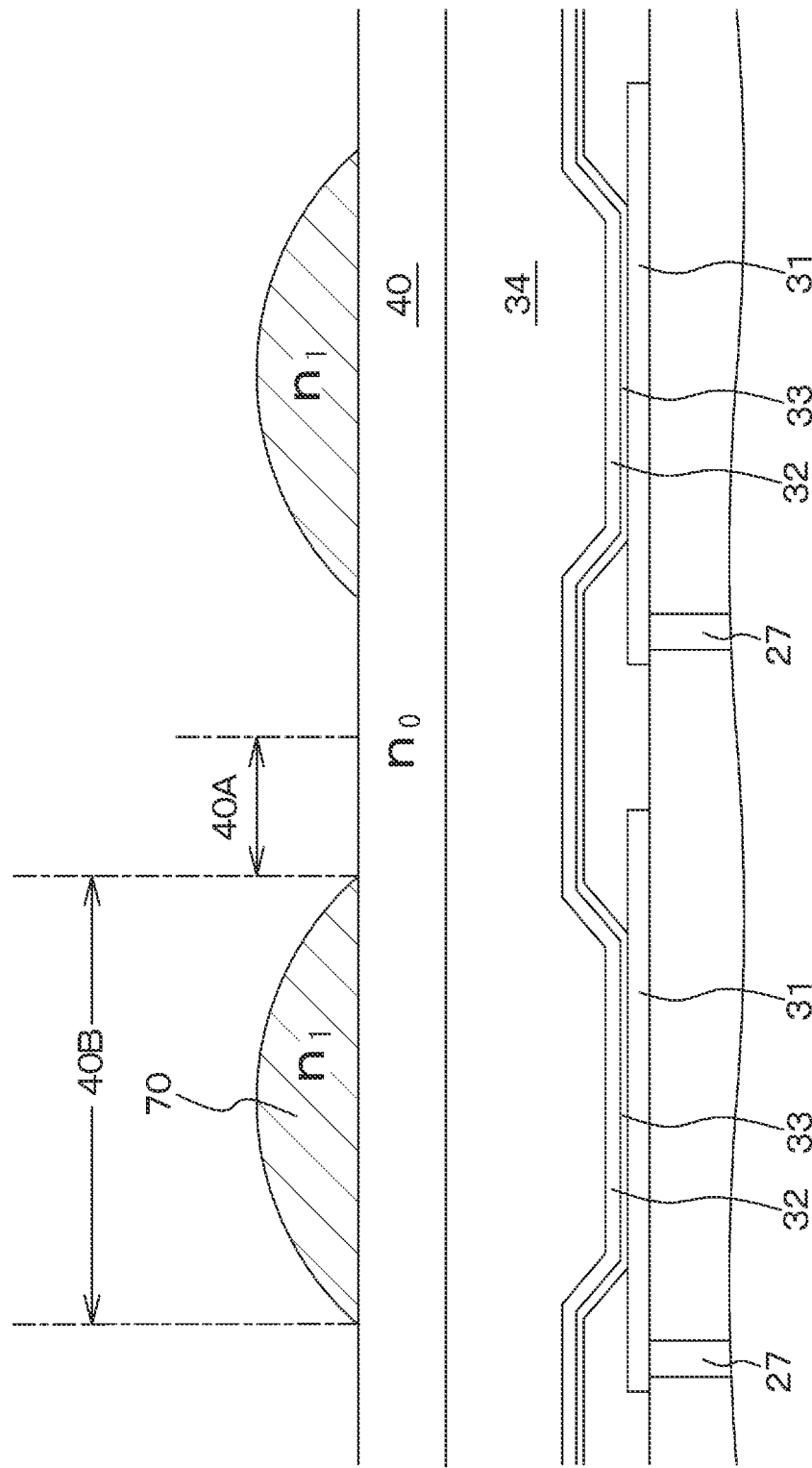
FIG. 2 is a schematic partial cross-sectional view of a light emitting element in a state in which a covering layer is not formed on an optical path control unit, for reference.
Figure 3:
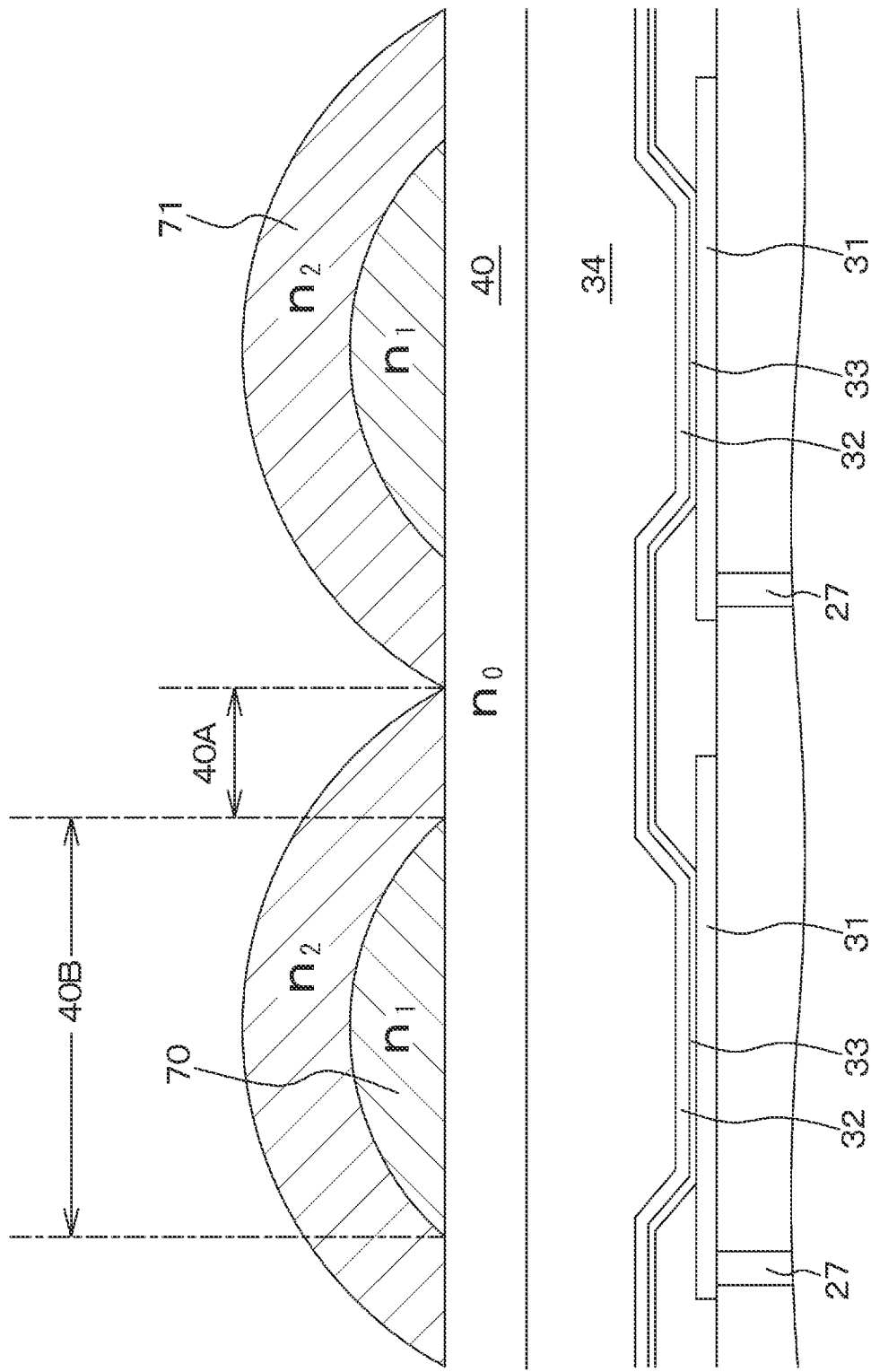
FIG. 3 is a schematic partial cross-sectional view of the light emitting element of Example 1 in a state in which a layer thickness $T_2$ of an end part of a covering layer located on an outer region of an intermediate layer just exceeds 0 µm.
Figure 4:
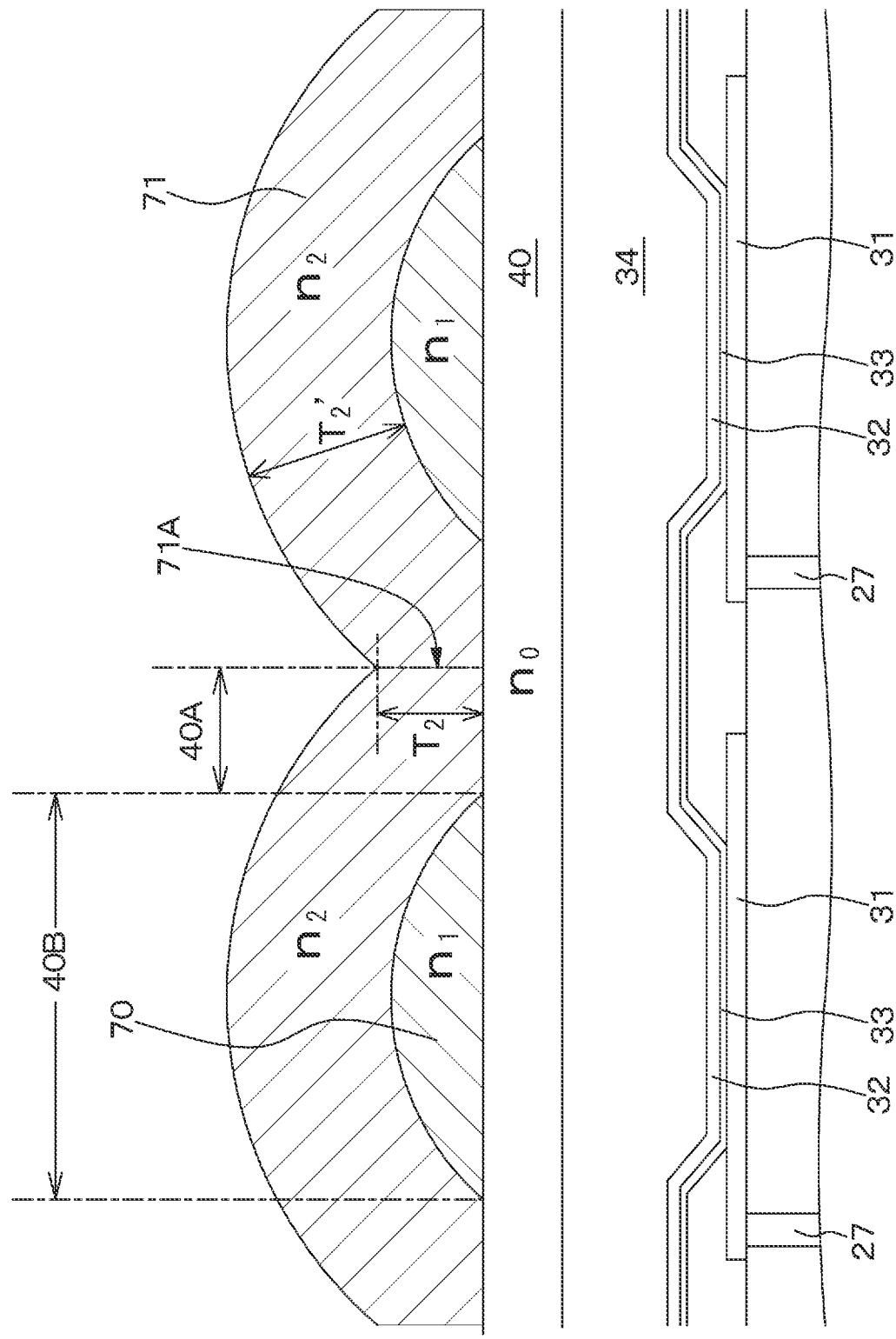
FIG. 4 is a schematic partial cross-sectional view of the light emitting element of Example 1 in a state in which the layer thickness $T_2$ of the end part of the covering layer located on the outer region of the intermediate layer is thicker than that in the state illustrated in FIG. 3.

When $T_2$ exceeds 0 μm exactly, a minimum distance between the covering layer 71 and the covering layer 71 constituting adjacent light emitting elements is 0 μm. This state is schematically illustrated in FIG. 3. For reference, FIG. 2 illustrates a state in which the covering layer 71 is not formed on the optical path control unit 70, and FIG. 4 illustrates an example of a state in which the layer thickness $T_2$ of the end part 71A of the covering layer 71 located on the outer region 40A of the intermediate layer 40 is increased. Note that FIGS. 2, 3, and 4 are schematic partial cross-sectional views, but some hatching lines are omitted. In addition, the covering layer 71 is exaggerated.

The optical path control unit 70 is constituted by a lens member having a convex light exit surface 70b. A light incident surface 70a of the lens member is flat and in contact with the part 41 (flattening layer 41) of the intermediate layer 40. Furthermore, a wavelength selection unit CF is formed inside the intermediate layer 40. That is, the intermediate layer 40 has a laminated structure of the wavelength selection unit CF and the flattening layer 41 from the light emitting unit side. A protective layer 34 is formed on the light emitting unit 30, and the intermediate layer 40 is formed on the protective layer 34. The covering layer 71 is covered with a resin layer 42. A material constituting the resin layer 42 is made of a hollow silica-containing fluorine-based low refractive index transparent resin having an average refractive index $n_3=1.25$, and
satisfies $n_2 > n_3$. The resin layer 42 is bonded (stuck) to the second substrate 62 via a sealing resin layer 43.

In Example 1 or Examples 2 to 6 described later, the light emitting unit 30 (organic layer 33) is constituted by at least two light emitting layers that emit different colors, and emits white light. Specifically, the organic layer 33 is formed by laminating a red light emitting layer that emits red light (wavelength: 620 nm to 750 nm), a green light emitting layer that emits green light (wavelength: 495 nm to 570 nm), and a blue light emitting layer that emits blue light (wavelength: 450 nm to 495 nm).

In Example 1 or Examples 2 to 6 described later, the organic layer 33 is shared by the plurality of light emitting elements. Such an organic layer 33 (light emitting unit 30)

that emits white light and a wavelength selection unit that transmits red light (for example, a red color filter layer $CF_R$) are combined to constitute a red light emitting element 10R, the organic layer 33 (light emitting unit 30) that emits white light and a wavelength selection unit that transmits green light (for example, a green color filter layer $CF_G$) are combined to constitute a green light emitting element 10G, and the organic layer 33 (light emitting unit 30) that emits white light and a wavelength selection unit that transmits blue light (for example, a blue color filter layer $CF_B$) are combined to constitute a blue light emitting element 10B. A combination of sub-pixels such as the red light emitting element 10R, the green light emitting element 10G, and the blue light emitting element 10B constitutes a light emitting element unit (one pixel). In some cases, the red light emitting element 10R, the green light emitting element 10G, the blue light emitting element 10B, and a light emitting element that emits white (or fourth color) light (or a light emitting element that emits complementary color light) may constitute a light emitting element unit (one pixel). The red light emitting element 10R, the green light emitting element 10G, and the blue light emitting element 10B have substantially the same configuration and structure except for the configuration of the color filter layer and the arrangement position of the light emitting layer in the thickness direction of the organic layer. The number of pixels is, for example, 1920×1080, one light emitting element (display element) constitutes one sub-pixel, and the number of light emitting elements (specifically, organic EL elements) is three times the number of pixels.

In Example 1, the organic layer 33 has a laminated structure of a hole injection layer (HIL), a hole transport layer (HTL), a light emitting layer, an electron transport layer (ETL), and an electron injection layer (EIL). The light emitting layer is constituted by at least two light emitting layers that emit different colors, and as described above, light emitted from the organic layer 33 is white. Specifically, the organic layer has a structure in which three layers of a red light emitting layer that emits red light, a green light emitting layer that emits green light, and a blue light emitting layer that emits blue light are laminated. The organic layer can have a structure in which two layers of a blue light emitting layer that emits blue light and a yellow light emitting layer that emits yellow light are laminated, or a structure in which two layers of a blue light emitting layer that emits blue light and an orange light emitting layer that emits orange light are laminated.

The hole injection layer is a layer that enhances hole injection efficiency and functions as a buffer layer that prevents leakage, and has a thickness of, for example, about 2 nm to 10 nm. The hole injection layer is made of, for example, a hexaazatriphenylene derivative represented by the following formula (A) or (B). Note that contact of an end surface of the hole injection layer with the second electrode is a main cause of occurrence of luminance variation between pixels, leading to deterioration of display image quality.

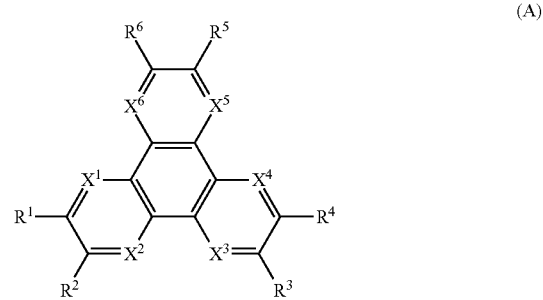
(A)

Here, $R^1$ to $R^6$ each independently represent a substituent selected from the group consisting of a hydrogen atom, a halogen atom, a hydroxy group, an amino group, an arulamino group, a substituted or unsubstituted carbonyl group having 20 or less carbon atoms, a substituted or unsubstituted carbonyl ester group having 20 or less carbon atoms, a substituted or unsubstituted alkyl group having 20 or less carbon atoms, a substituted or unsubstituted alkenyl group having 20 or less carbon atoms, a substituted or unsubstituted alkoxy group having 20 or less carbon atoms, a substituted or unsubstituted aryl group having 30 or less carbon atoms, a substituted or unsubstituted heterocyclic group having 30 or less carbon atoms, a nitrile group, a cyano group, a nitro group, and a silyl group, and adjacent $R^m$ (m=1 to 6) may be bonded to each other via a cyclic structure. $X^1$ to $X^6$ each independently represent a carbon atom or a nitrogen atom.

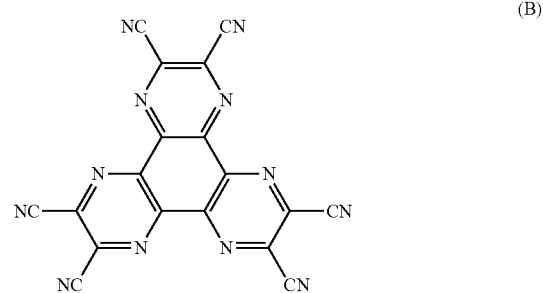 [SMILES: N#Cc1nc2c3nc(C#N)c(C#N)nc3c3nc(C#N)c(C#N)nc3c2nc1C#N]
(B)

The hole transport layer is a layer that enhances hole transport efficiency to the light emitting layer. In the light emitting layer, when an electric field is applied thereto, recombination of electrons and holes occurs, and light is generated. The electron transport layer is a layer that enhances electron transport efficiency to the light emitting layer, and the electron injection layer is a layer that enhances electron injection efficiency to the light emitting layer.

The hole transport layer is made of, for example, 4,4',4"-tris(3-methylphenylphenylamino) triphenylamine (m-MTDATA) or α-naphthylphenyldiamine (αNPD) having a thickness of about 40 nm.

The light emitting layer is a light emitting layer that generates white light by color mixing, and, for example, as described above, is formed by laminating a red light emitting layer, a green light emitting layer, and a blue light emitting layer.

In the red light emitting layer, when an electric field is applied thereto, some of holes injected from the first electrode 31 and some of electrons injected from the second electrode 32 are recombined to generate red light. Such a red light emitting layer contains, for example, at least one material among a red light emitting material, a hole transporting material, an electron transporting material, and a both charge transporting material. The red light emitting material may be a fluorescent material or a phosphorescent material. The red light emitting layer having a thickness of about 5 nm is formed by, for example, mixing 30% by mass of 2,6-bis[(4'-methoxydiphenylamino) styryl]-1,5-dicyanonaphthalene (BSN) with 4,4-bis(2,2-diphenylvinyl) biphenyl (DPVBi).

In the green light emitting layer, when an electric field is applied thereto, some of holes injected from the first electrode 31 and some of electrons injected from the second electrode 32 are recombined to generate green light. Such a green light emitting layer contains, for example, at least one material among a green light emitting material, a hole transporting material, an electron transporting material, and a both charge transporting material. The green light emitting material may be a fluorescent material or a phosphorescent material. The green light emitting layer having a thickness of about 10 nm is formed by, for example, mixing 5% by mass of coumarin 6 with DPVBi.

In the blue light emitting layer, when an electric field is applied thereto, some of holes injected from the first electrode 31 and some of electrons injected from the second electrode 32 are recombined to generate blue light. Such a blue light emitting layer contains, for example, at least one material among a blue light emitting material, a hole transporting material, an electron transporting material, and a both charge transporting material. The blue light emitting material may be a fluorescent material or a phosphorescent material. The blue light emitting layer having a thickness of about 30 nm is formed by, for example, mixing 2.5% by mass of 4,4'-bis[2-{4-(N,N-diphenylamino) phenyl} vinyl] biphenyl (DPAVBi) with DPVBi.

The electron transport layer having a thickness of about 20 nm is made of, for example, 8-hydroxyquinoline aluminum (Alq3). The electron injection layer having a thickness of about 0.3 nm is made of, for example, LiF or $Li_2O$.

Note that the materials constituting the layers are merely examples, and are not limited to these materials. For example, as described above, the light emitting layer may be constituted by a blue light emitting layer and a yellow light emitting layer or may be constituted by a blue light emitting layer and an orange light emitting layer.

Figure 30A:
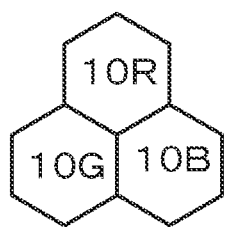
FIG. 30A is a diagram schematically illustrating an arrangement of light emitting elements in the display device of Example 1.
Figure 30B:
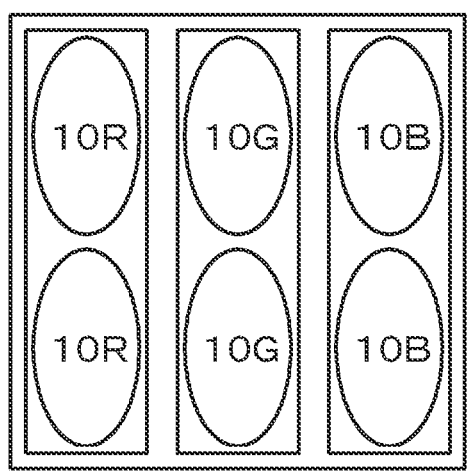
FIG. 30B is a diagram schematically illustrating an arrangement of light emitting elements in the display device of Example 1.
Figure 30C:
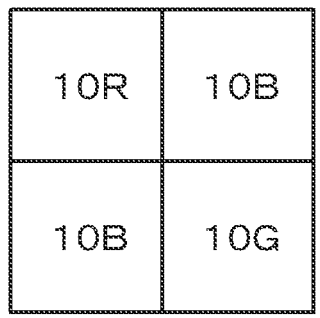
FIG. 30C is a diagram schematically illustrating an arrangement of light emitting elements in the display device of Example 1.
Figure 30D:
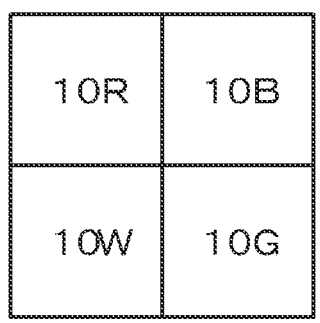
FIG. 30D is a diagram schematically illustrating an arrangement of light emitting elements in the display device of Example 1.
Figure 30E:
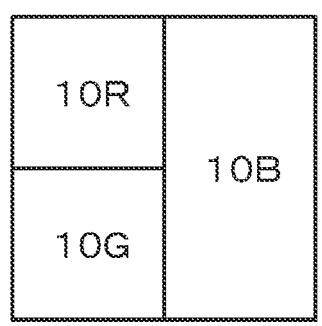
FIG. 30E is a diagram schematically illustrating an arrangement of light emitting elements in the display device of Example 1.

In the display device of Example 1, examples of an arrangement of sub-pixels include a delta arrangement illustrated in FIG. 30A, a stripe arrangement illustrated in FIG. 30B, a diagonal arrangement illustrated in FIG. 30C, and a rectangle arrangement. In some cases, as illustrated in FIG. 30D, the first light emitting element 10R, the second light emitting element 10G, the third light emitting element 10B, and a fourth light emitting element 10W that emits white light (or a fourth light emitting element that emits complementary color light) may constitute one pixel. The fourth light emitting element 10W that emits white light only needs to have a transparent filter layer instead of having the color filter layer. Alternatively, a square arrangement illustrated in FIG. 30E can also be adopted. Note that, in the example illustrated in FIG. 30E, (area of light emitting element 10R):(area of light emitting element 10G):(area of light emitting element 10B)=1:1:2, but may be 1:1:1.

In the display device of Example 1 or Examples 2 to 6 described later, the arrangement of the first light emitting element 10R, the second light emitting element 10G, and the third light emitting element 10B is specifically a delta arrangement, but is not limited thereto. Note that the schematic partial cross-sectional views of the display devices illustrated in FIG. 1 and FIGS. 5, 6, 7, 8, 9, 10, 11, and 28 described later are different from a schematic partial cross-sectional view of a display device in which light emitting elements are in a delta arrangement in order to simplify the drawings.

The following description can be appropriately applied to Examples 2 to 6 described later.

Specifically, the first electrode 31, the organic layer 33, and the second electrode 32 are sequentially formed on the base 26. The base 26 is formed on the first substrate 61. Examples of a material constituting the base 26 include an insulating materials such as $SiO_2$, SiN, or SiON.

As described above, the protective layer 34 is formed so as to cover the second electrode 32, and the wavelength selection unit [color filter layer CF ($CF_R$, $CF_G$, $CF_B$)] made of a known material is formed on the protective layer 34 by a known method. The flattening layer 41 is formed on the wavelength selection unit (color filter layer CF) constituting the intermediate layer 40, and the covering layer 71 that covers the optical path control unit 70 and the flattening layer 41 is formed on the flattening layer 41. Furthermore, the resin layer 42 is formed on the covering layer 71, and the resin layer 42 and the second substrate 62 are bonded to the second substrate 62, for example, via the sealing resin layer 43. The outer shapes of the light emitting unit 30 and the wavelength selection unit CF are, for example, circular, but are not limited to such shapes. The wavelength selection unit CF is an on-chip color filter layer (OCCF) formed on the first substrate side. As a result, a distance between the organic layer 33 and the wavelength selection unit CF can be shortened, and it is possible to suppress occurrence of color mixing by incidence of light emitted from the organic layer 33 on an adjacent wavelength selection unit CF of another color.

A drive circuit (light emitting element driving unit) is disposed below the base 26 made of $SiO_2$ formed on the basis of a CVD method. The drive circuit can have a known circuit configuration. The drive circuit is constituted by a transistor (specifically, MOSFET) formed on a silicon semiconductor substrate corresponding to the first substrate 61. A transistor 20 constituted by a MOSFET includes a gate insulating layer 22 formed on the first substrate 61, a gate electrode 21 formed on the gate insulating layer 22, a source/drain region 24 formed on the first substrate 61, a channel formation region 23 formed between the source/drain regions 24, and an element isolation region 25 surrounding the channel formation region 23 and the source/drain region 24. The base 26 includes a lower interlayer insulating layer 26A and an upper interlayer insulating layer 26B.

In the light emitting element 10, the transistor 20 and the first electrode 31 are electrically connected to each other via a contact plug 27A disposed in the lower interlayer insulating layer 26A, a pad 27C disposed on the lower interlayer insulating layer 26A, and a contact plug 27B disposed in the upper interlayer insulating layer 26B. Note that, in the drawings, one transistor 20 is illustrated for one drive circuit.

The first electrode 31 is disposed for each of the light emitting elements. The organic layer 33 is disposed so as to be shared by the light emitting elements. The second electrode 32 is an electrode shared by the plurality of light emitting elements. That is, the second electrode 32 is a so-called solid electrode. The first substrate 61 is disposed under the base 26, and the second substrate 62 is disposed above the second electrode 32. The light emitting element is formed on the first substrate side, and the light emitting unit 30 is disposed on the base 26.

The second electrode 32 is connected to the drive circuit (light emitting element driving unit) via a contact hole (contact plug) (not illustrated) formed in the base 26 at an outer peripheral portion (specifically, an outer peripheral portion of a pixel array unit) of the display device. In the outer peripheral portion of the display device, an auxiliary electrode connected to the second electrode 32 may be disposed below the second electrode 32, and the auxiliary electrode may be connected to the drive circuit.

The first electrode 31 functions as an anode electrode, and the second electrode 32 functions as a cathode electrode. The first electrode 31 is constituted by a light reflecting material layer, specifically, for example, an Al—Nd alloy layer, an Al—Cu alloy layer, or a laminated structure of an Al—Ti alloy layer and an ITO layer, and the second electrode 32 is made of a transparent conductive material such as ITO. The first electrode 31 is formed on the base 26 on the basis of a combination of a vacuum vapor deposition method and an etching method. The second electrode 32 is formed by a film forming method in which energy of film-forming particles is small, such as a vacuum vapor deposition method, and is not patterned. The organic layer 33 is not patterned, either. Note that the present disclosure is not limited to this.

In Example 1 or Examples 2 to 6 described later, the light emitting element 10 has a resonator structure in which the organic layer 33 is a resonance unit. In order to appropriately adjust a distance from a light emitting surface to a reflecting surface (specifically, for example, a distance from the light emitting surface to the first electrode 31 and the second electrode 32), the thickness of the organic layer 33 is preferably $8 \times 10^{-8}$ m or more and $5 \times 10^{-7}$ m or less, and more preferably $1.5 \times 10^{-7}$ m or more and $3.5 \times 10^{-7}$ m or less. In the organic EL display device having a resonator structure, actually, the red light emitting element 10R causes red light emitted from the light emitting layer to resonate, and emits reddish light (light having a light spectrum peak in a red region) from the second electrode 32. In addition, the green light emitting element 10G causes green light emitted from the light emitting layer to resonate, and emits greenish light (light having a light spectrum peak in a green region) from the second electrode 32. Furthermore, the blue light emitting element 10B causes blue light emitted from the light emitting layer to resonate, and emits bluish light (light having a light spectrum peak in a blue region) from the second electrode 32.

Hereinafter, an outline of a method for manufacturing the light emitting element 10 of Example 1 illustrated in FIG. 1 will be described.

[Step-100]

First, a drive circuit is formed on a silicon semiconductor substrate (first substrate 61) on the basis of a known MOSFET manufacturing process.

[Step-110]

Next, the lower interlayer insulating layer 26A is formed on the entire surface by a CVD method. Then, a connection hole is formed in a part of the lower interlayer insulating layer 26A located above one source/drain region 24 of the transistor 20 on the basis of a photolithography technique and an etching technique. Next, a conductive material layer is formed on the lower interlayer insulating layer 26A including the connection hole on the basis of, for example, a sputtering method, and the conductive material layer is further patterned on the basis of a photolithography technique and an etching technique, whereby the contact hole (contact plug) 27A and the pad 27C can be formed.

[Step-120]

Then, the upper interlayer insulating layer 26B is formed on the entire surface, and a connection hole is formed in a part of the upper interlayer insulating layer 26B located above the desired pad 27C on the basis of a photolithography technique and an etching technique. Then, a conductive material layer is formed on the upper interlayer insulating layer 26B including the connection hole on the basis of, for example, a sputtering method, and next, the conductive material layer is patterned on the basis of a photolithography technique and an etching technique, whereby the first electrode 31 can be formed on a part of the base 26. The first electrode 31 is disposed separately for each of the light emitting elements. In addition, the contact hole (contact plug) 27B electrically connecting the first electrode 31 and the transistor 20 can be formed in the connection hole.

[Step-130]

Next, for example, the insulating layer 28 is formed on the entire surface on the basis of a CVD method, and then the insulating layer 28 is left on the base 26 between the first electrode 31 and the first electrode 31 on the basis of a photolithography technique and an etching technique. The first electrode 31 is exposed at a bottom of an opening 28A formed in the insulating layer 28.

[Step-140]

Thereafter, the organic layer 33 is formed on the first electrode 31 and the insulating layer 28 by, for example, a PVD method such as a vacuum vapor deposition method or a sputtering method, or a coating method such as a spin coating method or a die coating method. In some cases, the organic layer 33 may be patterned into a desired shape.

[Step-150]

Next, the second electrode 32 is formed on the entire surface on the basis of, for example, a vacuum vapor deposition method. In some cases, the second electrode 32 may be patterned into a desired shape. In this way, the organic layer 33 and the second electrode 32 can be formed on the first electrode 31.

[Step-160]

Thereafter, the protective layer 34 is formed on the entire surface on the basis of a coating method, and a top surface of the protective layer 34 is flattened. Since the protective layer 34 can be formed on the basis of a coating method, there are few restrictions on a processing process, a material selection width is wide, and a high refractive index material can be used. Thereafter, the wavelength selection unit CF ($CF_R$, $CF_G$, $CF_B$) is formed on the protective layer 34 by a known method.

[Step-170]

Then, the flattening layer 41 is formed on the wavelength selection unit CF by a known method. Thereafter, the optical path control unit 70 is formed on the flattening layer 41, and the covering layer 71 covering the optical path control unit 70 and the flattening layer 41 is further formed by a known method.

The optical path control unit 70 can be manufactured, for example, by the following method. That is, a lens member forming layer for forming the optical path control unit 70 is formed on the flattening layer 41, and a resist material layer is formed thereon. Then, the resist material layer is patterned and further subjected to heat treatment to form the resist material layer into a lens member shape. Next, the resist material layer and the lens member forming layer are etched back to transfer the shape formed in the resist material layer to the lens member forming layer. In this way, the optical path control unit 70 can be obtained. Note that the method for manufacturing the optical path control unit 70 is not limited to such a method.

[Step-180]

Next, the resin layer 42 is formed on the covering layer 71 by a known method, and then the resin layer 42 and the second substrate 62 are bonded to each other via the sealing resin layer 43. In this way, the light emitting element (organic EL element) 10 illustrated in FIG. 1 and the display device of Example 1 can be obtained. As described above, by adopting a so-called OCCF type in which the wavelength selection unit CF (color filter layer) is disposed on the first substrate side instead of disposing the wavelength selection unit CF on the second substrate side, a distance between the organic layer 33 and the wavelength selection unit CF can be shortened.

In the light emitting element of Example 1, light emitted from the light emitting unit and passing through the optical path control unit and the covering layer is converged in a direction approaching a normal line of a light emitting region passing through the center of the light emitting region. In addition, light entering a part of the covering layer located above the outer region of the intermediate layer from the outer region of the intermediate layer and emitted from the covering layer is also converged in the direction approaching a normal line of a light emitting region passing through the center of the light emitting region. Here, such light is further converged in the direction approaching a normal line of a light emitting region passing through the center of the light emitting region as compared with a case where the covering layer is not formed. Therefore, light extraction efficiency and front luminance can be increased as compared with a case where the covering layer is not formed. Note that the center of the light emitting region refers to an area centroid point of a region where the first electrode and the organic layer are in contact with each other.

Note that light entering a part of the covering layer 71 located above the outer region 40A of the intermediate layer 40 constituting an adjacent light emitting element from the outer region 40A of the intermediate layer 40 and emitted from the covering layer 71 constituting the adjacent light emitting element does not reach an observer observing an image of the display device.

Figure 5:
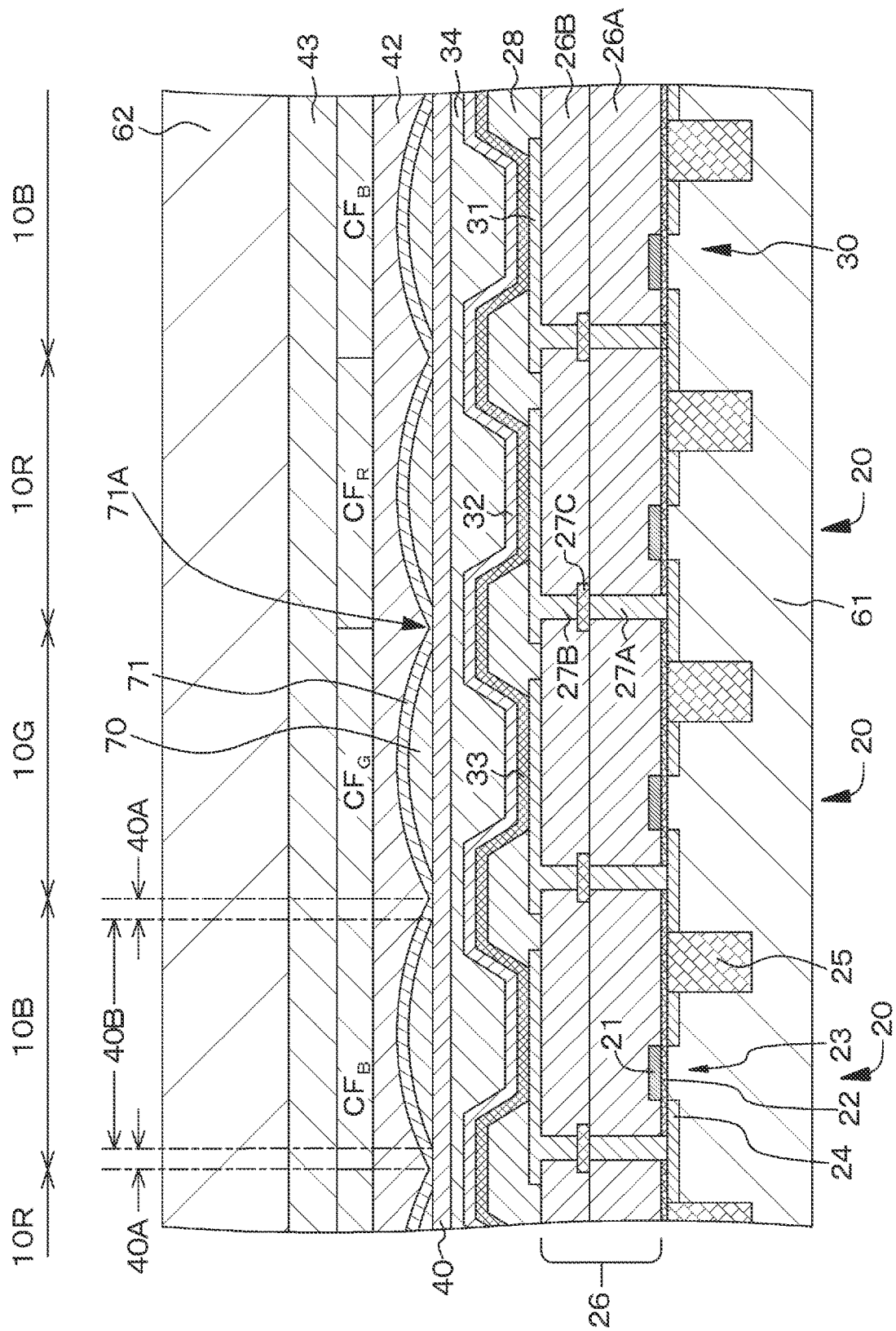
FIG. 5 is a schematic partial cross-sectional view of Modification-1 of the light emitting element and the display device of Example 1.
Figure 6:
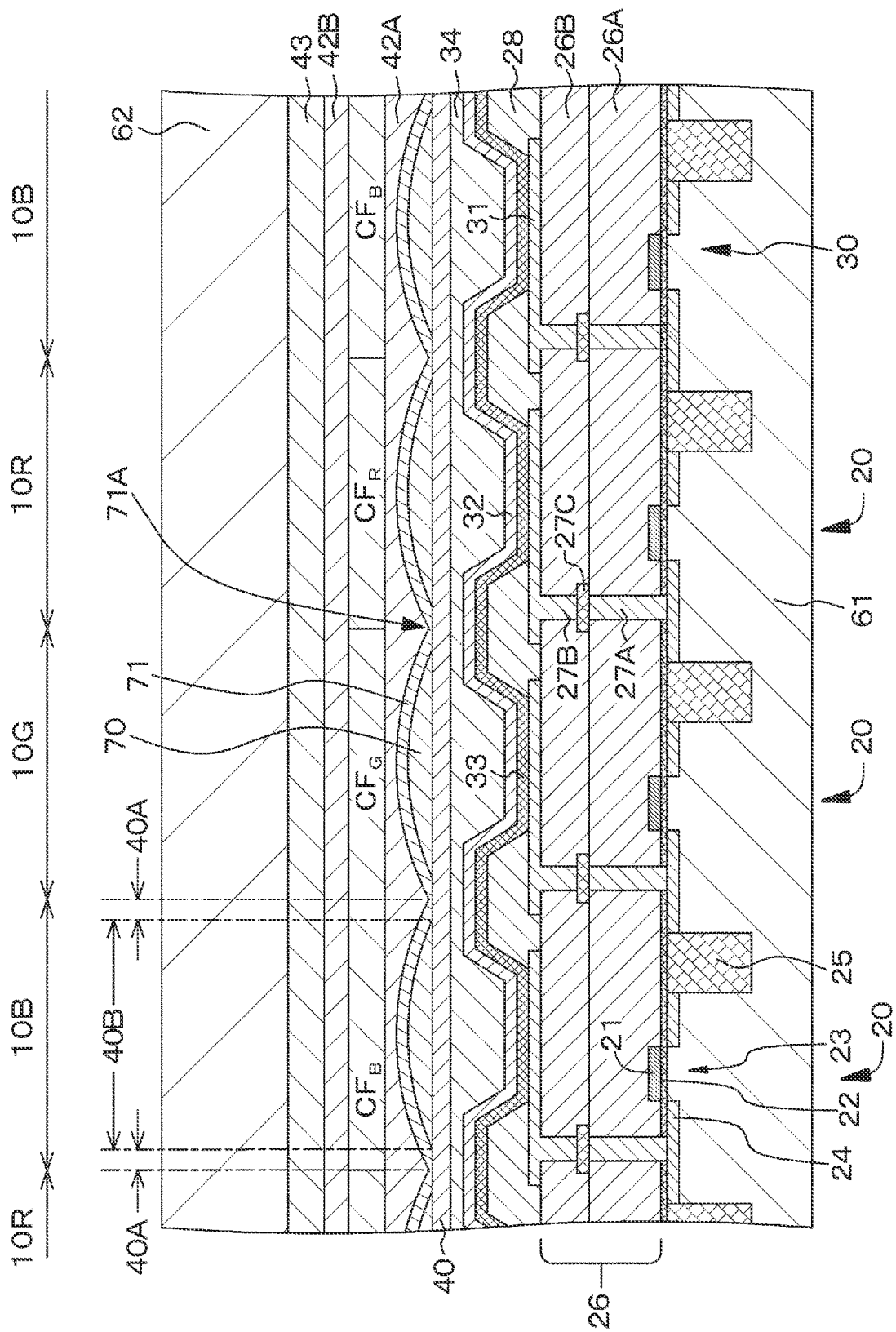
FIG. 6 is a schematic partial cross-sectional view of Modification-2 of the light emitting element and the display device of Example 1.

As FIGS. 5 and 6 illustrate schematic partial cross-sectional views of Modification-1 and Modification-2 of the display device of Example 1, the covering layer 71 is covered with the resin layer 42, when an average refractive index of a material constituting the resin layer is represented by $n_3$, $$n_2 > n_3$$

is satisfied, and the wavelength selection unit CF is formed on the resin layer 42 (see Modification-1 and FIG. 5), or the wavelength selection unit CF is formed inside resin layers 42A and 42B (see Modification-2 and FIG. 6). Note that the optical path control unit 70 and the covering layer 71 are formed on the intermediate layer 40, and a material constituting the intermediate layer 40 is, for example, the same as a material constituting the flattening layer 41.

Figure 7:
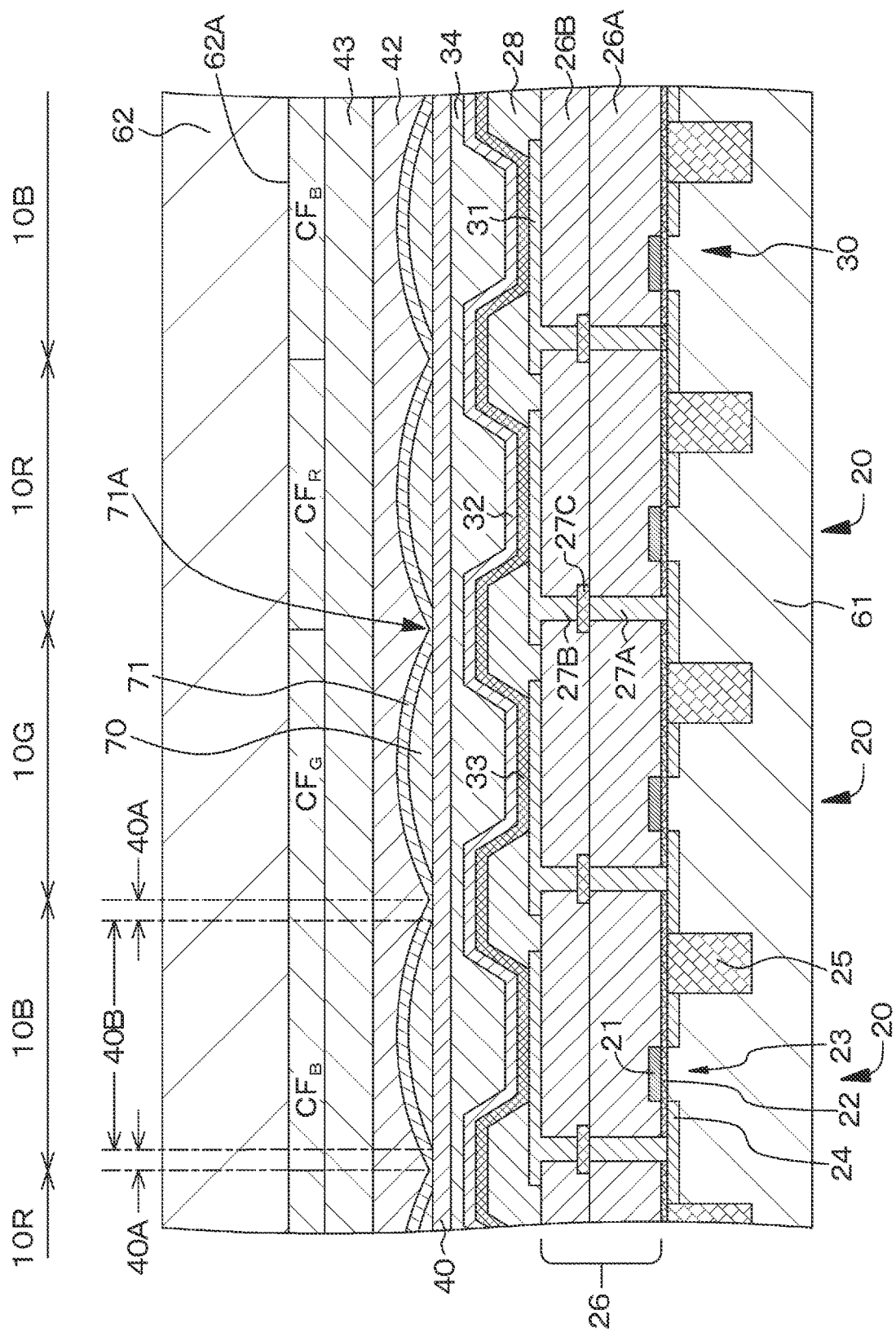
FIG. 7 is a schematic partial cross-sectional view of Modification-3 of the light emitting element and the display device of Example 1.

Alternatively, as FIG. 7 illustrates a schematic partial cross-sectional view of Modification-3 of the display device of Example 1, the wavelength selection unit CF is formed on an inner surface 62A of the second substrate 62 facing the first substrate 61, and the wavelength selection unit CF and the resin layer 42 are bonded to each other by the sealing resin layer 43.

Figure 8:
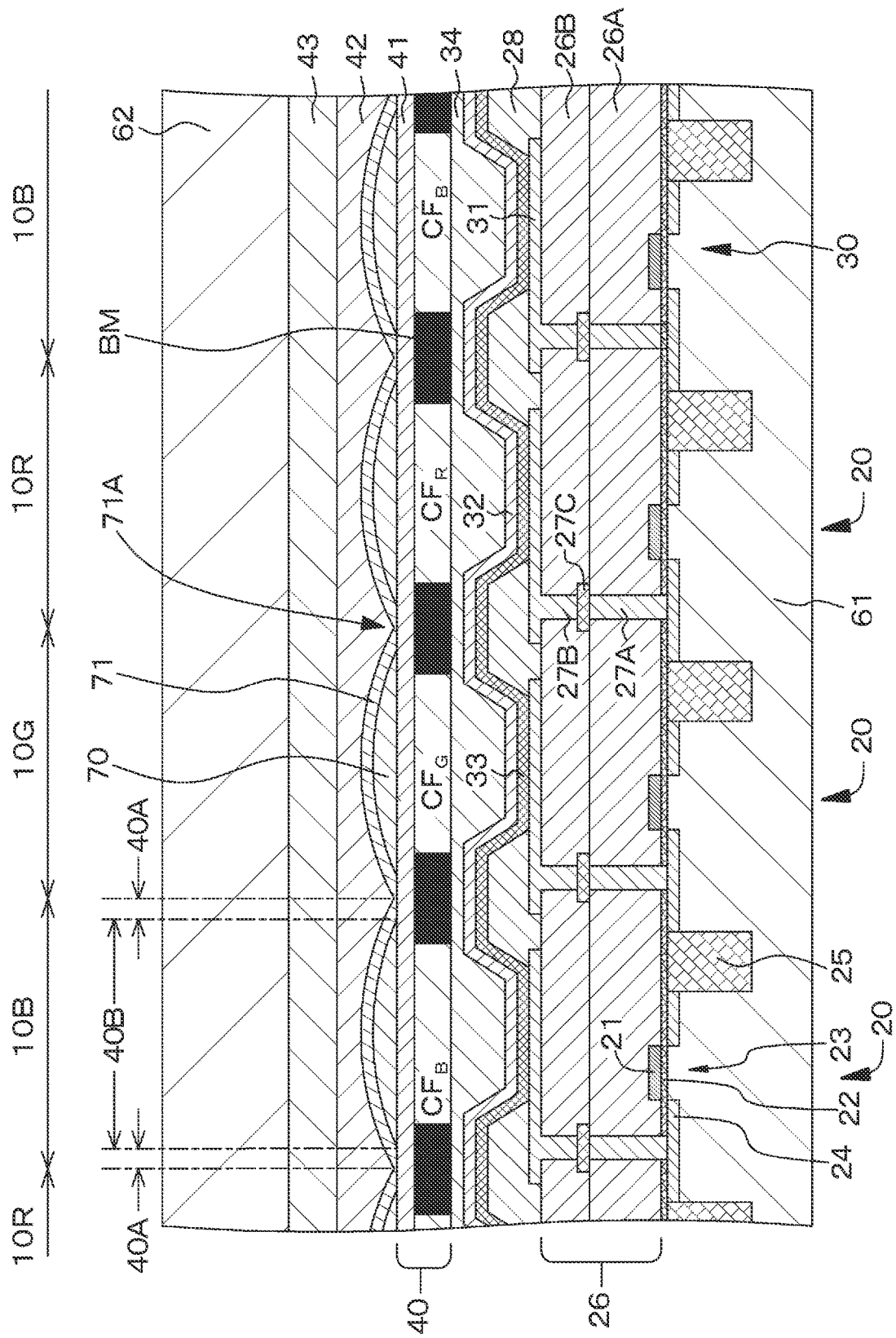
FIG. 8 is a schematic partial cross-sectional view of Modification-4 of the light emitting element and the display device of Example 1.

Alternatively, as FIG. 8 illustrates a schematic partial cross-sectional view of Modification-4 of the display device of Example 1, a form can be adopted in which a light absorption layer (black matrix layer) BM is formed between the wavelength selection units CF of adjacent light emitting elements. The black matrix layer BM is constituted by, for example, a black resin film (specifically, for example, a black polyimide-based resin) mixed with a black colorant and having an optical density of 1 or more. Note that this Modification—can be appropriately applied to Modification-1, Modification-2, and Modification-3.

The intermediate layer can function as a color filter layer. That is, the intermediate layer having such a function only needs to be made of a known color resist material. When the intermediate layer also functions as a color filter layer as described above, the organic layer can be disposed close to the intermediate layer. Therefore, color mixing can be effectively prevented even if an angle of light emitted from the light emitting element is widened, and viewing angle characteristics are improved.

Example 2

Figure 9:
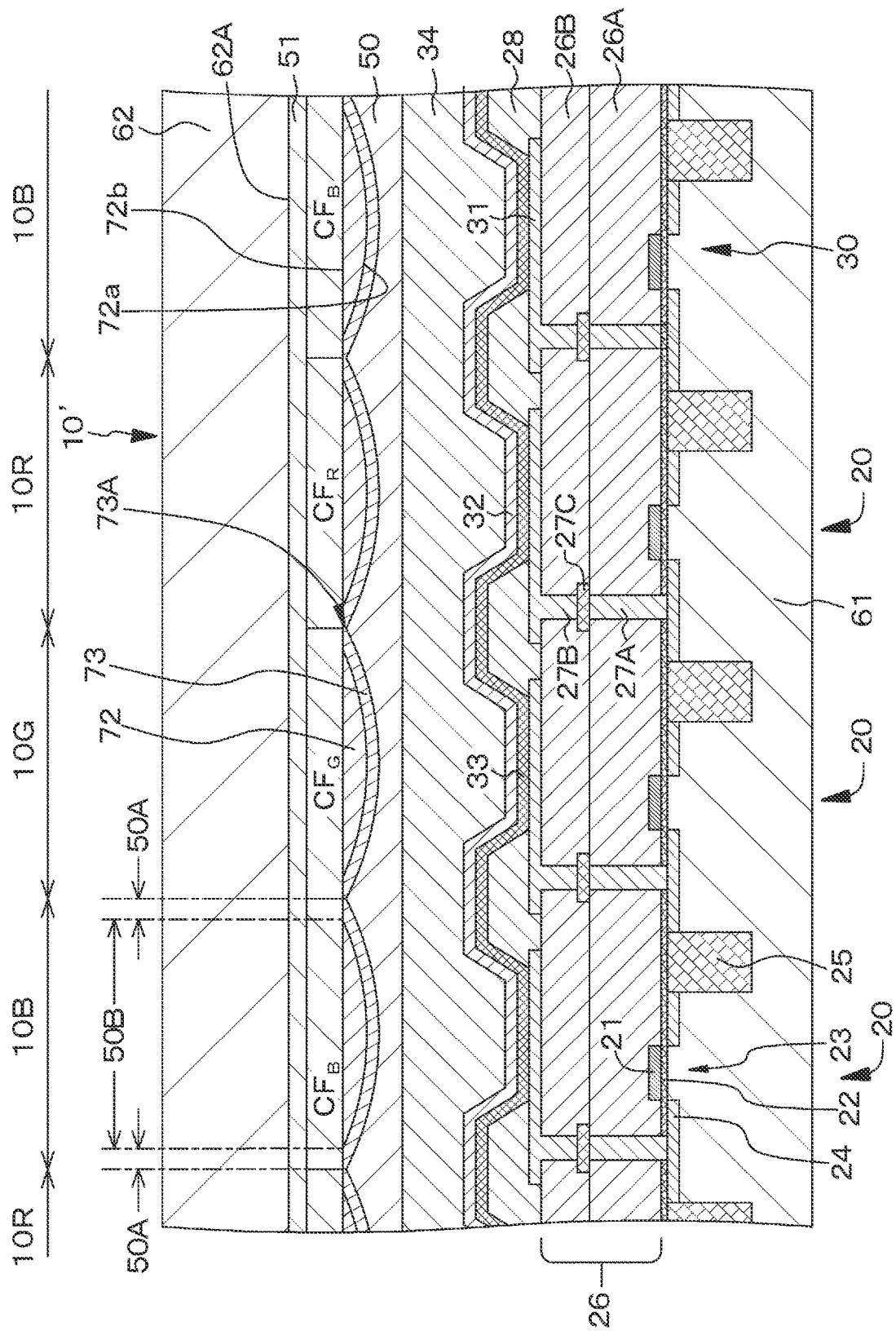
FIG. 9 is a schematic partial cross-sectional view of a light emitting element and a display device of Example 2.

Example 2 relates to a light emitting element according to the second aspect of the present disclosure and a display device according to the second aspect of the present disclosure. FIG. 9 illustrates a schematic partial cross-sectional view of the display device and the light emitting element of Example 2.

A light emitting element 10' of Example 2 includes:

a light emitting unit 30;

a sealing resin layer 50 covering the light emitting unit 30;

an optical path control unit 72 disposed on a part of the sealing resin layer 50 and having positive optical power;

a flattening film 51 formed on an outer region 50A of the sealing resin layer 50 surrounding a part 50B of the sealing resin layer 50 on which the optical path control unit 72 is formed and the optical path control unit 72; and a covering layer 73 formed so as to extend from a space between the outer region 50A of the sealing resin layer 50 and the flattening film 51 to a space between the optical path control unit 72 and the flattening film 51, in which when a refractive index of a material constituting the flattening film 51 is represented by $n_0$, a refractive index of a material constituting the optical path control unit 72 is represented by $n_1$, and a refractive index of a material constituting the covering layer 73 is represented by $n_2$, $$n_0 \geq n_1 > n_2$$

is satisfied.

The display device of Example 2 includes:

a first substrate 61 and a second substrate 62; and a plurality of light emitting elements 10R, 10G, and 10B disposed on the first substrate 61, in which each of the light emitting elements 10R, 10G, and 10B is constituted by the light emitting element 10' of Example 2.

Here, in Example 2, a material constituting the flattening film 51 is made of an acrylic resin having a refractive index $n_0=1.56$, a material constituting the optical path control unit 72 is made of an acrylic transparent resin having a refractive index $n_1=1.56$, and a material constituting the covering layer 73 is made of a fluorine-based low refractive index transparent resin having a refractive index $n_0=1.38$.

The layer thickness $T_2$ of an end part 73A of the covering layer 73 located on the outer region 50A of the sealing resin layer 50 is more than 0 μm and 0.5 μm or less.

The optical path control unit 72 is constituted by a lens member having a convex light incident surface 72a. A light exit surface 72b of the lens member is, for example, flat, and the wavelength selection unit CF is formed between the flattening film 51 and the optical path control unit 72. A material constituting the sealing resin layer 50 is made of a hollow silica-containing fluorine-based low refractive index transparent resin having an average refractive index $n_3=1.25$, and satisfies $n_2 > n_3$ is satisfied The light emitting unit 30 is covered with a protective layer 34, and the protective layer 34 is bonded to the sealing resin layer 50.

In manufacture of the light emitting element and the display device of Example 2, first, steps similar to [Step-100] to [Step-150] of Example 1 are executed. Thereafter, the protective layer 34 is formed on the entire surface on the basis of a coating method, and a top surface of the protective layer 34 is flattened. Since the protective layer 34 can be formed on the basis of a coating method, there are few restrictions on a processing process, a material selection width is wide, and a high refractive index material can be used.

Meanwhile, the flattening film 51 and the wavelength selection unit CF ($CF_R$, $CF_G$, $CF_B$) are sequentially formed on an inner surface 62A of the second substrate 62. Then, the optical path control unit 72 and the covering layer 73 are formed on the wavelength selection unit CF. Then, the protective layer 34 and the covering layer 73 are bonded to each other via the sealing resin layer 50. In this way, the light emitting element (organic EL element) 10' illustrated in FIG. 9 and the display device of Example 2 can be obtained.

In the light emitting element of Example 2, light emitted from the light emitting unit and passing through the covering layer and the optical path control unit is converged in a direction approaching a normal line of a light emitting region passing through the center of the light emitting region. In addition, light entering a part of the covering layer located above the outer region of the sealing resin layer from the outer region of the sealing resin layer and emitted from the covering layer is also converged in the direction approaching a normal line of a light emitting region passing through the center of the light emitting region. Here, such light is further converged in the direction approaching a normal line of a light emitting region passing through the center of the light emitting region as compared with a case where the covering layer is not formed. Therefore, light extraction efficiency and front luminance can be increased as compared with a case where the covering layer is not formed.

Note that behavior of light entering a part of the covering layer 73 located above the outer region 50A of the sealing resin layer 50 constituting an adjacent light emitting element from the outer region 50A of the sealing resin layer 50 and emitted from the covering layer 73 constituting the adjacent light emitting element does not reach an observer observing an image of the display device.

Except for the above points, the configurations and structures of the light emitting element 10' and the display device of Example 2 can be substantially similar to those of the light emitting element 10 and the display device described in Example 1, and thus detailed description thereof will be omitted.

Figure 10:
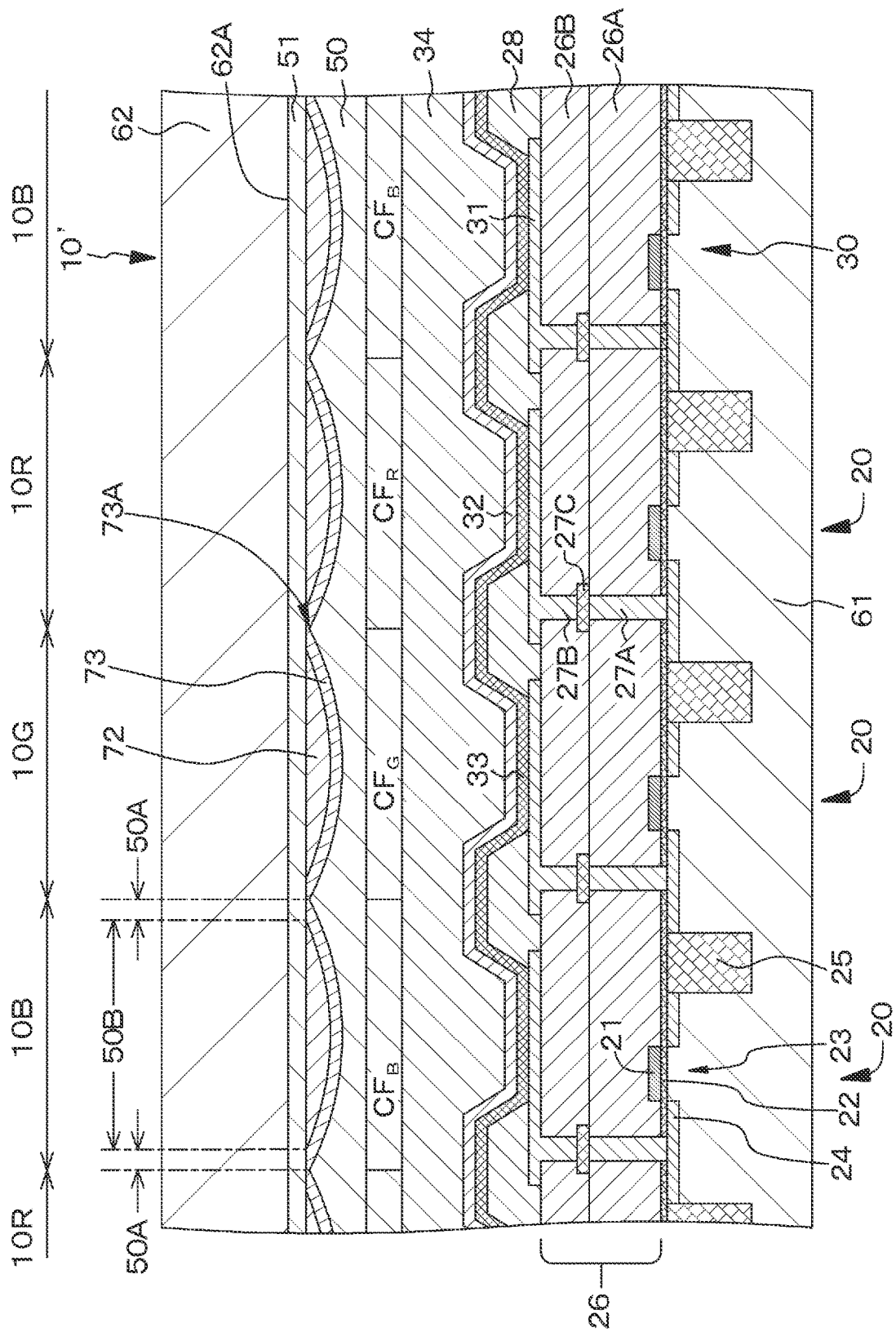
FIG. 10 is a schematic partial cross-sectional view of Modification-1 of the light emitting element and the display device of Example 2.

As FIG. 10 illustrates a schematic partial cross-sectional view of Modification-1 of the display device of Example 2, the protective layer 34 can be formed between the sealing resin layer 50 and the light emitting unit 30, and the wavelength selection unit CF can be formed on the protective layer 34. Alternatively, although not illustrated, the wavelength selection unit CF can be formed inside the protective layer 34, the wavelength selection unit CF can be formed between the flattening film 51 and the second substrate 62, and the wavelength selection unit CF can be formed inside the sealing resin layer 50.

Example 3

Example 3 is a modification of Example 1, and the optical path control unit is constituted by a light exit direction control member.

In order to increase light use efficiency of the entire display device, it is preferable to effectively condense light at an outer edge portion of the light emitting element. However, in a hemispherical lens, although an effect of condensing light near the center of the light emitting element on the front is large, an effect of condensing light near an outer edge portion of the light emitting element may be small.

In the light emitting element of Example 3, a side surface of the light exit direction control member constituting the optical path control unit is surrounded by a material or a layer (covering layer) having a refractive index $n_2$ lower than a refractive index $n_1$ of a material constituting the light exit direction control member. Therefore, the light exit direction control member has a function as a kind of lens, and can effectively enhance a light condensing effect in the vicinity of an outer edge portion of the light exit direction control member. When a light beam is incident on a side surface of the light exit direction control member, in a case where the incidence is considered in geometrical optics, an incident angle and a reflection angle are equal to each other, and therefore it is difficult to improve extraction in a front direction. However, in a case where the incidence is considered in wave analysis (FDTD), light extraction efficiency in the vicinity of the outer edge portion of the light exit direction control member is improved. Therefore, light in the vicinity of the outer edge portion of the light emitting element can be effectively condensed, and as a result, light extraction efficiency in a front direction of the entire light emitting element is improved. Therefore, high light emission efficiency of the display device can be achieved. That is, high luminance and low power consumption of the display device can be achieved. In addition, since the light exit direction control member has a flat plate shape, the light exit direction control member is easily formed, and a manufacturing process can be simplified.

Specifically, examples of a three-dimensional shape of the light exit direction control member can include a columnar shape, an elliptical columnar shape, an oval columnar shape, a cylindrical shape, a prismatic shape (including a hexagonal prism, an octagonal prism, and a prismatic shape with rounded ridges), a truncated conical shape, and a truncated pyramid shape (including a truncated pyramid shape with rounded ridges). The prism shape and the truncated pyramid shape include a regular prism shape and a regular truncated pyramid shape, respectively. A part of a ridge where a side surface and a top surface of the light exit direction control member intersect with each other may be rounded. A bottom surface of the truncated pyramid shape may be located on the first substrate side or on the second electrode side. Alternatively, specific examples of a planar shape of the light exit direction control member include a circle, an ellipse, an oval, and a polygon including a triangle, a quadrangle, a hexagon, and an octagon. The polygon includes a regular polygon (including a rectangle and a regular polygon such as a regular hexagon (honeycomb shape)). The light exit direction control member can be made of, for example, a transparent resin material such as an acrylic resin, an epoxy-based resin, a polycarbonate resin, or a polyimide-based resin, or a transparent inorganic material such as $SiO_2$.

A cross-sectional shape of a side surface of the light exit direction control member in a thickness direction thereof may be linear, convexly curved, or concavely curved. That is, the side surface of the prism or the truncated pyramid may be flat, convexly curved, or concavely curved.

A light exit direction control member extending portion having a smaller thickness than the light exit direction control member may be formed between adjacent light exit direction control members.

A top surface of the light exit direction control member may be flat, may have an upward convex shape, or may have a concave shape, but the top surface of the light exit direction control member is preferably flat from a viewpoint of improving luminance in a front direction of an image display region (also referred to as a "display panel" for convenience) of the display device. The light exit direction control member can be obtained by, for example, a combination of a photolithography technique and an etching method, or can be formed on the basis of a nanoprinting method.

The size of the planar shape of the light exit direction control member may be changed depending on a light emitting element. For example, when one pixel is constituted by three sub-pixels, the size of the planar shape of the light exit direction control member may be the same value in three sub-pixels constituting one pixel, may be the same value in two sub-pixels except for one sub-pixel, or may be different values among three sub-pixels. In addition, the refractive index of a material constituting the light exit direction control member may be changed depending on a light emitting element. For example, when one pixel is constituted by three sub-pixels, the refractive index of a material constituting the light exit direction control member may be the same value in three sub-pixels constituting one pixel, may be the same value in two sub-pixels except for one sub-pixel, or may be different values among three sub-pixels.

The planar shape of the light exit direction control member is preferably similar to that of the light emitting region, or the light emitting region is preferably included in an orthographic projection image of the light exit direction control member. Note that the orthographic projection image is an orthographic projection image obtained by projection onto the first substrate, and the same applies hereinafter.

A side surface of the light exit direction control member is preferably perpendicular or substantially perpendicular. Specifically, an inclination angle of the side surface of the light exit direction control member can be, for example, 80 degrees to 100 degrees, preferably 81.8 degrees or more and 98.2 degrees or less, more preferably 84.0 degrees or more and 96.0 degrees or less, still more preferably 86.0 degrees or more and 94.0 degrees or less, particularly preferably 88.0 degrees or more and 92.0 degrees or less, and most preferably 90 degrees.

An average height of the light exit direction control member can be, for example, 1.5 μm or more and 2.5 μm or less, and this can effectively enhance a light condensing effect in the vicinity of the outer edge portion of the light exit direction control member. The height of the light exit direction control member may be changed depending on a light emitting element. For example, when one pixel is constituted by three sub-pixels, the height of the light exit direction control member may be the same value in three sub-pixels constituting one pixel, may be the same value in two sub-pixels except for one sub-pixel, or may be different values among three sub-pixels.

A shortest distance between side surfaces of adjacent light exit direction control members can be 0.4 μm or more and 1.2 μm or less, preferably 0.6 μm or more and 1.2 μm or less, more preferably 0.8 μm or more and 1.2 μm or less, and still more preferably 0.8 μm or more and 1.0 μm or less. By defining a minimum value of the shortest distance between side surfaces of adjacent light exit direction control members to be 0.4 μm, a shortest distance between the adjacent light exit direction control members can be set to be about the same as a lower limit value of a wavelength band of visible light. Therefore, it is possible to suppress deterioration of function of a material or a layer surrounding the light exit direction control member, and as a result, it is possible to effectively enhance a light condensing effect in the vicinity of the outer edge portion of the light exit direction control member. Meanwhile, by defining a maximum value of the shortest distance between side surfaces of adjacent light exit direction control members to be 1.2 μm, the size of the light exit direction control members can be reduced, and as a result, a light condensing effect in the vicinity of the outer edge portion of the light exit direction control member can be effectively enhanced.

A distance between the centers of adjacent light exit direction control members is preferably 1 μm or more and 10 μm or less, and by setting the distance to 10 μm or less, a wave property of light is remarkably exhibited. Therefore, a high light condensing effect can be imparted to the light exit direction control member.

A maximum distance (maximum distance in a height direction) from a light emitting region to a bottom surface of the light exit direction control member is desirably more than 0.35 μm and 7 μm or less, preferably 1.3 μm or more and 7 μm or less, more preferably 2.8 m or more and 7 μm or less, and still more preferably 3.8 μm or more and 7 μm or less. By defining that the maximum distance from the light emitting region to the light exit direction control member is more than 0.35 μm, a light condensing effect in the vicinity of the outer edge portion of the light exit direction control member can be effectively enhanced. Meanwhile, by defining that the maximum distance from the light emitting region to the light exit direction control member is 7 μm or less, it is possible to suppress deterioration of viewing angle characteristic.

The number of light exit direction control members for one pixel is essentially arbitrary, and only needs to be one or more. For example, when one pixel is constituted by a plurality of sub-pixels, one light exit direction control member may be disposed corresponding to one sub-pixel, one light exit direction control member may be disposed corresponding to a plurality of sub-pixels, or a plurality of light exit direction control members may be disposed corresponding to one sub-pixel. When p×q light exit direction control members are disposed corresponding to one sub-pixel, examples of values of p and q include 10 or less, 5 or less, and 3 or less.

Figure 11:
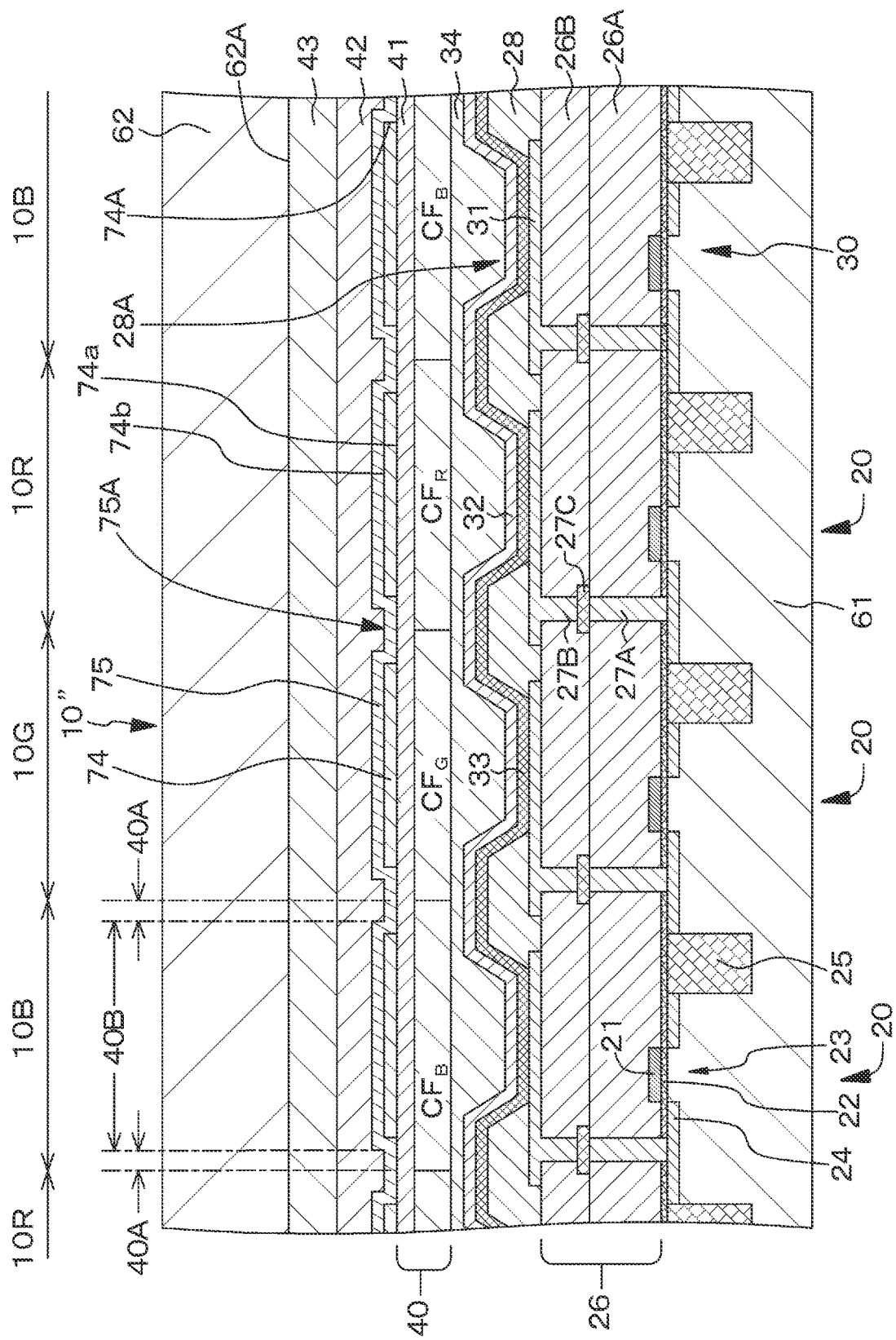
FIG. 11 is a schematic partial cross-sectional view of a light emitting element and a display device of Example 3.

As FIG. 11 illustrates a schematic partial cross-sectional view of the display device of Example 3, a light exit direction control member 74 as an optical path control unit is disposed above the light emitting unit 30, specifically, on the flattening layer 41 of the intermediate layer 40. A cross-sectional shape of the light exit direction control member 74 when the light exit direction control member is cut along a virtual plane (perpendicular virtual plane) including a thickness direction of the light exit direction control member 74 is rectangular. A three-dimensional shape of the light exit direction control member 74 is, for example, a columnar shape. When a refractive index of a material constituting the light exit direction control member 74 is represented by $n_1$ and a refractive index of a material constituting the covering layer 75 is represented by $n_2$ ($<n_1$), since the light exit direction control member 74 is surrounded by the covering layer 75, the light exit direction control member 74 has a function as a kind of lens, and furthermore, can effectively enhance a light condensing effect in the vicinity of the outer edge portion of the light exit direction control member 74. In addition, since the light exit direction control member 74 has a flat plate shape, the light exit direction control member 74 is easily formed, and a manufacturing process can be simplified. The light exit direction control member 74 may be surrounded by a material different from the material constituting the covering layer 75 as long as the material satisfies the refractive index condition ($n_2<n_1$). Alternatively, the light exit direction control member 74 may be surrounded by, for example, an air layer or a decompression layer (vacuum layer). The layer thickness $T_2$ of an end part 75A of the covering layer 75 located on the outer region 40A of the intermediate layer 40 is more than 0 µm and 1.0 µm or less. A light incident surface 74a and a light exit surface 74b of the light exit direction control member 74 are flat, and the light incident surface 74a is in contact with a part 41 (flattening layer 41) of the intermediate layer 40. Note that reference numeral 74A indicates a side surface of the light exit direction control member 74.

Except for the above points, the configurations and structures of the light emitting element 10" and the display device of Example 3 can be similar to those of the light emitting element 10 and the display device described in Example 1, and thus detailed description thereof will be omitted.

Example 4

Example 4 is a modification of Examples 1 to 3. In Example 4, a relationship among a normal line LN passing through the center of the light emitting region, a normal line LN' passing through the center of the optical path control unit, and a normal line LN" passing through the center of the wavelength selection unit (color filter layer), and a modification thereof will be described.

In a light emitting element of Example 4, when a distance (offset amount) between the normal line LN passing through the center of the light emitting region and the normal line LN' passing through the center of the optical path control unit is represented by $D_0$, a value of the distance (offset amount) $D_0$ is not zero in at least some of the light emitting elements constituting a display device. In the display device, a reference point (reference region) P is assumed, and the distance $D_0$ depends on a distance $D_1$ from the reference point (reference region) P to the normal line LN passing through the center of the light emitting region. Note that the reference point (reference region) can include a certain extent of spread. Here, the various normal lines are perpendicular lines to a light exit surface of the display device. The center of the light emitting region refers to an area centroid point of a region where the first electrode and the organic layer are in contact with each other.

With such a form, light beams that have been emitted from the light emitting units 30 constituting the light emitting elements and have passed through the optical path control unit 70, 72, 74 can be converged (condensed) on a certain region in a space outside the display device. Alternatively, the light beams that have been emitted from the light emitting units 30 constituting the light emitting elements and have passed through the optical path control unit 70, 72, 74 can diverge in the space outside the display device. Alternatively, the light beams that have been emitted from the light emitting units 30 constituting the light emitting elements and have passed through the optical path control unit 70, 72, 74 can be parallel light beams.

Whether light (image) emitted from the entire display device is a converged type or a diverging type depends on specifications of the display device, and also depends on how much viewing angle dependency and wide viewing angle characteristics are required for the display device.

The distance $D_0$ may be changed among sub-pixels constituting one pixel. That is, the distance $D_0$ may be changed among the plurality of light emitting elements constituting one pixel. For example, when one pixel is constituted by three sub-pixels, a value of $D_0$ may be the same value in three sub-pixels constituting one pixel, may be the same value in two sub-pixels except for one sub-pixel, or may be different values among three sub-pixels.

Figure 12:
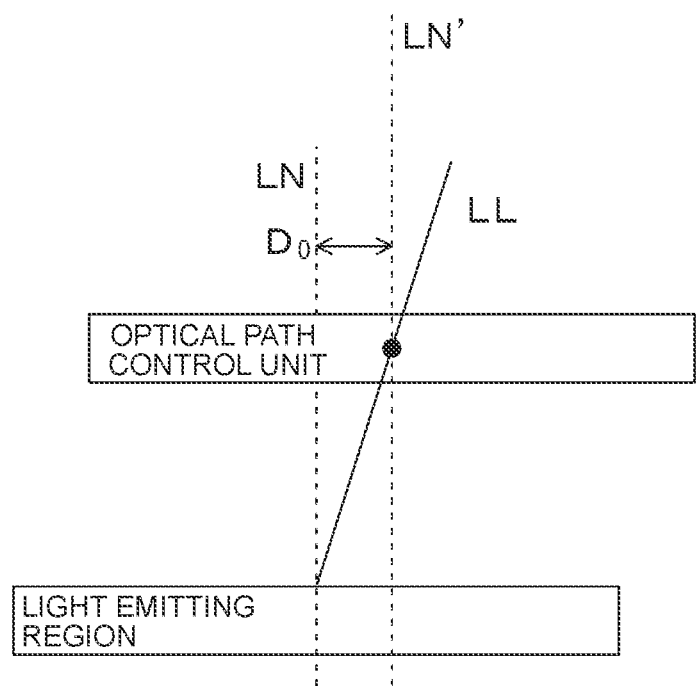
FIG. 12 is a conceptual diagram for explaining a relationship between a normal line LN passing through the center of a light emitting region and a normal line LN' passing through the center of an optical path control unit in a display device of Example 4.

As FIG. 12 illustrates a conceptual diagram, in the display device of Example 4, when a distance (offset amount) between the normal line LN passing through the center of the light emitting region and the normal line LN' passing through the center of the optical path control unit 70, 72, 74 is represented by $D_0$, a value of the distance (offset amount) $D_0$ is not zero in at least some of the light emitting elements 10 constituting the display device. A straight line LL is a straight line connecting the center of the light emitting region and the center of the optical path control unit 70, 72, 74. In the following description, the optical path control units 70, 72, and 74 may be collectively expressed by the optical path control unit 70.

A form can be adopted in which the reference point (reference region) P is assumed, and the distance Do depends on the distance $D_1$ from the reference point (reference region) P to the normal line LN passing through the center of the light emitting region. Note that the reference point (reference region) can include a certain extent of spread. Here, the various normal lines are perpendicular lines to a light exit surface of the display device.

In an image display region (display panel) of the display device of Example 4 including the above-described preferable form, a configuration can be adopted in which the reference point P is assumed to be in the display panel. In this case, a configuration can be adopted in which the reference point P is not located in (not included in) the center region of the display panel, or a configuration can be adopted in which the reference point P is located in the center region of the display panel. Furthermore, in these cases, a configuration can be adopted in which one reference point P is assumed, or a configuration can be adopted in which a plurality of reference points P is assumed. In these cases, a configuration can be adopted in which values of the distance $D_0$ are zero in some of the light emitting elements and values of the distance $D_0$ are not zero in the remaining light emitting elements.

Alternatively, in the display device of Example 4 including the above-described preferable form, when one reference point P is assumed, a configuration can be adopted in which the reference point P is not included in the center region of the display panel, or a configuration can be adopted in which the reference point P is included in the center region of the display panel. When a plurality of reference points P is assumed, a configuration can be adopted in which at least one reference point P is not included in the center region of the display panel.

Alternatively, a configuration can be adopted in which the reference point P is assumed outside the display panel. In this case, a configuration can be adopted in which one reference point P is assumed, or a configuration can be adopted in which a plurality of reference points P is assumed. In these cases, a configuration can be adopted in which values of the distance $D_0$ are not zero in all the light emitting elements.

Furthermore, in the display device of Example 4, a form can be adopted in which a value of the distance (offset amount) $D_0$ is different depending on a position where the light emitting element occupies the display panel. Specifically, a form can be adopted in which
the reference point P is set,
the plurality of light emitting elements is arranged in a first direction and a second direction different from the first direction, and
when a distance from the reference point P to the normal line LN passing through the center of the light emitting region is represented by $D_1$, values of the distance $D_0$ in the first direction and the second direction are represented by $D_{0-X}$ and $D_{0-Y}$, respectively, and values of the distance $D_1$ in the first direction and the second direction are represented by $D_{1-X}$ and $D_{1-Y}$, respectively, $D_{0-X}$ changes linearly with respect to a change in $D_{1-X}$ and $D_{0-Y}$ changes linearly with respect to a change in $D_{1-Y}$,
$D_{0-X}$ changes linearly with respect to a change in $D_{1-X}$ and $D_{0-Y}$ changes nonlinearly with respect to a change in $D_{1-Y}$,
$D_{0-X}$ changes nonlinearly with respect to a change in $D_{1-X}$ and $D_{0-Y}$ changes linearly with respect to a change in $D_{1-Y}$, or
$D_{0-X}$ changes nonlinearly with respect to a change in $D_{1-X}$ and $D_{0-Y}$ changes nonlinearly with respect to a change in $D_{1-Y}$.

Alternatively, a form can be adopted in which a value of the distance $D_0$ increases as a value of the distance $D_1$ increases. That is, in the display device of Example 4,
a form can be adopted in which
the reference point P is set, and
when a distance from the reference point P to the normal line LN passing through the center of the light emitting region is represented by $D_1$, a value of the distance $D_0$ increases as a value of the distance $D_1$ increases.

Here, the phrase that $D_{0-X}$ changes linearly with respect to a change in $D_{1-X}$ and $D_{0-Y}$ changes linearly with respect to a change in $D_{1-Y}$ means that $$D_{0-X} = k_X \cdot D_{1-X} \text{ and}$$

$$D_{0-Y} = k_Y \cdot D_{1-Y}$$

are satisfied. Note that $k_X$ and $k_Y$ are constants. That is, $D_{0-X}$ and $D_{0-Y}$ each change on the basis of a linear function. Meanwhile, the phrase that $D_{0-X}$ changes nonlinearly with respect to a change in $D_{1-X}$ and $D_{0-Y}$ changes linearly with respect to a change in $D_{1-Y}$ means that $$D_{0-X} = f_X(D_{1-X}) \text{ and}$$

$$D_{0-Y} = f_Y(D_{1-Y})$$

are satisfied. Here, $f_X$ and $f_Y$ are each a function that is not a linear function (for example, a quadratic function).

Alternatively, the change in $D_{0-X}$ with respect to the change in $D_{1-X}$ and the change in $D_{0-Y}$ with respect to the change in $D_{1-Y}$ can also be stepwise changes. In this case, when the stepwise change is viewed as a whole, a form can be adopted in which the change is a linear change, or a form can be adopted in which the change is a nonlinear change. Furthermore, when the display panel is divided into M×N regions, in one region, the change in $D_{0-X}$ with respect to the change in $D_{1-X}$ and the change in $D_{0-Y}$ with respect to the change in $D_{1-Y}$ may be unchanged or constant changes. The number of light emitting elements in one region may be, for example, 10×10, but is not limited thereto.

FIGS. 13A, 13B, 14A and 14B illustrate a positional relationship between the light emitting element and the reference point in the display device of Example 4, and FIGS. 15A, 15B, 15C, 15D, 16A, 16B, 16C, 16D, 17A, 17B, 17C, 17D, 18A, 18B, 18C, and 18D schematically illustrate the change in $D_{0-X}$ with respect to the change in $D_{1-X}$ and the change in $D_{0-Y}$ with respect to the change in $D_{1-Y}$.

Figure 13A:
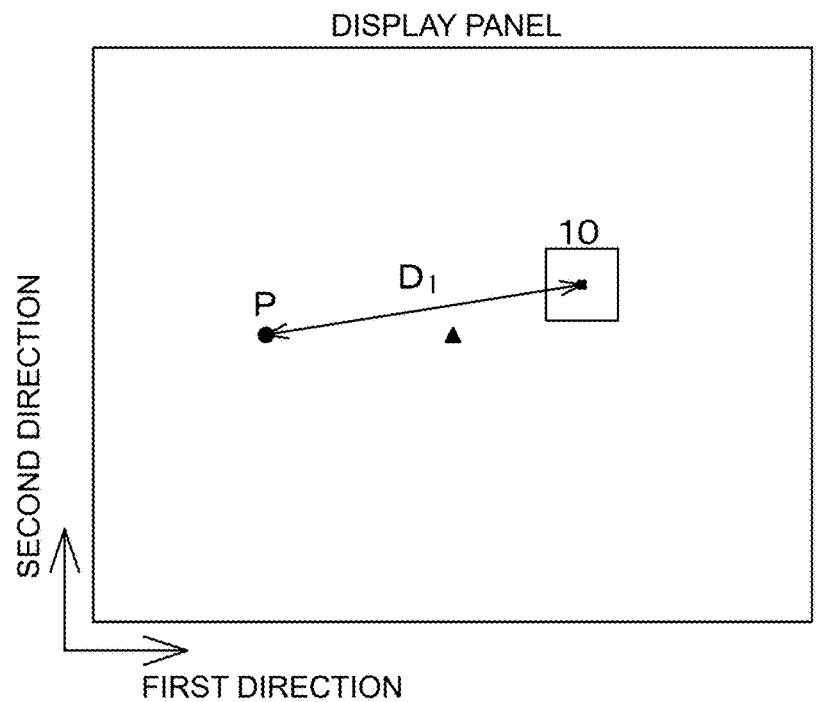
FIG. 13A is a schematic diagram illustrating a positional relationship between a light emitting element and a reference point in the display device of Example 4.
Figure 13B:
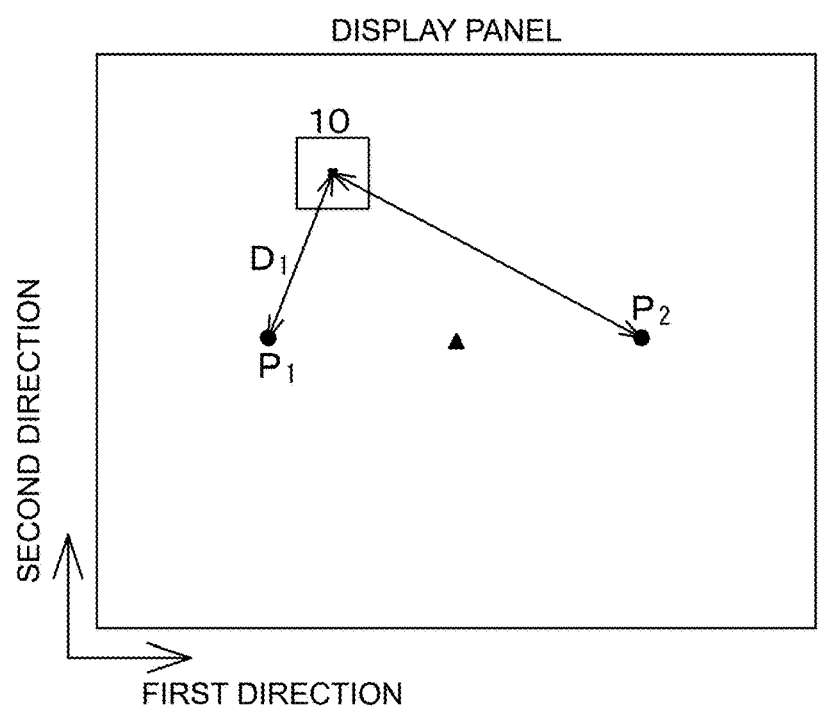
FIG. 13B is a schematic diagram illustrating a positional relationship between a light emitting element and a reference point in the display device of Example 4.

In the display device of Example 4 whose conceptual diagram is illustrated in FIGS. 13A and 13B, the reference point P is assumed to be in the display device. That is, an orthographic projection image of the reference point P is included in an image display region (display panel) of the display device, but the reference point P is not located in the center region of the display device (image display region of display device, display panel). In FIGS. 13A, 13B, 14A, and 14B, the center region of the display panel is indicated by a black triangle, the light emitting element is indicated by an outlined square, and the center of the light emitting region is indicated by a black square. One reference point P is assumed. A positional relationship between the light emitting element 10 and the reference point P is schematically illustrated in FIGS. 13A and 13B, and the reference point P is indicated by a black circle. Note that one reference point P is assumed in FIG. 13A, and a plurality of reference points P (FIG. 13B illustrates two reference points $P_1$ and $P_2$) is assumed in FIG. 13B. Since the reference point P can include a certain extent of spread, values of the distance $D_0$ are zero in some of the light emitting elements (specifically, one or more light emitting elements included in the orthographic projection image of the reference point P), and values of the distance $D_0$ are not zero in the remaining light emitting elements. A value of the distance (offset amount) $D_0$ varies depending on a position occupied by the light emitting element in the display panel.

In the display device of Example 4, light beams that have been emitted from the light emitting units 30 constituting the light emitting elements 10 and have passed through the optical path control unit 70 are converged (condensed) on a certain region of a space outside the display device. Alternatively, the light beams that have been emitted from the light emitting units 30 constituting the light emitting elements 10 and have passed through the optical path control unit 70 diverge in a space outside the display device.

Alternatively, the light beams that have been emitted from the light emitting units 30 constituting the light emitting elements 10 and have passed through the optical path control unit 70 are parallel light beams. Whether the light beams that have passed through the optical path control unit 70 are to be converged light beams, divergent light beams, or parallel light beams is based on specifications required for the display device. Power or the like of the optical path control unit 70 only needs to be designed on the basis of the specifications. When the light beams that have passed through the optical path control unit 70 are converged light beams, the position of a space in which an image emitted from the display device is formed may be on a normal line of the reference point P or is not on the normal line of the reference point P in some cases, and depends on specifications required for the display device. An optical system through which an image emitted from the display device passes may be disposed in order to control a display dimension, a display position, and the like of the image emitted from the display device. Which optical system is disposed depends on specifications required for the display device, and examples thereof include an imaging lens system.

In the display device of Example 4, the reference point P is set, and the plurality of light emitting elements 10 is arrayed in the first direction (specifically, X direction) and the second direction (specifically, Y direction) different from the first direction. When a distance from the reference point P to the normal line LN passing through the center of the light emitting region is represented by $D_1$, values of the distance $D_0$ in the first direction (X direction) and the second direction (Y direction) are represented by $D_{0-X}$ and $D_{0-Y}$, respectively, and values of the distance $D_1$ in the first direction (X direction) and the second direction (Y direction) are represented by $D_{1-X}$ and $D_{1-Y}$, respectively,

[A] a design may be made such that $D_{0-X}$ changes linearly with respect to a change in $D_{1-X}$ and $D_{0-Y}$ changes linearly with respect to a change in $D_{1-Y}$,

[B] a design may be made such that $D_{0-X}$ changes linearly with respect to a change in $D_{1-X}$ and $D_{0-Y}$ changes nonlinearly with respect to a change in $D_{1-Y}$,

[C] a design may be made such that $D_{0-X}$ changes nonlinearly with respect to a change in $D_{1-X}$ and $D_{0-Y}$ changes linearly with respect to a change in $D_{1-Y}$, or

[D] a design may be made such that $D_{0-X}$ changes nonlinearly with respect to a change in $D_{1-X}$ and $D_{0-Y}$ changes nonlinearly with respect to a change in $D_{1-Y}$.

FIGS. 15A, 15B, 15C, 15D, 16A, 16B, 16C, 16D, 17A, 17B, 17C, 17D, 18A, 18B, 18C, and 18D schematically illustrate the change in $D_{0-X}$ with respect to the change in $D_{1-X}$ and the change in $D_{0-Y}$ with respect to the change in $D_{1-Y}$. In these drawings, an outlined arrow indicates a linear change, and a black arrow indicates a nonlinear change. An arrow directed to the outside of the display panel indicates that the light beams that have passed through the optical path control unit 70 are divergent light beams, and an arrow directed to the inside of the display panel indicates that the light beams that have passed through the optical path control unit 70 are converged light beams or parallel light beams.

Alternatively, a design may be made such that the reference point P is set, and when a distance from the reference point P to the normal line LN passing through the center of the light emitting region is represented by $D_1$, a value of the distance $D_0$ increases as a value of the distance $D_1$ increases.

That is, the changes in $D_{0-X}$ and $D_{0-Y}$ depending on the changes in $D_{1-X}$ and $D_{1-Y}$ only need to be determined on the basis of specifications required for the display device.

An orthographic projection image of the optical path control unit 70 is included in an orthographic projection image of the wavelength selection unit $CF_R$, $CF_G$, $CF_B$. Note that these orthographic projection images are orthogonal projection images for the first substrate as described above. The outer shapes of the light emitting unit 30, the wavelength selection unit CF, and the optical path control unit 70 are circular for convenience, but are not limited to such shapes. Furthermore, in the light emitting element 10 in which a value of the distance $D_0$ is not zero, for example, as illustrated in FIG. 19B, the normal line LN" passing through the center of the wavelength selection unit $CF_R$, $CF_G$, $CF_B$ coincides with the normal line LN passing through the center of the light emitting region.

In a preferable form of the display device of Example 4, when a distance (offset amount) between the normal line LN passing through the center of the light emitting region and the normal line LN' passing through the center of the optical path control unit is represented by $D_0$, a value of the distance $D_0$ is not zero in at least some of the light emitting elements constituting the display device. Therefore, a traveling direction of light that has been emitted from the light emitting layer and has passed through the optical path control unit can be reliably and accurately controlled depending on the position of the light emitting element in the display device. That is, it is possible to reliably and accurately control to which region in an external space an image from the display device is emitted in what state. In addition, by disposing the optical path control unit, not only an increase in brightness (luminance) of an image emitted from the display device and prevention of color mixing between adjacent pixels can be achieved, but also light can appropriately diverge depending on a required viewing angle, and a longer lifetime and a higher luminance of each of the light emitting element and the display device can be achieved. Therefore, it is possible to achieve miniaturization, weight reduction, and high quality of the display device. In addition, applications to an eyewear, augmented reality (AR) glasses, and EVR are remarkably expanded.

Figure 14A:
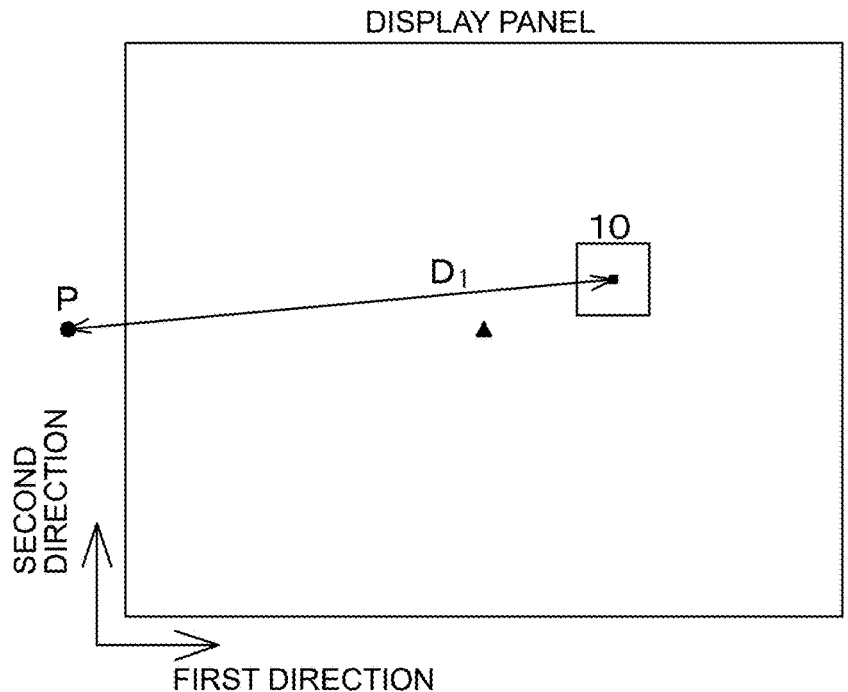
FIG. 14A is a diagram schematically illustrating a positional relationship between a light emitting element and a reference point in a modification of the display device of Example 4.
Figure 14B:
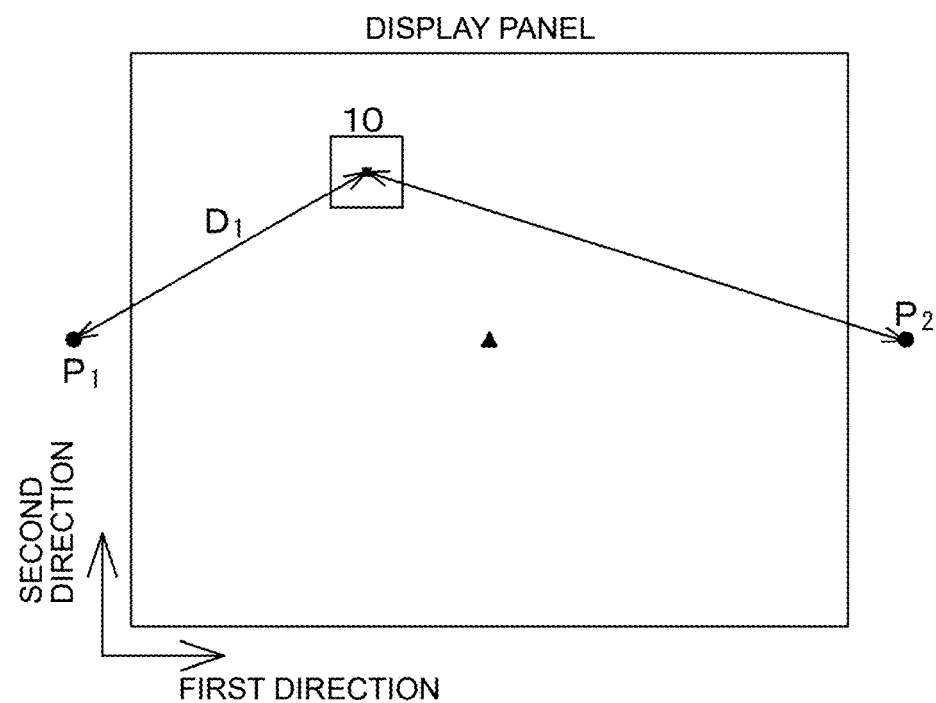
FIG. 14B is a diagram schematically illustrating a positional relationship between a light emitting element and a reference point in a modification of the display device of Example 4.
Figure 15A:
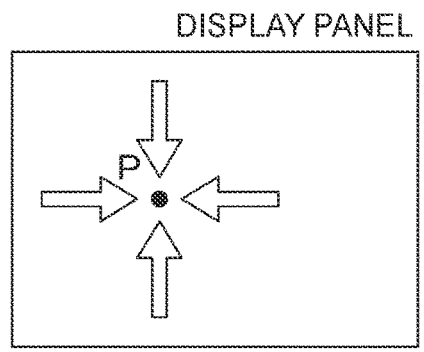
FIG. 15A is a diagram schematically illustrating a change in $D_{0-X}$ with respect to a change in $D_{1-X}$ and a change in $D_{0-Y}$ with respect to a change in $D_{1-Y}$ in the display device of Example 4.
Figure 15B:
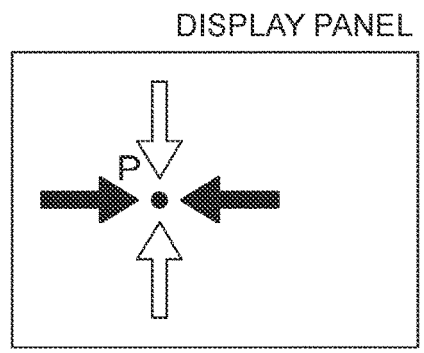
FIG. 15B is a diagram schematically illustrating a change in $D_{0-X}$ with respect to a change in $D_{1-X}$ and a change in $D_{0-Y}$ with respect to a change in $D_{1-Y}$ in the display device of Example 4.
Figure 15C:
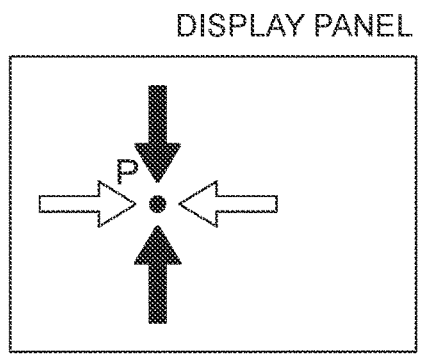
FIG. 15C is a diagram schematically illustrating a change in $D_{0-X}$ with respect to a change in $D_{1-X}$ and a change in $D_{0-Y}$ with respect to a change in $D_{1-Y}$ in the display device of Example 4.
Figure 15D:
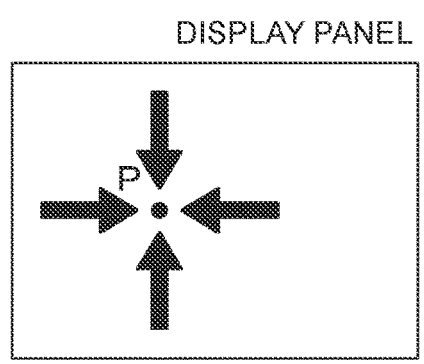
FIG. 15D is a diagram schematically illustrating a change in $D_{0-X}$ with respect to a change in $D_{1-X}$ and a change in $D_{1-Y}$ with respect to a change in $D_{1-Y}$ in the display device of Example 4.
Figure 16A:
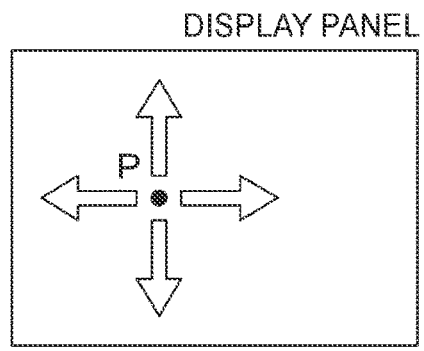
FIG. 16A is a diagram schematically illustrating a change in $D_{0-X}$ with respect to a change in $D_{1-X}$ and a change in $D_{0-Y}$ with respect to a change in $D_{1-Y}$ in the display device of Example 4.
Figure 16B:
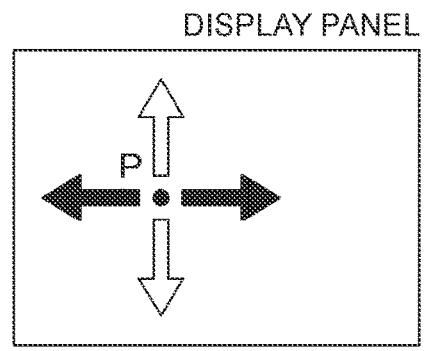
FIG. 16B is a diagram schematically illustrating a change in $D_{0-X}$ with respect to a change in $D_{1-X}$ and a change in $D_{0-Y}$ with respect to a change in $D_{1-Y}$ in the display device of Example 4.
Figure 16C:
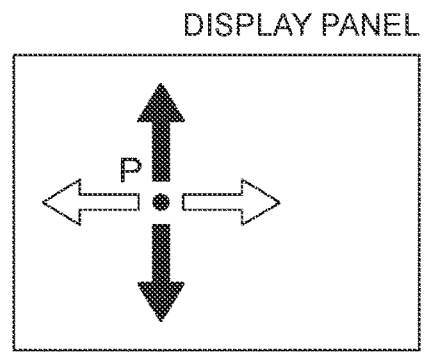
FIG. 16C is a diagram schematically illustrating a change in $D_{0-X}$ with respect to a change in $D_{1-X}$ and a change in $D_{0-Y}$ with respect to a change in $D_{1-Y}$ in the display device of Example 4.
Figure 16D:
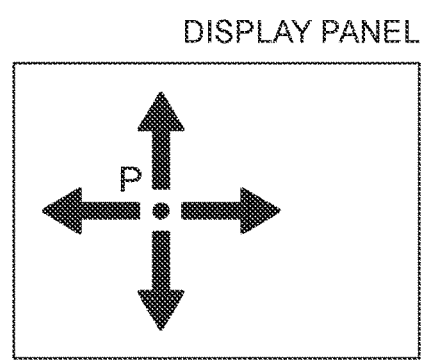
FIG. 16D is a diagram schematically illustrating a change in $D_{0-X}$ with respect to a change in $D_{1-X}$ and a change in $D_{0-Y}$ with respect to a change in $D_{1-Y}$ in the display device of Example 4.
Figure 17A:
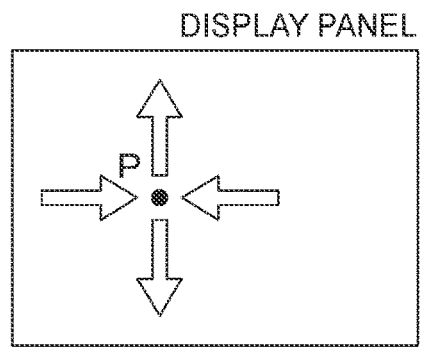
FIG. 17A is a diagram schematically illustrating a change in $D_{0-X}$ with respect to a change in $D_{1-X}$ and a change in $D_{0-Y}$ with respect to a change in $D_{1-Y}$ in the display device of Example 4.
Figure 17B:
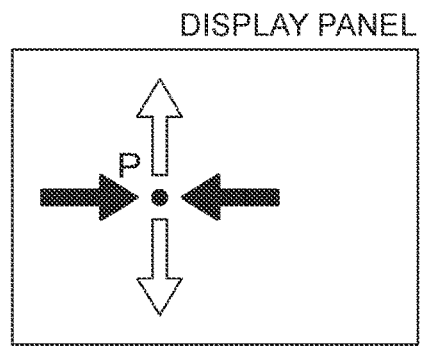
FIG. 17B is a diagram schematically illustrating a change in $D_{0-X}$ with respect to a change in $D_{1-X}$ and a change in $D_{0-Y}$ with respect to a change in $D_{1-Y}$ in the display device of Example 4.
Figure 17C:
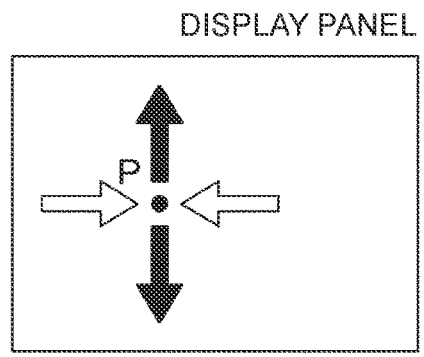
FIG. 17C is a diagram schematically illustrating a change in $D_{0-X}$ with respect to a change in $D_{1-X}$ and a change in $D_{0-Y}$ with respect to a change in $D_{1-Y}$ in the display device of Example 4.
Figure 17D:
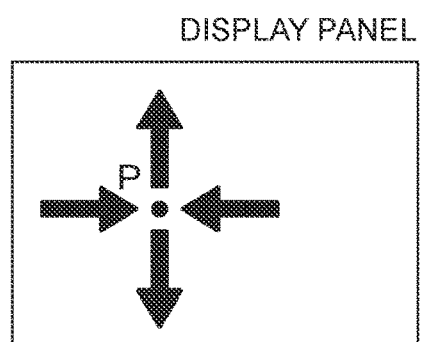
FIG. 17D is a diagram schematically illustrating a change in $D_{0-X}$ with respect to a change in $D_{1-X}$ and a change in $D_{0-Y}$ with respect to a change in $D_{1-Y}$ in the display device of Example 4.
Figure 18A:
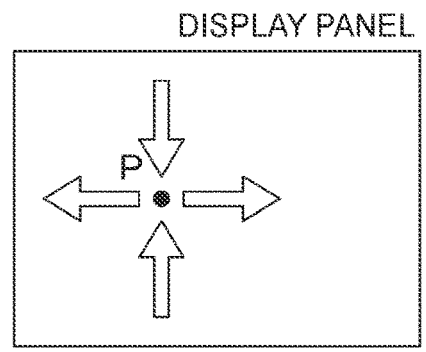
FIG. 18A is a diagram schematically illustrating a change in $D_{0-X}$ with respect to a change in $D_{1-X}$ and a change in $D_{0-Y}$ with respect to a change in $D_{1-Y}$ in the display device of Example 4.
Figure 18B:
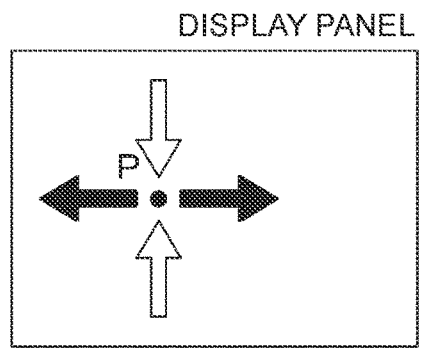
FIG. 18B is a diagram schematically illustrating a change in $D_{0-X}$ with respect to a change in $D_{1-X}$ and a change in $D_{0-Y}$ with respect to a change in $D_{1-Y}$ in the display device of Example 4.
Figure 18C:
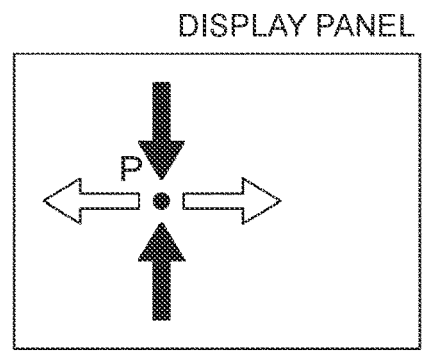
FIG. 18C is a diagram schematically illustrating a change in $D_{0-X}$ with respect to a change in $D_{1-X}$ and a change in $D_{0-Y}$ with respect to a change in $D_{1-Y}$ in the display device of Example 4.
Figure 18D:
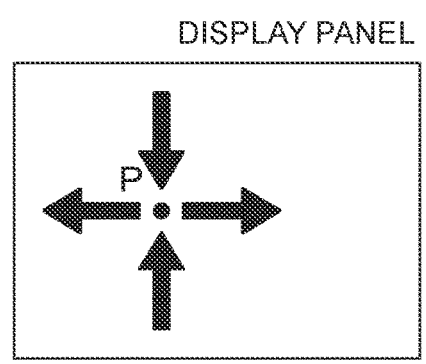
FIG. 18D is a diagram schematically illustrating a change in $D_{0-X}$ with respect to a change in $D_{1-X}$ and a change in $D_{0-Y}$ with respect to a change in $D_{1-Y}$ in the display device of Example 4.

Alternatively, in a modification of the display device of Example 4, the reference point P is assumed to be outside the display panel. FIGS. 14A and 14B schematically illustrate a positional relationship between the light emitting element 10 and the reference points P, $P_1$, and $P_2$. A configuration can be adopted in which one reference point P is assumed (see FIG. 14A), or a configuration can be adopted in which a plurality of reference points P (FIG. 14B illustrates two reference points $P_1$ and $P_2$) is assumed. With the center of the display panel as a symmetry point, the two reference points $P_1$ and $P_2$ are arranged in two-fold rotational symmetry. Here, at least one reference point P is not included in the center region of the display panel. In the illustrated example, the two reference points $P_1$ and $P_2$ are not included in the center region of the display panel. Values of the distance $D_0$ are zero in some of the light emitting elements (specifically, one or more light emitting elements included in the reference point P), and values of the distance $D_0$ are not zero in the remaining light emitting elements. Regarding the distance $D_1$ from the reference point P to the normal line LN passing through the center of the light emitting region, a distance from the normal line LN passing through the center of a certain light emitting region to a reference point P closer to the normal line LN is defined as the distance $D_1$. Alternatively, values of the distance $D_0$ are not zero in all the light emitting elements. Regarding the distance $D_1$ from the reference point P to the normal line LN passing through the center of the light emitting region, a distance from the normal line LN passing through the center of a certain light emitting region to a reference point P closer to the normal line LN is defined as the distance $D_1$. In these cases, light beams that have been emitted from the light emitting units 30 constituting the light emitting elements 10 and have passed through the optical path control unit 70 are converged (condensed) on a certain region of a space outside the display device. Alternatively, the light beams that have been emitted from the light emitting units 30 constituting the light emitting elements 10 and have passed through the optical path control unit 70 diverge in a space outside the display device.

Example 5

Example 5 is a modification of Examples 1 to 4.

In Example 5, an arrangement relationship of the light emitting region, the wavelength selection unit, and the optical path control unit will be described. Here, in a light emitting element in which a value of the distance $D_0$ is not zero,
 (a) a form in which the normal line LN" passing through the center of the wavelength selection unit coincides with the normal line LN passing through the center of the light emitting region,
 (b) a form in which the normal line LN" passing through the center of the wavelength selection unit coincides with the normal line LN' passing through the center of the optical path control unit, or
 (c) a form in which the normal line LN" passing through the center of the wavelength selection unit does not coincide with the normal line LN passing through the center of the light emitting region, and the normal line LN" passing through the center of the wavelength selection unit does not coincide with the normal line LN' passing through the center of the optical path control unit can be adopted. By adopting the configuration (b) or the latter of the configuration (c), occurrence of color mixing between adjacent light emitting elements can be reliably suppressed.

Here, the center of the wavelength selection unit refers to an area centroid point of a region occupied by the wavelength selection unit. Alternatively, when the planar shape of the wavelength selection unit is a circle, an ellipse, a square (including a square with rounded corners), a rectangle (including a rectangle with rounded corners), or a regular polygon (including a regular polygon with rounded corners), the center of each of these figures corresponds to the center of the wavelength selection unit. When the planar shape of the wavelength selection unit is a figure obtained by cutting out a part of each of these figures, the center of a figure complementing the cutout part corresponds to the center of the wavelength selection unit. When the planar shape of the wavelength selection unit is a figure obtained by connecting these figures, the center of a figure obtained by removing the connecting part and complementing the removed part corresponds to the center of the wavelength selection unit. The center of the optical path control unit refers to an area centroid point of a region occupied by the optical path control unit. Alternatively, when the planar shape of the optical path control unit is a circle, an ellipse, a square (including a square with rounded corners), a rectangle (including a rectangle with rounded corners), or a regular polygon (including a regular polygon with rounded corners), the center of each of these figures corresponds to the center of the optical path control unit.

Figure 19A:
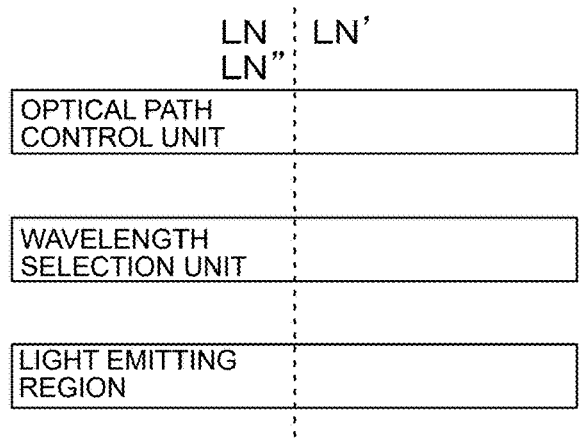
FIG. 19A is a conceptual diagram for explaining a relationship among a normal line LN passing through the center of a light emitting region, a normal line LN' passing through the center of an optical path control unit, and a normal line LN" passing through the center of a wavelength selection unit in a display device of Example 5.
Figure 19B:
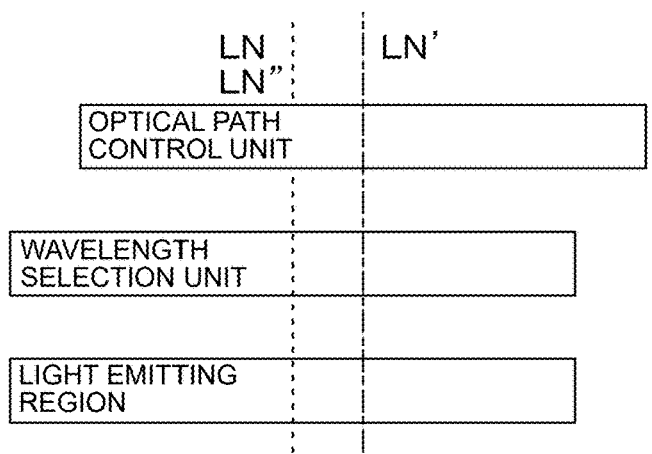
FIG. 19B is a conceptual diagram for explaining a relationship among a normal line LN passing through the center of a light emitting region, a normal line LN' passing through the center of an optical path control unit, and a normal line LN" passing through the center of a wavelength selection unit in the display device of Example 5.

As illustrated in the conceptual diagram of FIG. 19A, the normal line LN passing through the center of the light emitting region, the normal line LN" passing through the center of the wavelength selection unit, and the normal line LN' passing through the center of the optical path control unit 70 may coincide with each other. That is, $D_0=d_0=0$ is satisfied. Note that, as described above, $d_0$ represents a distance (offset amount) between the normal line LN passing through the center of the light emitting region and the normal line LN" passing through the center of the wavelength selection unit.

For example, when one pixel is constituted by three sub-pixels, each of values of $d_0$ and $D_0$ may be the same value in three sub-pixels constituting one pixel, may be the same value in two sub-pixels except for one sub-pixel, or may be different values among three sub-pixels.

As illustrated in the conceptual diagram of FIG. 19B, in some cases, the normal line LN passing through the center of the light emitting region coincides with the normal line LN" passing through the center of the wavelength selection unit, but the normal line LN passing through the center of the light emitting region and the normal line LN" passing through the center of the wavelength selection unit do not coincide with the normal line LN' passing through the center of the optical path control unit 70. That is, $D_0 \neq d_0=0$ is satisfied.

Figure 19C:
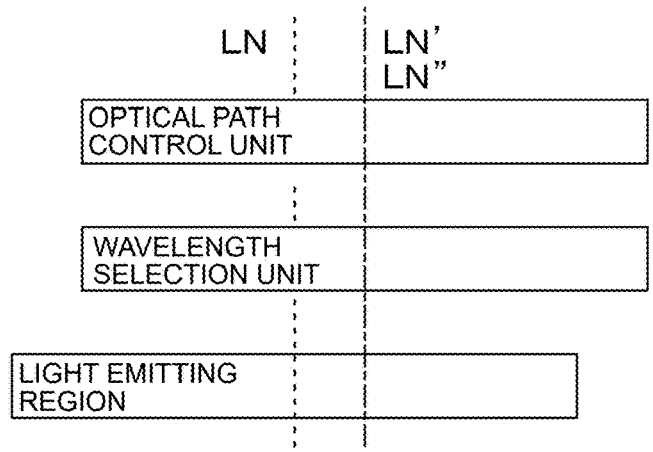
FIG. 19C is a conceptual diagram for explaining a relationship among a normal line LN passing through the center of a light emitting region, a normal line LN' passing through the center of an optical path control unit, and a normal line LN" passing through the center of a wavelength selection unit in the display device of Example 5.

Furthermore, as illustrated in the conceptual diagram of FIG. 19C, in some cases, the normal line LN passing through the center of the light emitting region does not coincide with the normal line LN" passing through the center of the wavelength selection unit and the normal line LN' passing through the center of the optical path control unit 70, and the normal line LN" passing through the center of the wavelength selection unit coincides with the normal line LN' passing through the center of the optical path control unit 70. That is, $D_0=d_0>0$ is satisfied.

Figure 20:
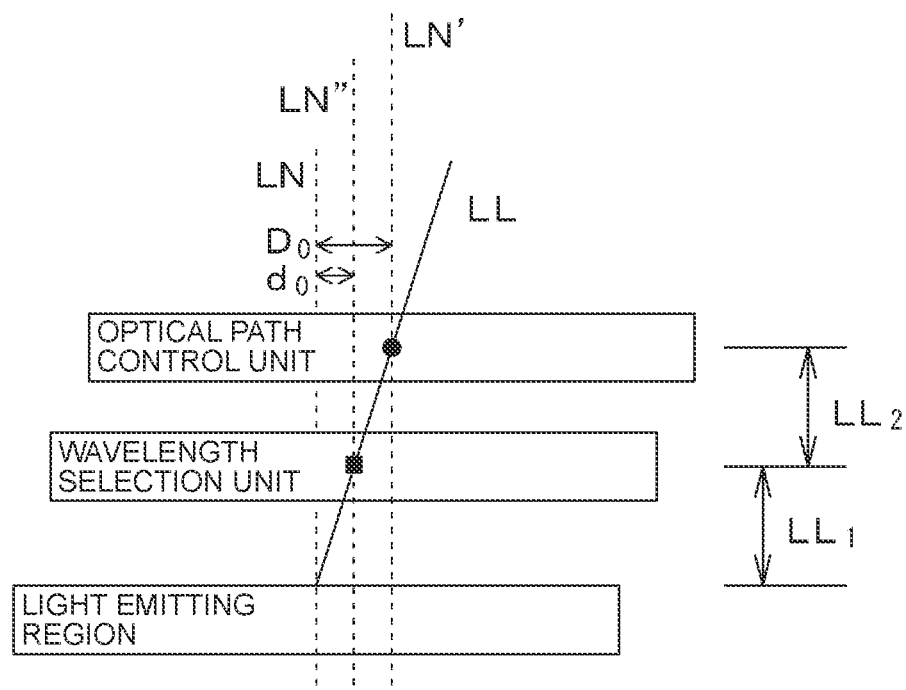
FIG. 20 is a conceptual diagram for explaining a relationship among a normal line LN passing through the center of a light emitting region, a normal line LN' passing through the center of an optical path control unit, and a normal line LN" passing through the center of a wavelength selection unit in the display device of Example 5.

In addition, as illustrated in the conceptual diagram of FIG. 20, in some cases, the normal line LN passing through the center of the light emitting region does not coincide with the normal line LN" passing through the center of the wavelength selection unit and the normal line LN' passing through the center of the optical path control unit 70, and the normal line LN' passing through the center of the optical path control unit 70 does not coincide with the normal line LN passing through the center of the light emitting region and the normal line LN" passing through the center of the wavelength selection unit. Here, the center of the wavelength selection unit (indicated by a black square in FIG. 20) is preferably located on a straight line LL connecting the center of the light emitting region and the center of the optical path control unit 70 (indicated by a black circle in FIG. 20). Specifically, when a distance from the center of the light emitting region to the center of the wavelength selection unit in the thickness direction is represented by $LL_1$, and a distance from the center of the wavelength selection unit to the center of the optical path control unit 70 in the thickness direction is represented by $LL_2$, $D_0>d_0>0$ is satisfied, and considering manufacturing variation, $d_0:D_0=LL_1:(LL_1+LL_2)$ is preferably satisfied.

Figure 21A:
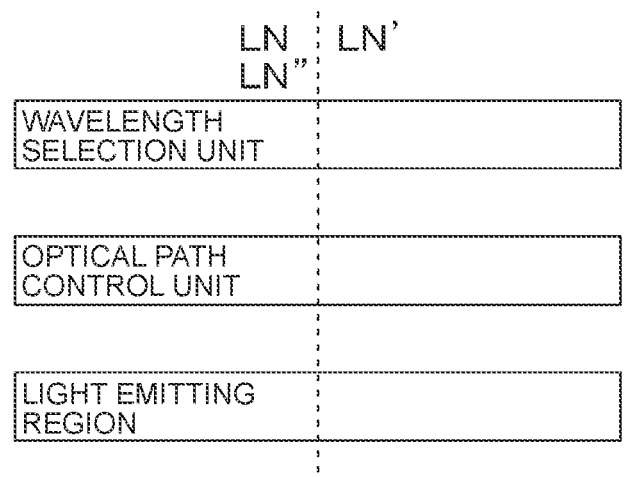
FIG. 21A is a conceptual diagram for explaining a relationship among a normal line LN passing through the center of a light emitting region, a normal line LN' passing through the center of an optical path control unit, and a normal line LN" passing through the center of a wavelength selection unit in the display device of Example 5.

Alternatively, as illustrated in the conceptual diagram of FIG. 21A, the normal line LN passing through the center of the light emitting region, the normal line LN" passing through the center of the wavelength selection unit, and the normal line LN' passing through the center of the optical path control unit 70 may coincide with each other. That is, $D_0=d_0=0$ is satisfied.

Figure 21B:
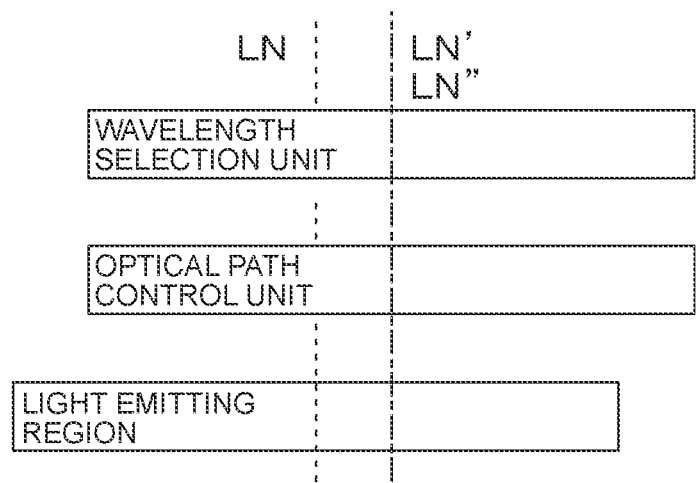
FIG. 21B is a conceptual diagram for explaining a relationship among a normal line LN passing through the center of a light emitting region, a normal line LN' passing through the center of an optical path control unit, and a normal line LN" passing through the center of a wavelength selection unit in the display device of Example 5.

In addition, as illustrated in the conceptual diagram of FIG. 21B, in some cases, the normal line LN passing through the center of the light emitting region does not coincide with the normal line LN" passing through the center of the wavelength selection unit and the normal line LN' passing through the center of the optical path control unit 70, and the normal line LN" passing through the center of the wavelength selection unit coincides with the normal line LN' passing through the center of the optical path control unit 70. That is, $D_0=d_0>0$ is satisfied.

Figure 22:
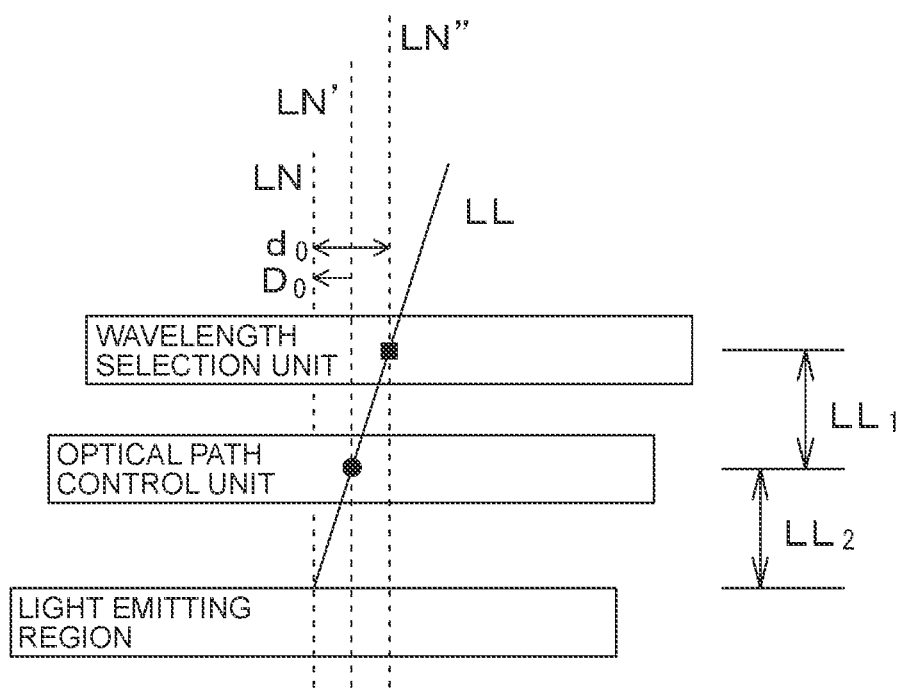
FIG. 22 is a conceptual diagram for explaining a relationship among a normal line LN passing through the center of a light emitting region, a normal line LN' passing through the center of an optical path control unit, and a normal line LN" passing through the center of a wavelength selection unit in the display device of Example 5.

Furthermore, as illustrated in the conceptual diagram of FIG. 22, in some cases, the normal line LN passing through the center of the light emitting region does not coincide with the normal line LN" passing through the center of the wavelength selection unit and the normal line LN' passing through the center of the optical path control unit 70, and the normal line LN' passing through the center of the optical path control unit 70 does not coincide with the normal line LN passing through the center of the light emitting region and the normal line LN" passing through the center of the wavelength selection unit. Here, the center of the wavelength selection unit is preferably located on a straight line LL connecting the center of the light emitting region and the center of the optical path control unit 70. Specifically, when a distance from the center of the light emitting region to the center of the wavelength selection unit (indicated by a black square in FIG. 22) in the thickness direction is represented by $LL_1$, and a distance from the center of the wavelength selection unit to the center of the optical path control unit 70 (indicated by a black circle in FIG. 22) in the thickness direction is represented by $LL_2$, $d_0>D_0>0$ is satisfied, and considering manufacturing variation, $D_0:d_0=LL_2:(LL_1+LL_2)$ is preferably satisfied.

Example 6

Example 6 is a modification of Examples 1 to 5, and a display device of Example 6 also has a resonator structure. That is, the organic EL display device preferably has a resonator structure in order to further improve light extraction efficiency. When the resonator structure is disposed, as described above, the resonator structure may be a resonator structure in which the organic layer 33 serves as a resonance unit and is sandwiched between the first electrode 31 and the second electrode 32. Alternatively, as described in Example 6, the resonator structure may be a resonator structure in which a light reflecting layer 35 is formed below the first electrode 31 (on the first substrate 61 side), an interlayer insulating material layer 36 is formed between the first electrode 31 and the light reflecting layer 35, and the organic layer 33 and the interlayer insulating material layer 36 serve as resonance units and are sandwiched between the light reflecting layer 35 and the second electrode 32. That is, when the light reflecting layer 35 is formed on the base 26, the interlayer insulating material layer 36 is formed on the light reflecting layer 35, and the first electrode 31 is disposed on the interlayer insulating material layer 36, the first electrode 31 and the interlayer insulating material layer 36 only need to be made of the above-described materials. The light reflecting layer 35 may be connected to a contact hole (contact plug) 27 or does not have to be connected thereto.

Specifically, light emitted from the light emitting layer is caused to resonate between a first interface constituted by an interface between the first electrode and the organic layer (or a first interface constituted by an interface between the light reflecting layer and the interlayer insulating material layer in a structure in which the interlayer insulating material layer is formed under the first electrode and the light reflecting layer is formed under the interlayer insulating material layer) and a second interface constituted by an interface between the second electrode and the organic layer, and a part of the light is emitted from the second electrode. When an optical distance from a maximum light emitting position of the light emitting layer to the first interface is represented by $OL_1$, an optical distance from the maximum light emitting position of the light emitting layer to the second interface is represented by $OL_2$, and $m_1$ and $m_2$ are integers, a configuration satisfying the following formulas (1-1) and (1-2) can be adopted.

$$0.7\{-\Phi_1/(2\pi)+m_1\}\leq 2\times OL_1/\lambda \leq 1.2\{-\Phi_1/(2\pi)+m_1\} \quad (1\text{-}1)$$

$$0.7\{-\Phi_2/(2\pi)+m_2\}\leq 2\times OL_2/\lambda \leq 1.2\{-\Phi_2/(2\pi)+m_2\} \quad (1\text{-}2)$$

in which

λ: maximum peak wavelength of spectrum of light generated in light emitting layer (or desired wavelength of light generated in light emitting layer)

$\Phi_1$: phase shift amount (unit: radian) of light reflected at first interface in which $-2\pi<\Phi_1\leq 0$ is satisfied.

$\Phi_2$: phase shift amount (unit: radian) of light reflected at second interface in which $-2\pi<\Phi_2\leq 0$ is satisfied.

Here, a value of $m_1$ is a value of 0 or more, and a value of $m_2$ is a value of 0 or more independently of the value of $m_1$. A form of $(m_1, m_2)=(0, 0)$, a form of $(m_1, m_2)=(0, 1)$, a form of $(m_1, m_2)=(1, 0)$, and a form of $(m_1, m_2)=(1, 1)$ can be exemplified.

A distance $PL_1$ from the maximum light emitting position of the light emitting layer to the first interface refers to an actual distance (physical distance) from the maximum light emitting position of the light emitting layer to the first interface, and a distance $PL_2$ from the maximum light emitting position of the light emitting layer to the second interface refers to an actual distance (physical distance) from the maximum light emitting position of the light emitting layer to the second interface. The optical distance is also referred to as an optical path length, and generally refers to n×L when a light beam passes through a medium having a refractive index n by a distance L. The same applies to the following. Therefore, when an average refractive index is represented by $n_{ave}$, $OL_1=PL_1\times n_{ave}$ and $OL_2=PL_2\times n_{ave}$ are satisfied. Here, the average refractive index $n_{ave}$ is obtained by summing up a product of a refractive index and a thickness of each layer constituting the organic layer (or the organic layer, the first electrode, and the interlayer insulating material layer) and dividing the sum by the thickness of the organic layer (or the organic layer, the first electrode, and the interlayer insulating material layer).

It is only required to design the light emitting element by determining a desired wavelength λ of light generated in the light emitting layer (specifically, for example, a red wavelength, a green wavelength, and a blue wavelength) and determining various parameters such as $OL_1$ and $OL_2$ in the light emitting element on the basis of formulas (1-1) and (1-2).

The first electrode or the light reflecting layer and the second electrode absorb a part of incident light and reflect the remaining light. Therefore, a phase shift occurs in reflected light. The phase shift amounts $\Phi_1$ and $\Phi_2$ can be determined by measuring values of a real number part and an imaginary number part of a complex refractive index of a material constituting the first electrode or the light reflecting layer and the second electrode using, for example, an ellipsometer and performing calculation based on these values (see, for example, "Principles of Optic", Max Born and Emil Wolf, 1974 (PERGAMON PRESS)). A refractive index of the organic layer, the interlayer insulating material layer, or the like, a refractive index of the first electrode, or a refractive index of the first electrode in a case where the first electrode absorbs a part of incident light and reflects the remaining light can also be determined by measurement using an ellipsometer.

Examples of a material constituting the light reflecting layer include aluminum, an aluminum alloy (for example, Al—Nd or Al—Cu), an Al/Ti laminated structure, an Al—Cu/Ti laminated structure, chromium (Cr), silver (Ag), and a silver alloy (for example, Ag—Cu, Ag—Pd—Cu, or Ag—Sm—Cu). The light reflecting layer can be formed by, for example, a vapor deposition method including an electron beam vapor deposition method, a hot filament vapor deposition method, and a vacuum vapor deposition method, a sputtering method, a CVD method, or an ion plating method; a plating method (electroplating method or electroless plating method); a lift-off method; a laser ablation method; or a sol-gel method. Depending on a material constituting the light reflecting layer, it is preferable to form a base layer, for example, made of TiN in order to control a crystalline state of the light reflecting layer to be formed.

As described above, in the organic EL display device having a resonator structure, actually, a red light emitting element constituted by an organic layer that emits white light [in some cases, a red light emitting element constituted by combining an organic layer that emits white light and a red color filter layer (or an intermediate layer that functions as a red color filter layer)] causes red light emitted from the light emitting layer to resonate, and emits reddish light (light having a light spectrum peak in a red region) from the second electrode. In addition, a green light emitting element constituted by an organic layer that emits white light [in some cases, a green light emitting element constituted by combining an organic layer that emits white light and a green color filter layer (or an intermediate layer that functions as a green color filter layer)] causes green light emitted from the light emitting layer to resonate, and emits greenish light (light having a light spectrum peak in a green region) from the second electrode. Furthermore, a blue light emitting element constituted by an organic layer that emits white light [in some cases, a blue light emitting element constituted by combining an organic layer that emits white light and a blue color filter layer (or an intermediate layer that functions as a blue color filter layer)] causes blue light emitted from the light emitting layer to resonate, and emits blueish light (light having a light spectrum peak in a blue region) from the second electrode. That is, it is only required to design each of the light emitting elements by determining a desired wavelength $\lambda$ of light generated in the light emitting layer (specifically, a red wavelength, a green wavelength, and a blue wavelength) and determining various parameters such as $OL_1$ and $OL_2$ in each of the red light emitting element, the green light emitting element, and the blue light emitting element on the basis of formulas (1-1) and (1-2). For example, JP 2012-216495 A discloses, at paragraph [0041], an organic EL element having a resonator structure in which an organic layer serves as a resonance unit, and describes that the film thickness of the organic layer is preferably 80 nm or more and 500 nm or less, and more preferably 150 nm or more and 350 nm or less because a distance from a light emitting point (light emitting surface) to a reflecting surface can be appropriately adjusted. Usually, a value of $(PL_1+PL_2=PL_{12})$ is different among the red light emitting element, the green light emitting element, and the blue light emitting element.

Figure 25A:
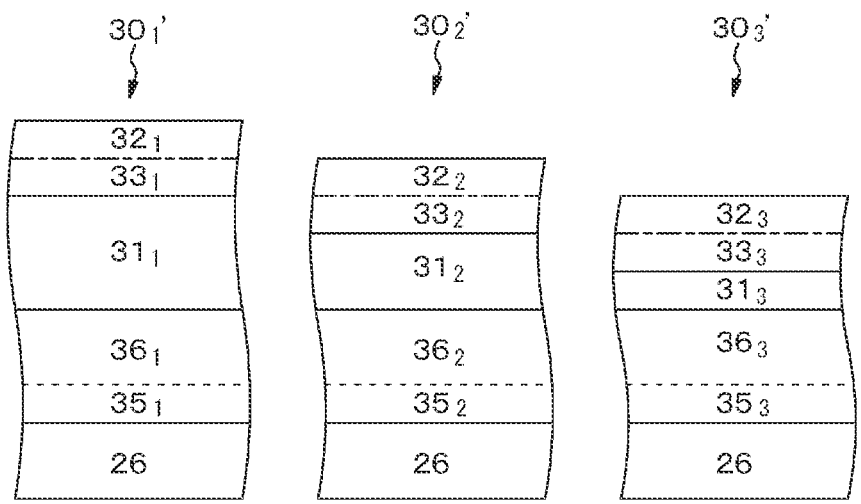
FIG. 25A is a conceptual diagram of a light emitting element of a fifth example having a resonator structure in the display device of Example 6.
Figure 25B:
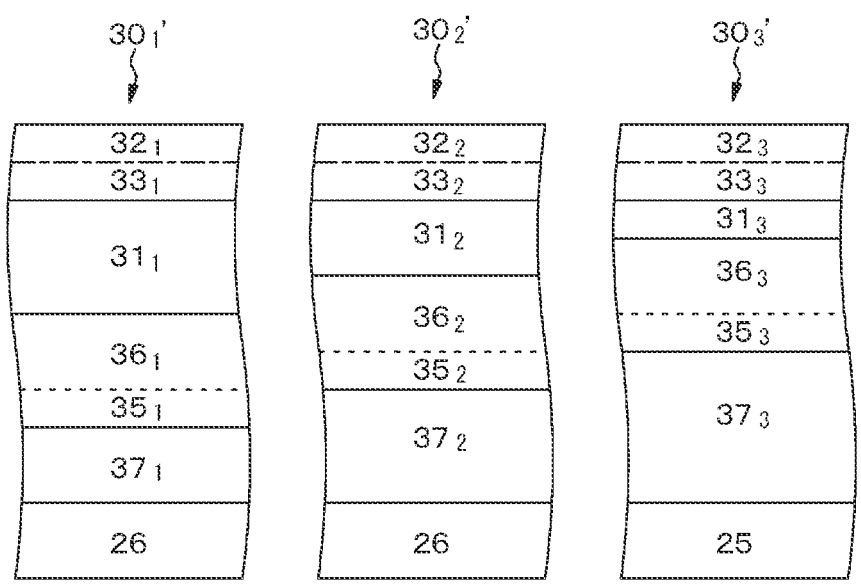
FIG. 25B is a conceptual diagram of a light emitting element of a sixth example having a resonator structure in the display device of Example 6.
Figure 26A:
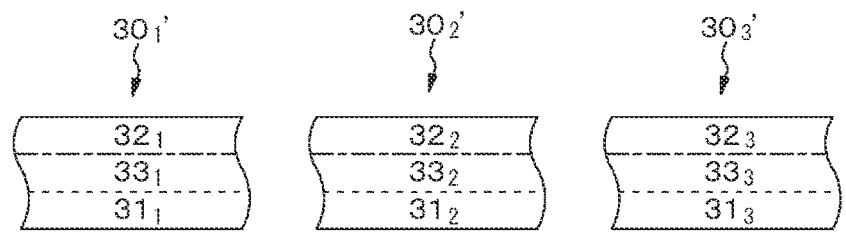
FIG. 26A is a conceptual diagram of a light emitting element of a seventh example having a resonator structure in the display device of Example 6.
Figure 26B:
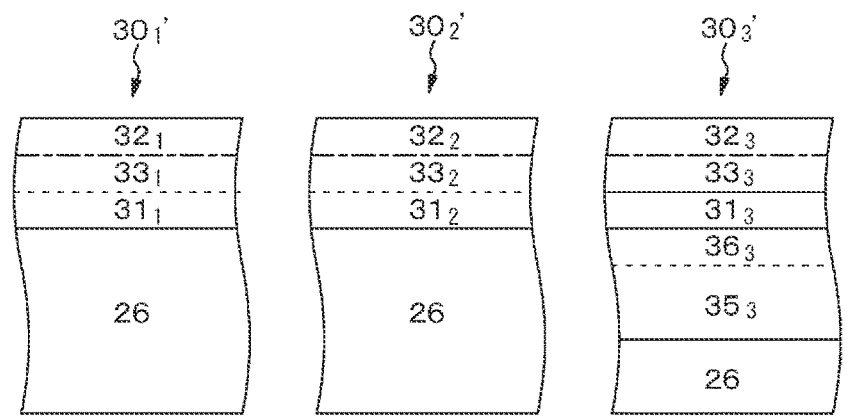
FIG. 26B is a conceptual diagram of a light emitting element of an eighth example having a resonator structure.
Figure 26C:
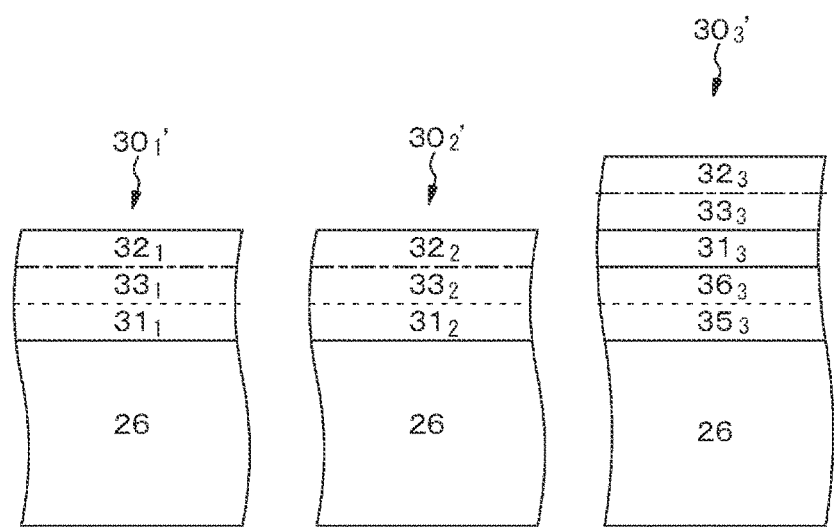
FIG. 26C is a conceptual diagram of a light emitting element of the eighth example having a resonator structure.

Hereinafter, the resonator structure will be described on the basis of first to eighth examples with reference to FIG. 23A (first example), FIG. 23B (second example), FIG. 24A (third example), FIG. 24B (fourth example), FIG. 25A (fifth example), FIG. 25B (sixth example), FIG. 26A (seventh example), and FIGS. 26B and 26C (eighth example). Here, in the first to fourth examples and the seventh example, the thickness of each of the first electrode and the second electrode is the same in the light emitting regions. Meanwhile, in the fifth and sixth examples, the thickness of the first electrode is different among the light emitting regions, and the thickness of the second electrode is the same in the light emitting regions. In the eighth example, the thickness of the first electrode may be different among the light emitting regions or the same in the light emitting regions, and the thickness of the second electrode is the same in the light emitting regions.

Note that, in the following description, the light emitting regions constituting the first light emitting element 10R, the second light emitting element 10G, and the third light emitting element 10B are represented by reference numerals $30_1'$, $30_2'$, and $30_3'$, the first electrodes are represented by reference numerals $31_1$, $31_2$, and $31_3$, the second electrodes are represented by reference numerals $32_1$, $32_2$, and $32_3$, the organic layers are represented by reference numerals $33_1$, $33_2$, and $33_3$, the light reflecting layers are represented by reference numerals $35_1$, $35_2$, and $35_3$, the interlayer insulating material layers are represented by reference numerals $36_1$, $36_2$, $36_3$, $36_1'$, $36_2'$, and $36_3'$, and the base films are represented by reference numerals $37_1$, $37_2$, and $37_3$. In the following description, materials used are examples, and can be changed appropriately.

Each of the first light emitting element 10R, the second light emitting element 10G, and the third light emitting element 10B may include the wavelength selection unit, each of two light emitting elements excluding one light emitting element may include the wavelength selection unit, or each of the three light emitting elements may include no wavelength selection unit.

In the illustrated examples, resonator lengths of the first light emitting element 10R, the second light emitting element 10G, and the third light emitting element 10B derived from formulas (1-1) and (1-2) are shortened in the order of the first light emitting element 10R, the second light emitting element 10G, and the third light emitting element 10B. That is, a value of $PL_{12}$ is shortened in the order of the first light emitting element 10R, the second light emitting element 10G, and the third light emitting element 10B. However, the resonator lengths are not limited thereto, and it is only required to determine an optimum resonator length by appropriately setting values of $m_1$ and $m_2$.

Figure 23A:
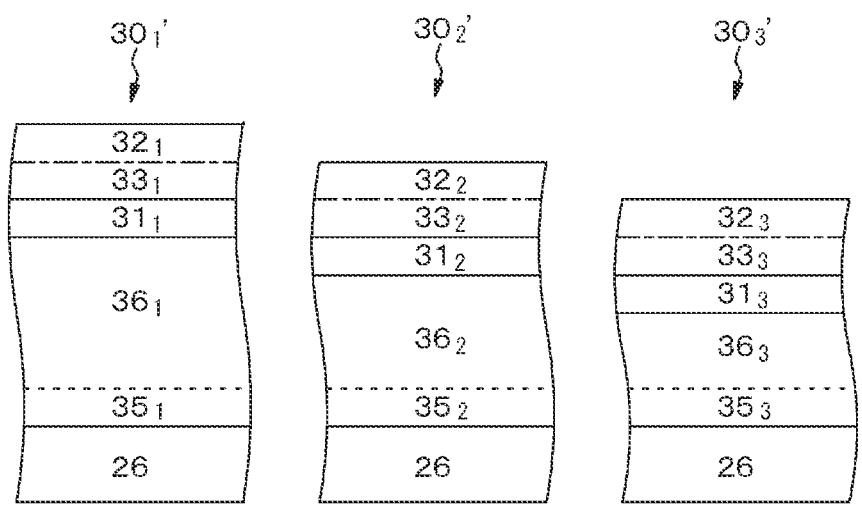
FIG. 23A is a conceptual diagram of a light emitting element of a first example having a resonator structure in a display device of Example 6.
Figure 23B:
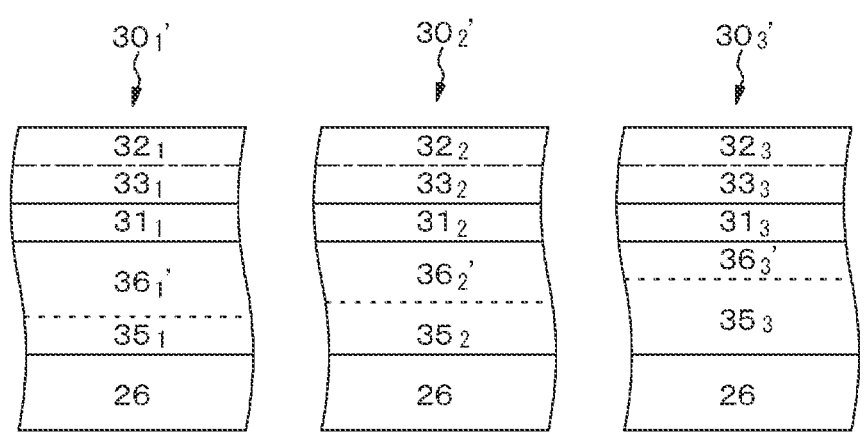
FIG. 23B is a conceptual diagram of a light emitting element of a second example having a resonator structure in the display device of Example 6.
Figure 24A:
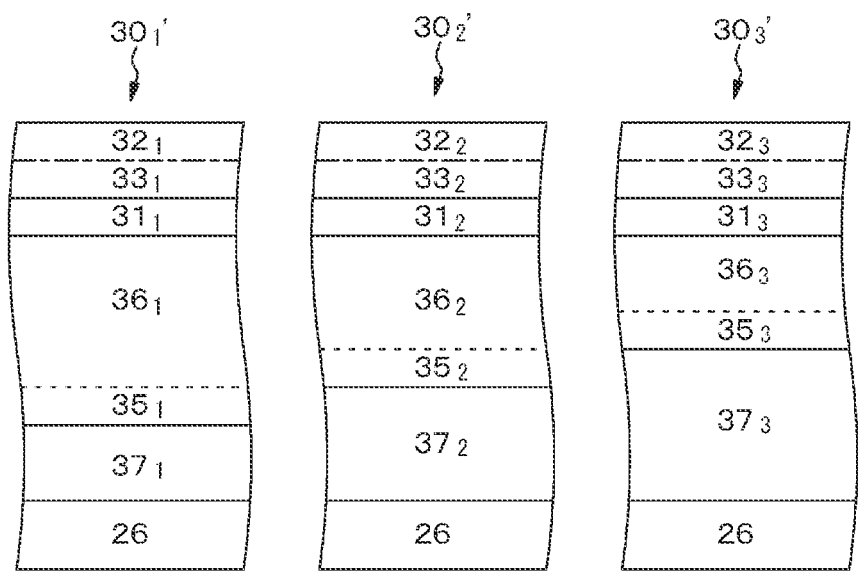
FIG. 24A is a conceptual diagram of a light emitting element of a third example having a resonator structure in the display device of Example 6.
Figure 24B:
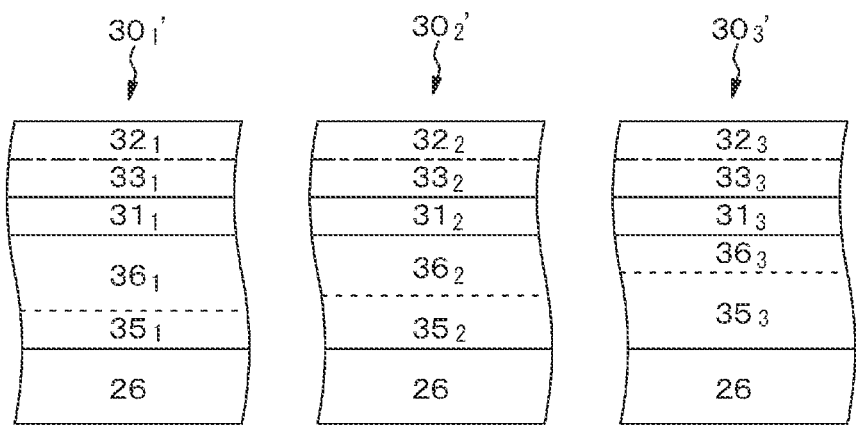
FIG. 24B is a conceptual diagram of a light emitting element of a fourth example having a resonator structure in the display device of Example 6.

FIG. 23A illustrates a conceptual diagram of a light emitting element having the first example of the resonator structure, FIG. 23B illustrates a conceptual diagram of a light emitting element having the second example of the resonator structure, FIG. 24A illustrates a conceptual diagram of a light emitting element having the third example of the resonator structure, and FIG. 24B illustrates a conceptual diagram of a light emitting element having the fourth example of the resonator structure. In the first to sixth examples and a part of the eighth example, the interlayer insulating material layer $36$, $36'$ is formed under the first electrode $31$ of the light emitting region $30'$, and the light reflecting layer $35$ is formed under the interlayer insulating material layer $36$, $36'$. In the first to fourth examples, the thickness of the interlayer insulating material layer $36$, $36'$ is different among the light emitting regions $30_1'$, $30_2'$, and $30_3'$. By appropriately setting the thickness of the interlayer insulating material layer $36_1$, $36_2$, $36_3$, $36_1'$, $36_2'$, $36_3'$, it is possible to set an optical distance at which optimum resonance is generated with respect to a light emission wavelength of the light emitting region $30'$.

In the first example, the first interface (indicated by a dotted line in the drawing) is at the same level in the light emitting regions $30_1'$, $30_2'$, and $30_3'$, while the level of the second interface (indicated by an alternate long and short dash line in the drawing) is different among the light emitting regions $30_1'$, $30_2'$, and $30_3'$. In the second example, the level of the first interface is different among the light emitting regions $30_1'$, $30_2'$, and $30_3'$, while the level of the second interface is the same in the light emitting regions $30_1'$, $30_2'$, and $30_3'$.

In the second example, the interlayer insulating material layer $36_1'$, $36_2'$, $36_3'$ is made of an oxide film in which a surface of the light reflecting layer $35$ is oxidized. The interlayer insulating material layer $36'$ made of an oxide film is made of, for example, aluminum oxide, tantalum oxide, titanium oxide, magnesium oxide, or zirconium oxide depending on a material constituting the light reflecting layer $35$. The surface of the light reflecting layer $35$ can be oxidized by, for example, the following method. That is, the first substrate $61$ in which the light reflecting layer $35$ is formed is immersed in an electrolytic solution filled in a container. A cathode is disposed so as to face the light reflecting layer $35$. Then, the light reflecting layer $35$ is anodized using the light reflecting layer $35$ as an anode. The film thickness of an oxide film due to anodization is proportional to a potential difference between the light reflecting layer $35$ as an anode and a cathode. Therefore, anodization is performed in a state where voltages corresponding to the light emitting regions $30_1'$, $30_2'$, and $30_3'$ are applied to the light reflecting layers $35_1$, $35_2$, and $35_3$ respectively. As a result, the interlayer insulating material layers $36_1'$, $36_2'$, and $36_3'$ made of oxide films having different thicknesses can be collectively formed on the surface of the light reflecting layer $35$. The thicknesses of the light reflecting layers $35_1$, $35_2$, and $35_3$ and the thicknesses of the interlayer insulating material layers $36_1'$, $36_2'$, and $36_3'$ are different among the light emitting regions $30_1'$, $30_2'$, and $30_3'$.

In the third example, the base film $37$ is formed under the light reflecting layer $35$, and the thickness of the base film $37$ is different among the light emitting regions $30_1'$, $30_2'$, and $30_3'$. That is, in the illustrated example, the thickness of the base film $37$ increases in the order of the light emitting region $30_1'$, the light emitting region $30_2'$, and the light emitting region $30_3'$.

In the fourth example, the thickness of the light reflecting layer $35_1$, $35_2$, $35_3$ at the time of film formation is different among the light emitting regions $30_1'$, $30_2'$, and $30_3'$. In the third and fourth examples, the level of the second interface is the same in the light emitting regions $30_1'$, $30_2'$, and $30_3'$, while the level of the first interface is different among the light emitting regions $30_1'$, $30_2'$, and $30_3'$.

In the fifth and sixth examples, the thickness of the first electrode $31_1$, $31_2$, $31_3$ is different among the light emitting regions $30_1'$, $30_2'$, and $30_3'$. The thickness of the light reflecting layer $35$ is the same in the light emitting regions $30'$.

In the fifth example, the level of the first interface is the same in the light emitting regions $30_1'$, $30_2'$, and $30_3'$, while the level of the second interface is different in the light emitting regions $30_1'$, $30_2'$, and $30_3'$.

In the sixth example, the base film $37$ is formed under the light reflecting layer $35$, and the thickness of the base film $37$ is different among the light emitting regions $30_1'$, $30_2'$, and $30_3'$. That is, in the illustrated example, the thickness of the base film $37$ increases in the order of the light emitting region $30_1'$, the light emitting region $30_2'$, and the light emitting region $30_3'$. In the sixth example, the level of the second interface is the same in the light emitting regions $30_1$, $30_2'$, and $30_3'$, while the level of the first interface is different among the light emitting regions $30_1'$, $30_2'$, and $30_3'$.

In the seventh example, the first electrode $31_1$, $31_2$, $31_3$ also serves as a light reflecting layer, and an optical constant (specifically, a phase shift amount) of a material constituting the first electrode $31_1$, $31_2$, $31_3$ is different among the light emitting regions $30_1'$, $30_2'$, and $30_3'$. For example, the first electrode $31_1$ in the light emitting region $30_1'$ only needs to be made of copper (Cu), and the first electrode $31_2$ in the light emitting region $30_2'$ and the first electrode $31_3$ in the light emitting region $30_3'$ only need to be made of aluminum (Al).

In the eighth example, the first electrode $31_1$, $31_2$ also serves as a light reflecting layer, and an optical constant (specifically, a phase shift amount) of a material constituting the first electrode $31_1$, $31_2$ is different between the light emitting regions $30_1'$ and $30_2'$. For example, the first electrode $31_1$ in the light emitting region $30_1'$ only needs to be made of copper (Cu), and the first electrode $31_2$ in the light emitting region $30_2'$ and the first electrode $31_3$ in the light emitting region $30_3'$ only need to be made of aluminum (Al). In the eighth example, for example, the seventh example is applied to the light emitting regions $30_1'$ and $30_2'$, and the first example is applied to the light emitting region $30_3'$. The thicknesses of the first electrodes $31_1$, $31_2$, and $31_3$ may be different from or the same as each other.

Although the present disclosure has been described above on the basis of preferable Examples, the present disclosure is not limited to these Examples. The configurations and configurations of structures of the display device (organic EL display device) and the light emitting element (organic EL element) described in Examples are examples and can be appropriately changed, and the method for manufacturing the display device is also an example and can be appropriately changed. In Examples, the drive circuit (light emitting element driving unit) is constituted by a MOSFET, but may be constituted by a TFT. The first electrode and the second electrode may each have a single-layer structure or a multilayer structure. In Examples, the display device that emits light of three colors is constituted, but a display device that emits light of four colors or more can be used, a display device that emits light of three colors and white light can be used, or a display device that emits light of two colors (for example, red and green) can be used.

Figure 27:
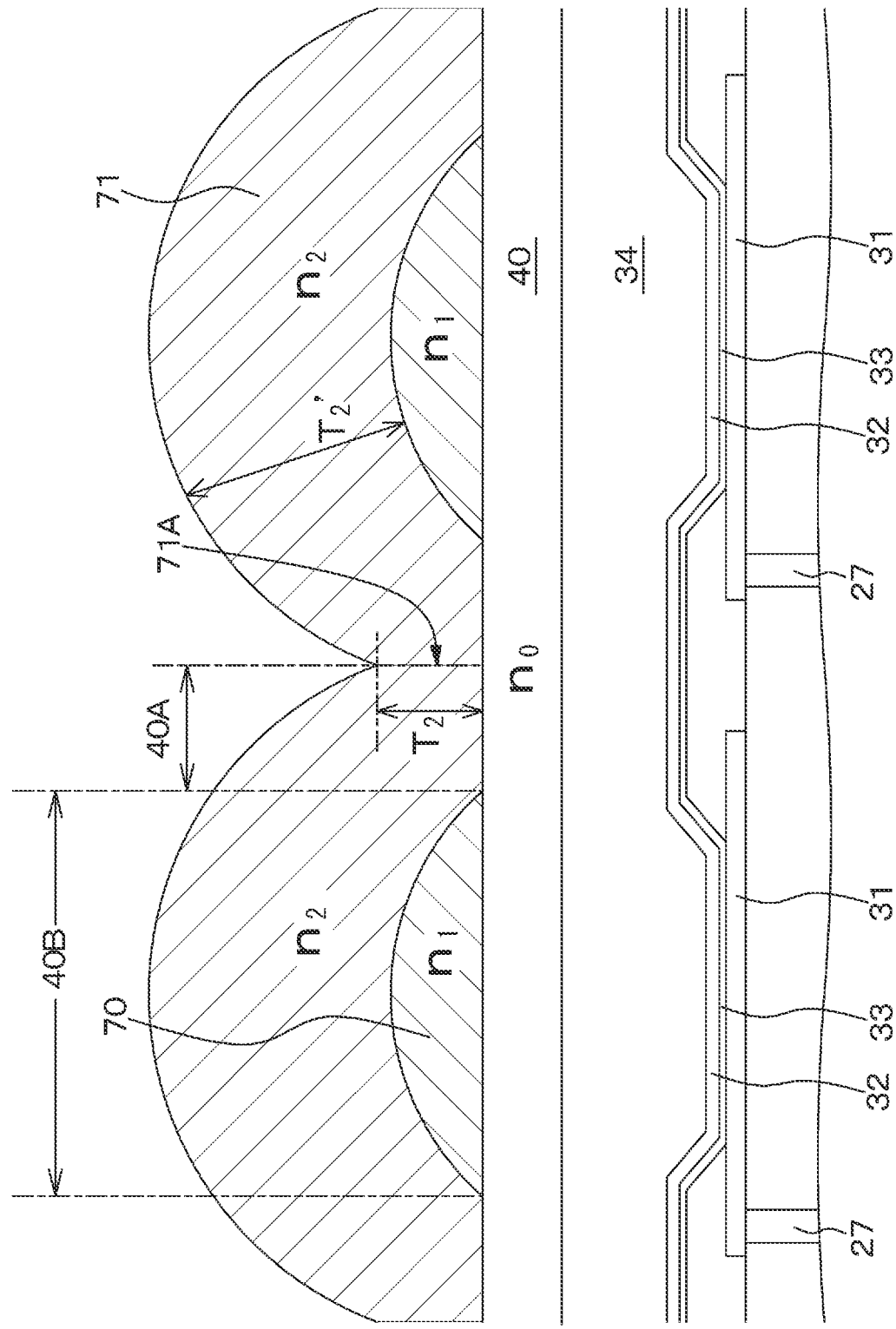
FIG. 27 is a schematic partial cross-sectional view of Modification-5 of the light emitting element and the display device of Example 1.

In Examples, the thickness $T_2'$ of a part of the covering layer on the optical path control unit is constant, but is not limited thereto, and as illustrated in a schematic partial cross-sectional view of FIG. 27, the thickness $T_2'$ of a part of the covering layer 71, 73, 75 on the optical path control unit 70, 72, 74 may be changed. Specifically, a form can be adopted in which the thickness $T_2'$ of the covering layer 71, 73, 75 is increased as it goes closer to the center of the optical path control unit 70, 72, 74.

Alternatively, as illustrated in a schematic partial cross-sectional view of FIG. 28, by disposing a resonator structure (not illustrated), the wavelength selection unit (color filter layer CF) can be omitted.

Figure 29A:
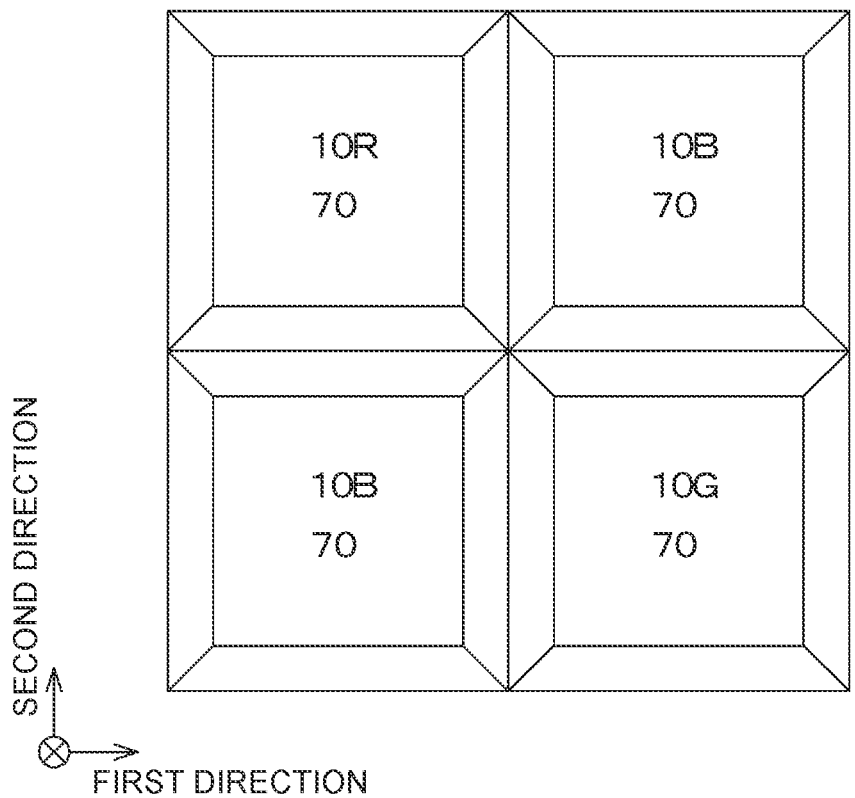
FIG. 29A is a schematic plan view of a lens member having a truncated quadrangular pyramid shape.
Figure 29B:
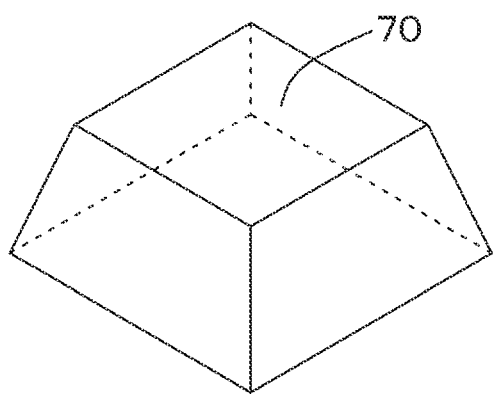
FIG. 29B is a schematic perspective view of a lens member having a truncated quadrangular pyramid shape.

In Examples, the planar shape of the lens member is circular. However, the planar shape of the lens member is not limited thereto, and as illustrated in FIGS. 29A and 29B, the lens member can have a truncated quadrangular pyramid shape. Note that FIG. 29A is a schematic plan view of a lens member having a truncated quadrangular pyramid shape, and FIG. 29B is a schematic perspective view thereof.

One optical path control unit is disposed for one light emitting unit, but one optical path control unit may be shared by a plurality of light emitting elements in some cases. For example, a light emitting element may be disposed at each vertex of an equilateral triangle (a total of three light emitting elements are disposed), and one optical path control unit may be shared by these three light emitting elements, or a light emitting element may be disposed at each vertex of a rectangle (a total of four light emitting elements are disposed), and one optical path control unit may be shared by these four light emitting elements. Alternatively, a plurality of optical path control units may be disposed for one light emitting unit.

In order to prevent light emitted from a light emitting unit constituting a certain light emitting element from entering a light emitting element adjacent to the certain light emitting element to generate optical crosstalk, a light shielding unit may be disposed between the light emitting element and the light emitting element. That is, the light shielding unit may be formed by forming a groove portion between the light emitting element and the light emitting element and embedding the groove portion with a light shielding material. When the light shielding unit is disposed in such a manner, it is possible to reduce a ratio at which light emitted from a light emitting unit constituting a certain light emitting element enters an adjacent light emitting element, and it is possible to suppress occurrence of a phenomenon in which color mixing occurs and chromaticity of the entire pixels deviates from desired chromaticity. Then, since color mixing can be prevented, color purity when the pixels emit light in a single color is increased, and a chromaticity point is deepened. Therefore, a color gamut is widened, and a range of color representation of the display device is widened. In addition, the color filter layer is disposed for each pixel in order to improve color purity, and depending on the configuration of the light emitting element, the color filter layer can be thinned or omitted, and light absorbed in the color filter layer can be extracted, resulting in improvement of light emission efficiency. Alternatively, a light shielding property may be imparted to the light absorption layer (black matrix layer).

In Examples, one optical path control unit is disposed for one light emitting region, but one optical path control unit may be shared by a plurality of light emitting elements in some cases. For example, a light emitting element may be disposed at each vertex of an equilateral triangle (a total of three light emitting elements are disposed), and one optical path control unit may be shared by these three light emitting elements, or a light emitting element may be disposed at each vertex of a rectangle (a total of four light emitting elements are disposed), and one optical path control unit may be shared by these four light emitting elements. Alternatively, a plurality of optical path control units may be disposed for one light emitting region.

Figure 31A:
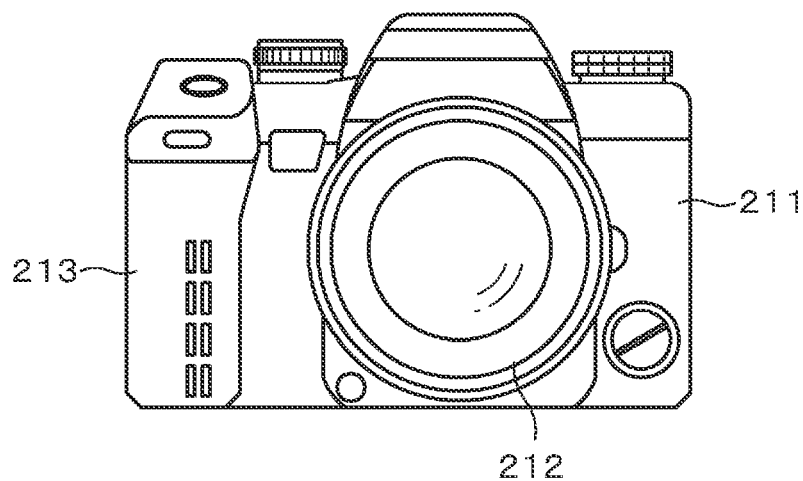
FIG. 31A is a front view of a digital still camera illustrating an example in which the display device of the present disclosure is applied to a lens interchangeable single lens reflex type digital still camera.
Figure 31B:
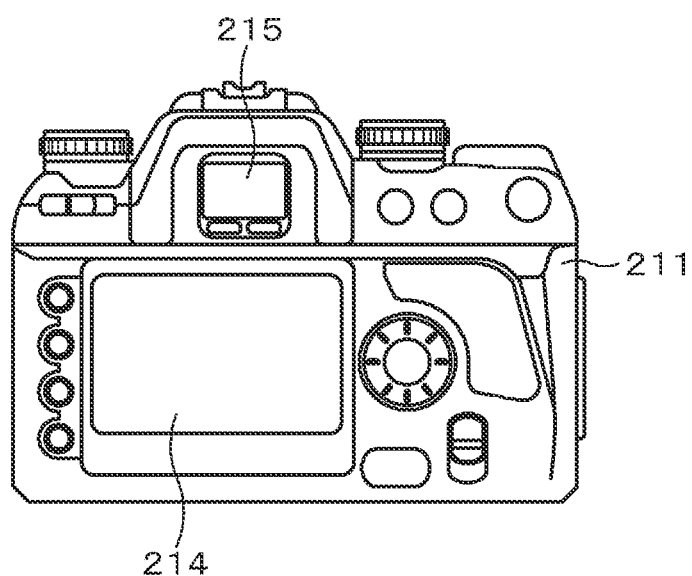
FIG. 31B is a rear view of the digital still camera illustrating an example in which the display device of the present disclosure is applied to a lens interchangeable single lens reflex type digital still camera.

The display device of the present disclosure can be applied to a lens interchangeable mirrorless type digital still camera. A front view of a digital still camera is illustrated in FIG. 31A, and a rear view thereof is illustrated in FIG. 31B. This lens interchangeable mirrorless type digital still camera includes, for example, an interchangeable imaging lens unit (interchangeable lens) 212 on a front right side of a camera body 211, and a grip 213 to be held by a photographer on a front left side. A monitor device 214 is disposed substantially at the center of a rear surface of the camera body 211. An electronic viewfinder (eyepiece window) 215 is disposed above the monitor device 214. By looking into the electronic view finder 215, a photographer can visually recognize an optical image of a subject guided from the imaging lens unit 212 and determine a composition. In the lens interchangeable mirrorless type digital still camera having such a configuration, the display device of the present disclosure can be used as the electronic view finder 215.

Note that the present disclosure can also have the following configurations.

[A01] <<A Light Emitting Element . . . First Aspect>>

A light emitting element comprising:
a light emitting unit;
an intermediate layer covering the light emitting unit;
an optical path control unit disposed on a part of the intermediate layer and having positive optical power; and
a covering layer covering an outer region of the intermediate layer surrounding a part of the intermediate layer on which the optical path control unit is formed and the optical path control unit, wherein
when a refractive index of a material constituting a part of the intermediate layer in contact with the optical path control unit is represented by $n_0$, a refractive index of a material constituting the optical path control unit is represented by $n_1$, and a refractive index of a material constituting the covering layer is represented by $n_2$, $$n_0 \geq n_1 > n_2$$

is satisfied.

[A02]

The light emitting element according to [A01], wherein a layer thickness of an end part of the covering layer located on the outer region of the intermediate layer is more than 0 μm and 1.0 μm or less.

[A03]

The light emitting element according to [A01] or [A02], wherein the optical path control unit is constituted by a lens member having a convex light exit surface.

[A04]

The light emitting element according to [A03], wherein a wavelength selection unit is formed inside the intermediate layer.

[A05]

The light emitting element according to [A04], wherein the covering layer is covered with a resin layer, and
when an average refractive index of a material constituting the resin layer is represented by $n_3$, $$n_2 > n_3$$

is satisfied.

[A06]
The light emitting element according to [A03], wherein the covering layer is covered with a resin layer,
when an average refractive index of a material constituting the resin layer is represented by $n_3$, $n_2 > n_3$ is satisfied, and
a wavelength selection unit is formed inside the resin layer or on the resin layer.

[B01] <<A Light Emitting Element . . . Second Aspect>>
A light emitting element comprising:
a light emitting unit;
a sealing resin layer covering the light emitting unit;
an optical path control unit disposed on a part of the sealing resin layer and having positive optical power;
a flattening film formed on an outer region of the sealing resin layer surrounding a part of the sealing resin layer on which the optical path control unit is formed and the optical path control unit; and
a covering layer formed so as to extend from a space between the outer region of the sealing resin layer and the flattening film to a space between the optical path control unit and the flattening film, wherein
when a refractive index of a material constituting the flattening film is represented by $n_0$, a refractive index of a material constituting the optical path control unit is represented by $n_1$, and a refractive index of a material constituting the covering layer is represented by $n_2$, $n_0 \geq n_1 > n_2$ is satisfied.

[B02]
The light emitting element according to [B01], wherein a layer thickness of an end part of the covering layer located on the outer region of the sealing resin layer is more than 0 µm and 0.5 µm or less.

[B03]
The light emitting element according to [B01] or [B02], wherein the optical path control unit is constituted by a lens member having a convex light incident surface.

[B04]
The light emitting element according to any one of [B01] to [B03], wherein a wavelength selection unit is formed between the sealing resin layer and the light emitting unit.

[B05]
The light emitting element according to any one of [B01] to [B03], wherein a wavelength selection unit is formed between the flattening film and the optical path control unit.

[B06]
The light emitting element according to any one of [B01] to [B05], wherein
when an average refractive index of a material constituting the sealing resin layer is represented by $n_3$, $n_2 > n_3$ is satisfied.

[C01] <<A Display Device . . . First Aspect>>
A display device comprising:
a first substrate and a second substrate; and
a plurality of light emitting elements disposed on the first substrate, wherein
each of the light emitting elements includes:
a light emitting unit;
an intermediate layer covering the light emitting unit;
an optical path control unit disposed on a part of the intermediate layer and having positive optical power; and
a covering layer covering an outer region of the intermediate layer surrounding a part of the intermediate layer on which the optical path control unit is formed and the optical path control unit, and
when a refractive index of a material constituting a part of the intermediate layer in contact with the optical path control unit is represented by $n_0$, a refractive index of a material constituting the optical path control unit is represented by $n_1$, and a refractive index of a material constituting the covering layer is represented by $n_2$, $n_0 \geq n_1 > n_2$ is satisfied.

[C02]
The display device according to [C01], in which in each of the light emitting elements, the layer thickness of an end part of the covering layer located on the outer region of the intermediate layer is more than 0 µm and 1.0 µm or less.

[C03]
The display device according to [C01] or [C02], in which in each of the light emitting elements, the optical path control unit is constituted by a lens member having a convex light exit surface.

[C04]
The display device according to [C03], in which in each of the light emitting elements, a wavelength selection unit is formed inside the intermediate layer.

[C05]
The display device according to [C04], in which
in each of the light emitting elements, the covering layer is covered with a resin layer, and
when an average refractive index of a material constituting the resin layer is represented by $n_3$, $n_2 > n_3$ is satisfied.

[C06]
The display device according to [C03], in which
in each of the light emitting elements, the covering layer is covered with a resin layer,
when an average refractive index of a material constituting the resin layer is represented by $n_3$, $n_2 > n_3$ is satisfied, and
a wavelength selection unit is formed inside the resin layer or on the resin layer.

[D01] <<A Display Device . . . Second Aspect))
A display device comprising:
a first substrate and a second substrate; and
a plurality of light emitting elements disposed on the first substrate, wherein
each of the light emitting elements includes:
a light emitting unit;
a sealing resin layer covering the light emitting unit;
an optical path control unit disposed on a part of the sealing resin layer and having positive optical power;
a flattening film formed on an outer region of the sealing resin layer surrounding a part of the sealing resin layer on which the optical path control unit is formed and the optical path control unit; and
a covering layer formed so as to extend from a space between the outer region of the sealing resin layer and the flattening film to a space between the optical path control unit and the flattening film, and
when a refractive index of a material constituting the flattening film is represented by $n_0$, a refractive index of a material constituting the optical path control unit is represented by $n_1$, and a refractive index of a material constituting the covering layer is represented by $n_2$, $$n_0 \geq n_1 > n_2$$

is satisfied.

[D02]

The display device according to [D01], in which in each of the light emitting elements, the layer thickness of an end part of the covering layer located on the outer region of the sealing resin layer is more than 0 μm and 0.5 μm or less.

[D03]

The display device according to [D01] or [D02], in which in each of the light emitting elements, the optical path control unit is constituted by a lens member having a convex light incident surface.

[D04]

The display device according to any one of [D01] to [D03], in which in each of the light emitting elements, a wavelength selection unit is formed between the sealing resin layer and the light emitting unit.

[D05]

The display device according to any one of [D01] to [D03], in which in each of the light emitting elements, a wavelength selection unit is formed between the flattening film and the optical path control unit.

[D06]

The display device according to any one of [D01] to [D05], in which in each of the light emitting elements, when an average refractive index of a material constituting the sealing resin layer is represented by $n_3$, $$n_2 > n_3$$

is satisfied.

[E01]

The display device according to any one of [C01] to [D06], further including an optical path control unit through which light that has been emitted from the light emitting region passes, in which a reference point P is set, and
when a distance from the reference point P to a normal line passing through the center of the light emitting region is represented by $D_1$, and a distance between the normal line passing through the center of the light emitting region and a normal line passing through the center of the optical path control unit is represented by $D_0$, a value of the distance $D_0$ is not zero in at least some of the light emitting elements constituting a display panel included in the display device.

[E02]

The display device according to [E01], in which the distance $D_0$ depends on the distance $D_1$.

[F01]

The display device according to any one of [C01] to [D06], in which when a distance between a normal line passing through the center of the light emitting region and a normal line passing through the center of the optical path control unit is represented by $D_0$, a value of the distance $D_0$ is not zero in at least some of the light emitting elements included in a display panel.

[F02]

The display device according to [F01], in which a reference point P is assumed, and the distance $D_0$ depends on a distance $D_1$ from the reference point P to the normal line passing through the center of the light emitting region.

[F03]

The display device according to [F01] or [F02], in which the reference point P is assumed to be in the display panel.

[F04]

The display device according to [F03], in which the reference point P is not located in a center region of the display panel.

[F05]

The display device according to [F03] or [F04], in which a plurality of the reference points P is assumed.

[F06]

The display device according to [F03], in which when one reference point P is assumed, the reference point P is not included in a center region of the display panel, and when a plurality of the reference points P is assumed, at least one reference point P is not included in the center region of the display panel.

[F07]

The display device according to [F01] or [F02], in which the reference point P is assumed to be outside the display panel.

[F08]

The display device according to [F07], in which a plurality of the reference points P is assumed.

[F09]

The display device according to any one of [F01] to [F08], in which light beams that have been emitted from the light emitting regions and have passed through the optical path control unit are converged on a certain region of a space outside the display device.

[F10]

The display device according to any one of [F01] to [F08], in which light beams that have been emitted from the light emitting regions and have passed through the optical path control unit diverge in a space outside the display device.

[F11]

The display device according to any one of [F01] to [F06], in which light beams that have been emitted from the light emitting regions and have passed through the optical path control unit are parallel light beams.

[F12]

The display device according to any one of [F01] to [F11], in which a reference point P is set,
the plurality of light emitting elements is arranged in a first direction and a second direction different from the first direction, and
when a distance from the reference point P to a normal line passing through the center of the light emitting region is represented by $D_1$, values of the distance $D_0$ in the first direction and the second direction are represented by $D_{0-X}$ and $D_{0-Y}$, respectively, and values of the distance $D_1$ in the first direction and the second direction are represented by $D_{1-X}$ and $D_{1-Y}$, respectively, $D_{0-X}$ changes linearly with respect to a change in $D_{1-X}$ and $D_{0-Y}$ changes linearly with respect to a change in $D_{1-Y}$, $D_{0-X}$ changes linearly with respect to a change in $D_{1-X}$ and $D_{0-Y}$ changes nonlinearly with respect to a change in $D_{1-Y}$, $D_{0-X}$ changes nonlinearly with respect to a change in $D_{1-X}$ and $D_{0-Y}$ changes linearly with respect to a change in $D_{1-Y}$, or $D_{0-X}$ changes nonlinearly with respect to a change in $D_{1-X}$ and $D_{0-Y}$ changes nonlinearly with respect to a change in $D_{1-Y}$.

[F13]
The display device according to any one of [F01] to [F12], in which
a reference point P is set, and
when a distance from the reference point P to a normal line passing through the center of the light emitting region is represented by $D_1$, a value of the distance $D_0$ increases as a value of the distance $D_1$ increases.

[F14]
The display device according to any one of [F01] to [F13], in which a wavelength selection unit is disposed on a light incident side or a light exit side of the optical path control unit.

[F15]
The display device according to [F14], in which an orthographic projection image of the optical path control unit coincides with an orthographic projection image of the wavelength selection unit, or is included in the orthographic projection image of the wavelength selection unit.

[F16]
The display device according to [F14] or [F15], in which in a light emitting element in which a value of the distance $D_0$ is not zero, a normal line passing through the center of the wavelength selection unit coincides with a normal line passing through the center of the light emitting region.

[F17]
The display device according to [F14] or [F15], in which in a light emitting element in which a value of the distance $D_0$ is not zero, a normal line passing through the center of the wavelength selection unit coincides with a normal line passing through the center of the optical path control unit.

[F18]
The display device according to [F14], in which
an orthographic projection image of the optical path control unit is included in an orthographic projection image of the wavelength selection unit, and
in a light emitting element in which a value of the distance $D_0$ is not zero, a normal line passing through the center of the wavelength selection unit coincides with a normal line passing through the center of the light emitting region.

[F19]
The display device according to [F14], in which
an orthographic projection image of the optical path control unit is included in an orthographic projection image of the wavelength selection unit, and
in a light emitting element in which a value of the distance $D_0$ is not zero, a normal line passing through the center of the wavelength selection unit coincides with a normal line passing through the center of the optical path control unit.

[F20]
The display device according to [F14], in which
an orthographic projection image of the optical path control unit coincides with an orthographic projection image of the wavelength selection unit, and
in a light emitting element in which a value of the distance $D_0$ is not zero, a normal line passing through the center of the wavelength selection unit coincides with a normal line passing through the center of the optical path control unit.

[F21]
The display device according to any one of [F14] to [F17], in which a light absorption layer is formed between the wavelength selection units of adjacent light emitting elements.

[F22]
The display device according to any one of [C01] to [F21], in which the light emitting region constituting the light emitting element includes an organic electroluminescence layer.

REFERENCE SIGNS LIST 10, 10', 10", 10R, 10G, 10B LIGHT EMITTING ELEMENT
20 TRANSISTOR
21 GATE ELECTRODE
22 GATE INSULATING LAYER
23 CHANNEL FORMATION REGION
24 SOURCE/DRAIN REGION
25 ELEMENT ISOLATION REGION
26 BASE (INTERLAYER INSULATING LAYER)
26A LOWER INTERLAYER INSULATING LAYER
26B UPPER INTERLAYER INSULATING LAYER
27A, 27B CONTACT HOLE (CONTACT PLUG)
27C PAD
28 INSULATING LAYER
30 LIGHT EMITTING UNIT
31 FIRST ELECTRODE
32 SECOND ELECTRODE
33 ORGANIC LAYER (INCLUDING LIGHT EMITTING LAYER)
34 PROTECTIVE LAYER
35 LIGHT REFLECTING LAYER
36 INTERLAYER INSULATING MATERIAL LAYER
37 BASE LAYER
40 INTERMEDIATE LAYER
40A OUTER REGION OF INTERMEDIATE LAYER
40B PART OF INTERMEDIATE LAYER WHERE OPTICAL PATH CONTROL UNIT IS FORMED
41 PART OF INTERMEDIATE LAYER IN CONTACT WITH OPTICAL PATH CONTROL UNIT (FLATTENING LAYER CORRESPONDING TO TOP LAYER OF INTERMEDIATE LAYER)
42, 42A, 42B RESIN LAYER
43 SEALING RESIN LAYER
50 SEALING RESIN LAYER
50A OUTER REGION OF SEALING RESIN LAYER
51 FLATTENING FILM
61 FIRST SUBSTRATE
62 SECOND SUBSTRATE
70, 72 OPTICAL PATH CONTROL UNIT
71, 73, 75 COVERING LAYER
71A, 75A END PART OF COVERING LAYER LOCATED ON OUTER REGION OF INTERMEDIATE LAYER
73A END PART OF COVERING LAYER LOCATED ON OUTER REGION OF SEALING RESIN LAYER
74 LIGHT EXIT DIRECTION CONTROL MEMBER
70a, 72a, 74a LIGHT INCIDENT SURFACE
70b, 72b, 74b LIGHT EXIT SURFACE
CF, $CF_R$, $CF_G$, $CF_B$ WAVELENGTH SELECTION UNIT (COLOR FILTER LAYER)
BM, BM' LIGHT ABSORPTION LAYER (BLACK MATRIX LAYER)

The invention claimed is:
1. A light emitting element comprising:
a light emitting unit;
an intermediate layer covering the light emitting unit;
an optical path control unit disposed on a part of the intermediate layer and having positive optical power; and a covering layer covering an outer region of the intermediate layer surrounding a part of the intermediate layer on which the optical path control unit is formed and the optical path control unit, wherein when a refractive index of a material constituting a part of the intermediate layer in contact with the optical path control unit is represented by $n_0$, a refractive index of a material constituting the optical path control unit is represented by $n_1$, and a refractive index of a material constituting the covering layer is represented by $n_2$, a relationship $n_0 \geq n_1 > n_2$ is satisfied, and a layer thickness of an end part of the covering layer located on the outer region of the intermediate layer is more than 0 μm and 1.0 μm or less.

2. The light emitting element according to claim 1, wherein the optical path control unit is constituted by a lens member having a convex light exit surface.

3. The light emitting element according to claim 2, wherein the covering layer is covered with a resin layer, when an average refractive index of a material constituting the resin layer is represented by $n_3$, a relationship $n_2 > n_3$ is satisfied, and a wavelength selection unit is formed inside the resin layer or on the resin layer.

4. A light emitting element comprising:

a light emitting unit;

an intermediate layer covering the light emitting unit;

a lens member having a convex light exit surface, the lens member being disposed on a part of the intermediate layer and having positive optical power; and a covering layer covering an outer region of the intermediate layer surrounding a part of the intermediate layer on which the lens member is formed and the lens member, wherein when a refractive index of a material constituting a part of the intermediate layer in contact with the lens member is represented by $n_0$, a refractive index of a material constituting the lens member is represented by $n_1$, and a refractive index of a material constituting the covering layer is represented by $n_2$, a relationship $n_0 \geq n_1 > n_2$ is satisfied, and a wavelength selection unit is formed inside the intermediate layer.

5. The light emitting element according to claim 4, wherein the covering layer is covered with a resin layer, and when an average refractive index of a material constituting the resin layer is represented by $n_3$, a relationship $n_2 > n_3$ is satisfied.

6. A light emitting element comprising:

a light emitting unit;

a sealing resin layer covering the light emitting unit;

an optical path control unit disposed on a part of the sealing resin layer and having positive optical power;

a flattening film formed on an outer region of the sealing resin layer surrounding a part of the sealing resin layer on which the optical path control unit is formed and the optical path control unit; and a covering layer formed so as to extend from a space between the outer region of the sealing resin layer and the flattening film to a space between the optical path control unit and the flattening film, wherein when a refractive index of a material constituting the flattening film is represented by $n_0$, a refractive index of a material constituting the optical path control unit is represented by $n_1$, and a refractive index of a material constituting the covering layer is represented by $n_2$, a relationship $n_0 \geq n_1 > n_2$ is satisfied.

7. The light emitting element according to claim 6, wherein a layer thickness of an end part of the covering layer located on the outer region of the sealing resin layer is more than 0 μm and 0.5 μm or less.

8. The light emitting element according to claim 6, wherein the optical path control unit is constituted by a lens member having a convex light incident surface.

9. The light emitting element according to claim 6, wherein a wavelength selection unit is formed between the sealing resin layer and the light emitting unit.

10. The light emitting element according to claim 6, wherein a wavelength selection unit is formed between the flattening film and the optical path control unit.

11. The light emitting element according to claim 6, wherein when an average refractive index of a material constituting the sealing resin layer is represented by $n_3$, a relationship $n_2 > n_3$ is satisfied.

12. A display device comprising:

a first substrate and a second substrate; and a plurality of light emitting elements disposed on the first substrate, wherein each of the light emitting elements includes:

a light emitting unit;

an intermediate layer covering the light emitting unit;

an optical path control unit disposed on a part of the intermediate layer and having positive optical power; and wherein a covering layer covering an outer region of the intermediate layer surrounding a part of the intermediate layer on which the optical path control unit is formed and the optical path control unit, when a refractive index of a material constituting a part of the intermediate layer in contact with the optical path control unit is represented by $n_0$, a refractive index of a material constituting the optical path control unit is represented by $n_1$, and a refractive index of a material constituting the covering layer is represented by $n_2$, a relationship $n_0 \geq n_1 > n_2$ is satisfied, and a layer thickness of an end part of the covering layer located on the outer region of the intermediate layer is more than 0 μm and 1.0 μm or less.

13. A display device comprising:

a first substrate and a second substrate; and a plurality of light emitting elements disposed on the first substrate, wherein each of the light emitting elements includes:

a light emitting unit;

a sealing resin layer covering the light emitting unit;

an optical path control unit disposed on a part of the sealing resin layer and having positive optical power;

a flattening film formed on an outer region of the sealing resin layer surrounding a part of the sealing resin layer on which the optical path control unit is formed and the optical path control unit; and wherein a covering layer formed so as to extend from a space between the outer region of the sealing resin layer and the flattening film to a space between the optical path control unit and the flattening film, and when a refractive index of a material constituting the flattening film is represented by $n_0$, a refractive index of a material constituting the optical path control unit is represented by $n_1$, and a refractive index of a material constituting the covering layer is represented by $n_2$, a relationship $n_0 \geq n_1 > n_2$ is satisfied.

* * * * *